(12) United States Patent
Valcore, Jr. et al.

(10) Patent No.: US 10,319,570 B2
(45) Date of Patent: *Jun. 11, 2019

(54) DETERMINING A MALFUNCTIONING DEVICE IN A PLASMA SYSTEM

(71) Applicant: Lam Research Corporation, Fremont, CA (US)

(72) Inventors: John C. Valcore, Jr., Fremont, CA (US); Bradford J. Lyndaker, San Ramon, CA (US); Arthur Sato, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 88 days.

This patent is subject to a terminal disclaimer.

(21) Appl. No.: 15/450,721

(22) Filed: Mar. 6, 2017

(65) Prior Publication Data
US 2017/0178873 A1    Jun. 22, 2017

Related U.S. Application Data

(63) Continuation of application No. 14/184,631, filed on Feb. 19, 2014, now Pat. No. 9,620,337, which is a (Continued)

(51) Int. Cl.
*H01J 37/32* (2006.01)
*G01R 31/40* (2014.01)

(52) U.S. Cl.
CPC ........ *H01J 37/32926* (2013.01); *G01R 31/40* (2013.01); *H01J 37/3299* (2013.01); *H01J 37/32917* (2013.01)

(58) Field of Classification Search
CPC ........... H01J 37/32926; H01J 37/32917; H01J 37/32183; H01J 37/3299; H03H 7/38; H03H 7/383; H03H 7/40; G01R 31/40
See application file for complete search history.

(56) References Cited

U.S. PATENT DOCUMENTS 9,620,337 B2 * 4/2017 Valcore, Jr. ....... H01J 37/32917
2008/0074255 A1   3/2008 Park et al.

OTHER PUBLICATIONS

Brouk et al., Stabilizing RF Generator and Plasma Interactions, Apr. 24-29, 2004, 47th Annual Technical Conference Proceedings, Dallas, TX, pp. 49-54.*

* cited by examiner

*Primary Examiner* — Toan M Le

(74) *Attorney, Agent, or Firm* — Penilla IP, APC

(57) ABSTRACT

Systems and methods for determining a malfunctioning device in a plasma system, are described. One of the methods includes receiving an indication whether plasma is generated within a plasma chamber of the plasma system. The plasma system includes a processing portion and a power delivery portion. The method further includes determining whether the plasma system operates within constraints in response to receiving the indication that the plasma is generated, determining a value of a variable at an output of the power delivery portion when the processing portion is decoupled from the power delivery portion, and comparing the determined value with a pre-recorded value of the variable. The method includes determining whether the determined value is outside a range of the pre-recorded value and determining that the malfunctioning device within the power delivery portion upon determining that the determined value is outside the range of the pre-recorded value.

20 Claims, 40 Drawing Sheets

Related U.S. Application Data continuation-in-part of application No. 13/756,390, filed on Jan. 31, 2013, now Pat. No. 9,502,216.

(60) Provisional application No. 61/801,621, filed on Mar. 15, 2013.

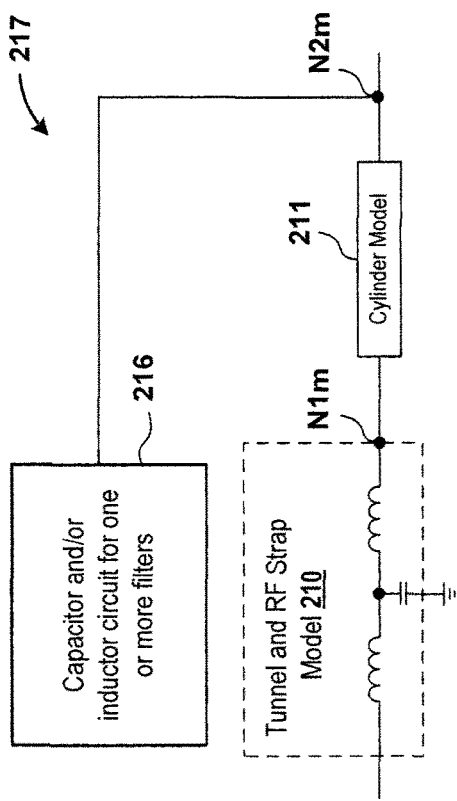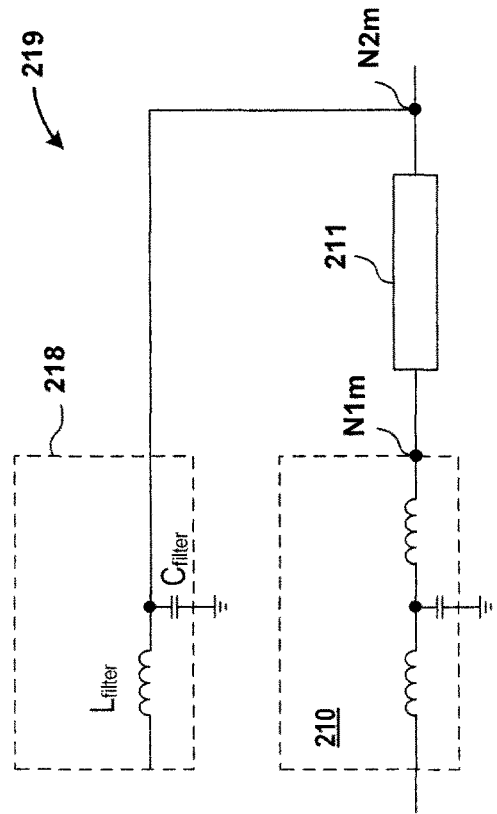

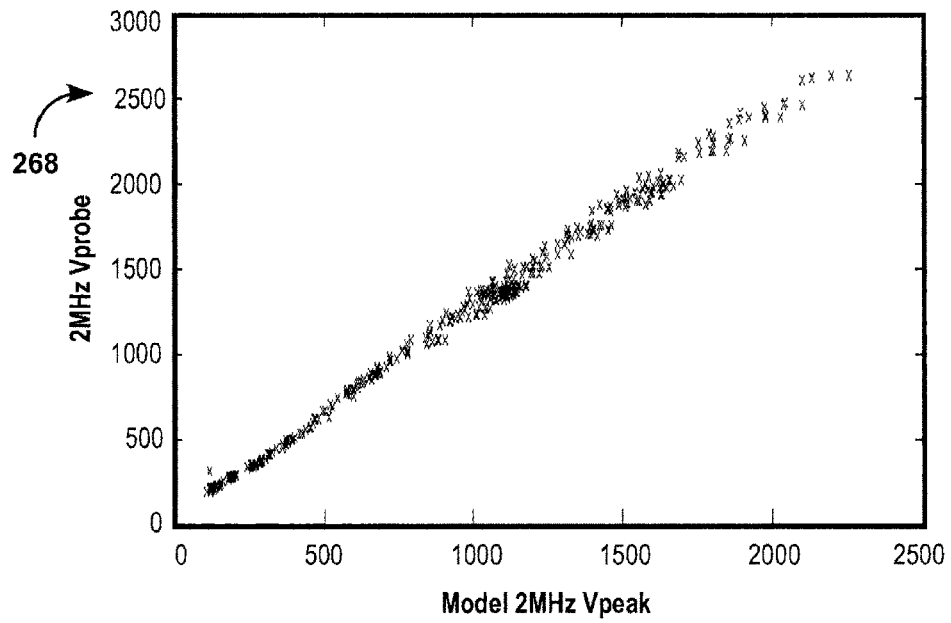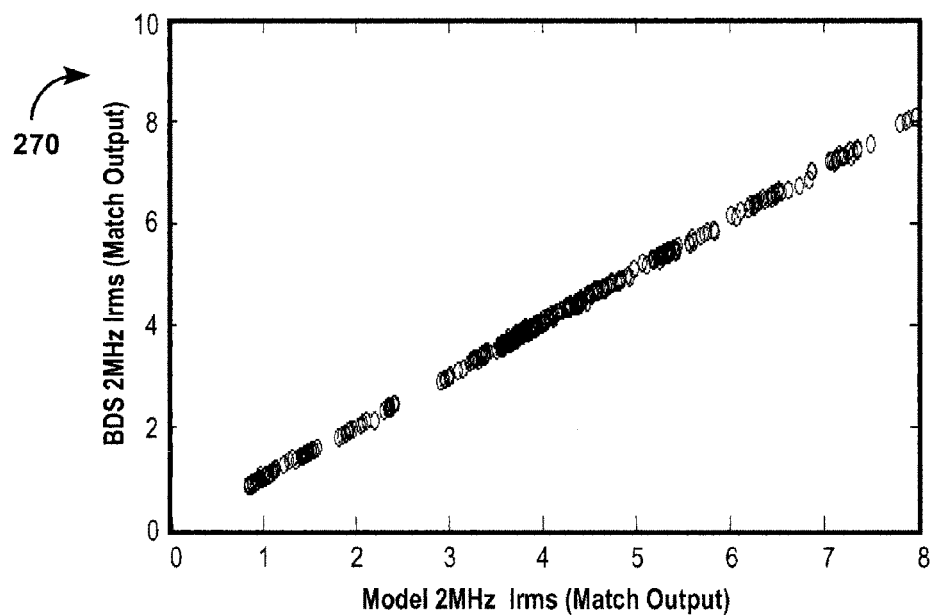
Fig. 12A

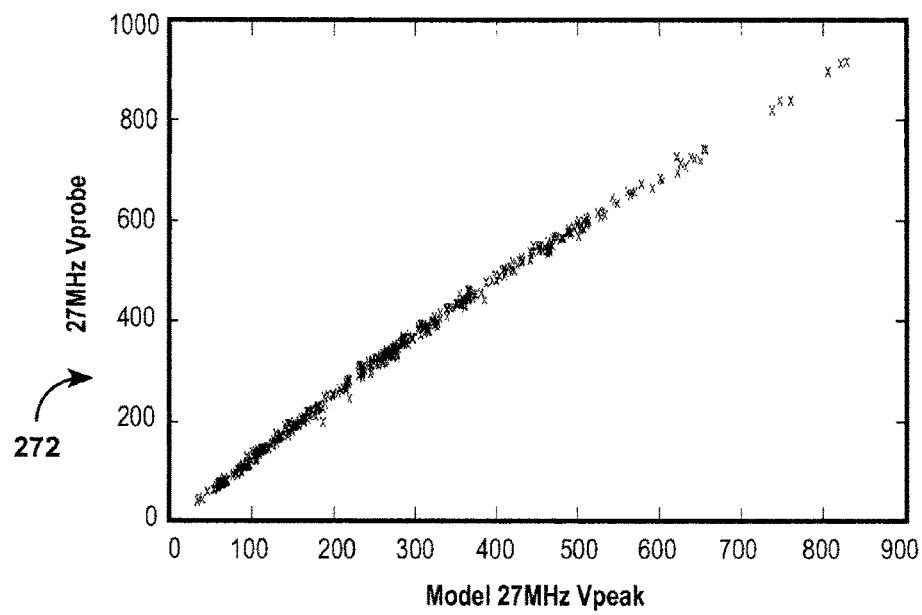
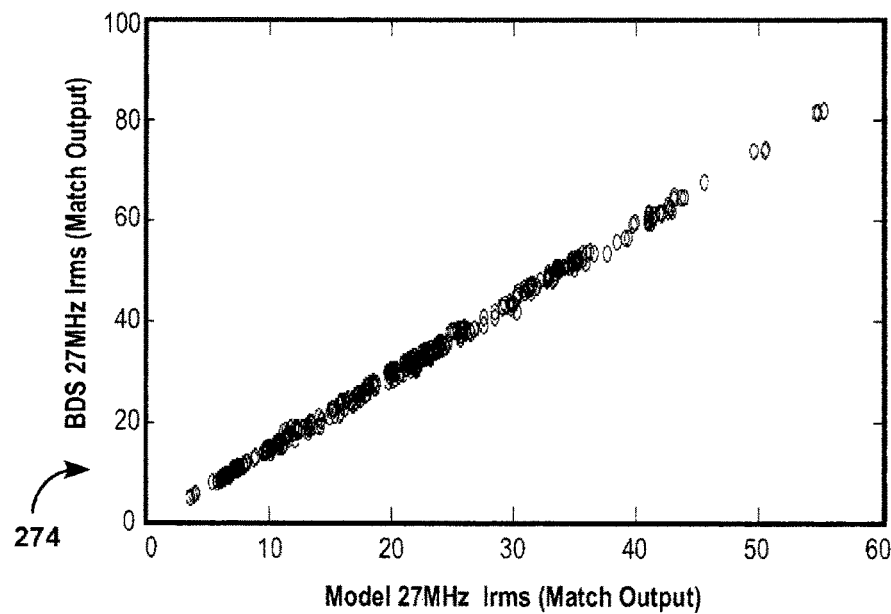
Fig. 12B

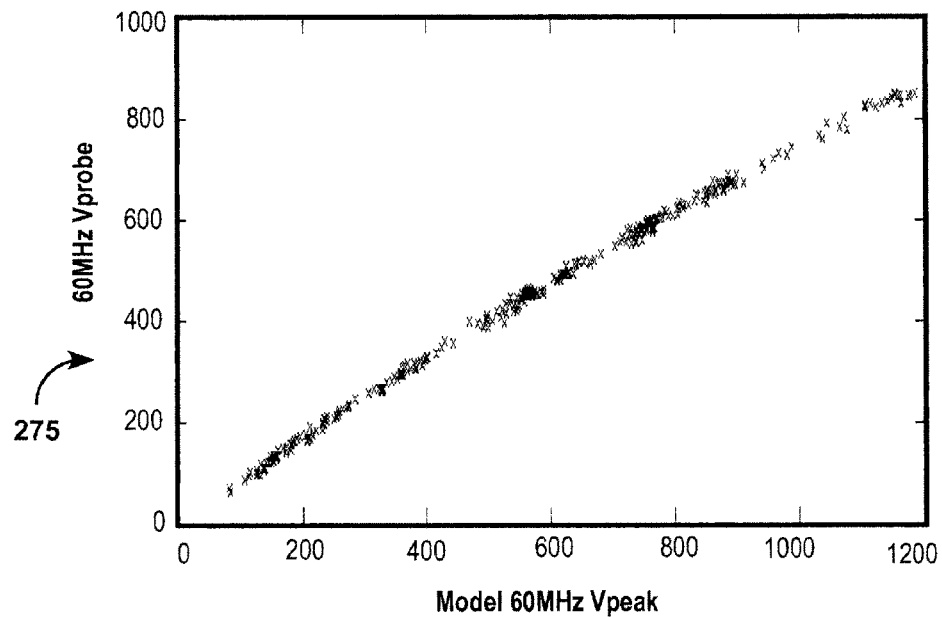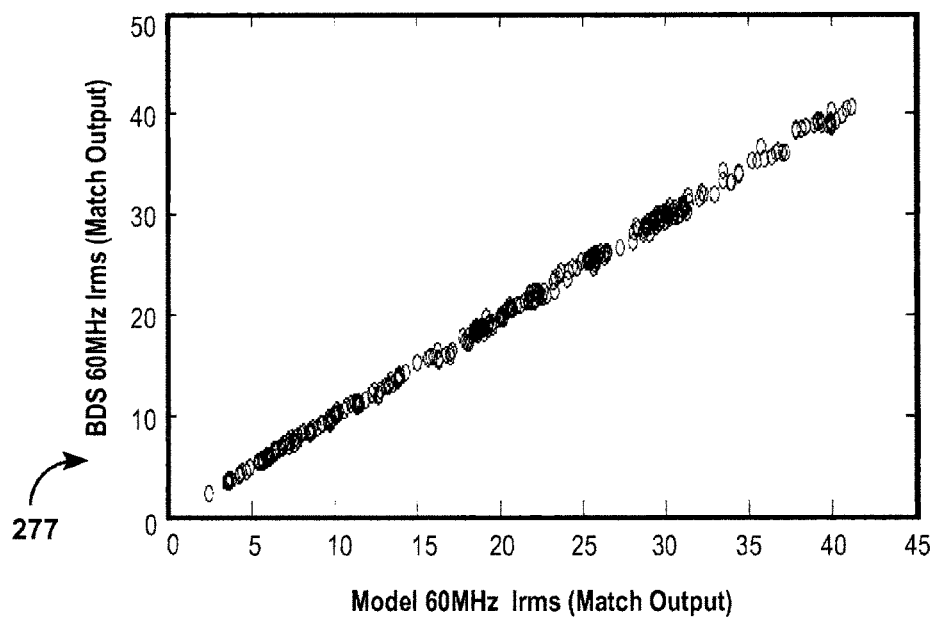
Fig. 12C

DETERMINING A MALFUNCTIONING DEVICE IN A PLASMA SYSTEM

CLAIM OF PRIORITY

The present patent application is a continuation of and claims the benefit of and priority, under 35 U.S.C. § 120, to U.S. patent application Ser. No. 14/184,631, filed on Feb. 19, 2014, and titled "Determining A Malfunctioning Device in A Plasma System", which is incorporated by reference herein in its entirety The U.S. patent application Ser. No. 14/184,631 claims the benefit of and priority to, under 35 U.S.C. § 119(e), to U.S. Provisional Patent Application No. 61/801,621, filed on Mar. 15, 2013, and titled "Determining a Malfunctioning Device in a Plasma System", which is hereby incorporated by reference in its entirety.

The U.S. patent application Ser. No. 14/184,631 is a continuation-in-part of and claims the benefit of and priority, under 35 U.S.C. § 120, to U.S. patent application Ser. No. 13/756,390, filed on Jan. 31, 2013, and titled "Using Modeling to Determine Wafer Bias Associated with a Plasma System", now U.S. Pat. No. 9,502,216, which is incorporated by reference herein in its entirety.

FIELD

The present embodiments relate to determining a malfunctioning device in a plasma system.

BACKGROUND

In a plasma-based system, a radio frequency (RF) generator generates an RF signal that is provided to a plasma chamber via an impedance matching circuit to generate plasma within the chamber. The plasma-based system includes a number of circuit elements that facilitate generation of the RF signal, a transfer of the RF signal, and generation of plasma.

The circuit elements may malfunction. For example, the circuit elements may not function or function erroneously to generate erroneous results. Such results may include an erroneous impedance of plasma, etc.

To determine whether there is a malfunction in the plasma-based system, a sensor is used at a point at an output of the impedance matching circuit. The sensor is however, very expensive. For example, some entities use the same piece of sensor in multiple plasma-based systems to avoid purchase cost of the sensor for each plasma-based system.

It is in this context that embodiments described in the present disclosure arise.

SUMMARY

Embodiments of the disclosure provide apparatus, methods and computer programs for determining a malfunctioning device in a plasma system. It should be appreciated that the present embodiments can be implemented in numerous ways, e.g., a process, an apparatus, a system, a piece of hardware, or a method on a computer-readable medium. Several embodiments are described below.

In an embodiment, a system for determining a malfunctioning device includes one or more plasma processing tools. Each plasma processing tool includes one or more plasma modules for processing a work piece. Each plasma processing tool includes a transfer module for transferring the work piece between two of the plasma modules. Each plasma module includes a power delivery portion and a processing portion. The power delivery portion is used for generating radio frequency (RF) power to provide to the processing portion to generate plasma. The system includes a computing device coupled to the one or more tools. The computing device includes a processor. The processor determines whether any one of the plasma modules operates within constraints and determines a value of a variable at an output of the power delivery portion in response to determining that the plasma module lacks operation within the constraints. The value is determined when the power delivery portion is coupled with a known load. The processor compares the determined value with a pre-recorded value of the variable to determine whether the determined value is outside a range of the pre-recorded value. The processor determines that a malfunctioning device is between an input of the power delivery portion and an output of the power delivery portion in response to determining that the determined value is outside the range of the pre-recorded value.

In a number of embodiments, the pre-recorded value includes a value that is determined using a pre-set formula. In an embodiment, the pre-set formula is a standard. An example of a standard includes a standard that is developed by an Association, which develops standards for sensors. Another example of a standard includes National Institute of Standards and Technology (NIST) standard.

In one embodiment, a method for determining a malfunctioning device in a plasma system is described. The method includes receiving an indication whether plasma is generated within a plasma chamber of the plasma system and determining whether the plasma system operates within constraints in response to receiving the indication that the plasma is generated. The operation of determining whether the plasma system operates within the constraints is performed when the plasma system includes an impedance matching circuit that is located between the plasma chamber and an RF generator of the plasma system. Moreover, the operation of determining whether the plasma system operates within the constraints is performed when the plasma system includes an RF transmission line coupling the impedance matching circuit to the plasma chamber. The method includes determining a value of a variable at a node of the RF transmission line in response to determining that the plasma system lacks operation within the constraints. The operation of determining the value of the variable is performed when the impedance matching circuit is coupled with a known load via an RF transmission line. The method includes comparing the determined value with a pre-recorded value of the variable, determining whether the determined value is outside a range of the pre-recorded value, and determining that the malfunctioning device is between an input of the RF generator and the node in response to determining that the determined value is outside the range of the pre-recorded value. The method is executed by one or more processors.

A method for determining a malfunctioning device in a plasma system is described. The method includes receiving an indication whether plasma is generated within a plasma chamber of the plasma system. The plasma system includes a processing portion and a power delivery portion. The method includes determining whether the plasma system operates within constraints in response to receiving the indication that the plasma is generated. The method includes determining a value of a variable at an output of the power delivery portion when the processing portion is decoupled from the power delivery portion. The method includes comparing the determined value with a pre-recorded value of the variable, determining whether determined value is outside a range of the pre-recorded value, and determining that the malfunctioning device is between an input of the power delivery portion and an output of the power delivery portion in response to determining that the determined value is outside the range of the pre-recorded value.

A plasma system includes a radio frequency (RF) generator for generating an RF signal, an impedance matching circuit coupled to the RF generator, and an RF transmission line coupled to the impedance matching circuit. The plasma system further includes a plasma chamber coupled to the impedance matching circuit. The impedance matching circuit is used for matching an impedance of a load coupled to the RF generator with that of a source coupled to the RF generator. The RF transmission line is used for transferring the RF signal to the plasma chamber. The plasma system includes a processor coupled to the RF generator. The processor is configured to receive an indication whether plasma is generated within the plasma chamber and determine whether the plasma system operates within constraints in response to receiving the indication that the plasma is generated. The determination whether the plasma system operates within the constraints is made when the impedance matching circuit is coupled with the plasma chamber via the RF transmission line. The processor is further configured to determine a value of a variable at an output of the impedance matching circuit in response to determining that the plasma system lacks operation within the constraints. The value is determined when the impedance matching circuit is coupled with a known load via the RF transmission line. The processor is configured to compare the determined value with a pre-recorded value of the variable, determine whether the determined value is outside a range of the pre-recorded value, and determine that a malfunctioning device is between an input of the RF generator and an output of the RF transmission line in response to determining that the determined value is outside the range of the pre-recorded value.

A plasma system includes a processing portion, which includes a plasma chamber for generating plasma. The plasma system includes a power delivery portion, which includes a radio frequency (RF) generator for generating an RF signal. The plasma system includes a processor coupled to the RF generator. The processor is configured to receive an indication whether plasma is generated within the plasma chamber and determine whether the plasma system operates within constraints in response to receiving the indication that the plasma is generated. The determination whether the plasma system operates within the constraints is made when an impedance matching circuit is coupled to the plasma chamber via an RF transmission line. The processor is configured to determine a value of a variable at an output of the power delivery portion in response to determining that the plasma system lacks operation within the constraints. The value is determined when the impedance matching circuit is coupled with the RF generator via a known load. The processor is configured to compare the determined value with a pre-recorded value of the variable, determine whether the determined value is outside a range of the pre-recorded value, and determine that a malfunctioning device is between an input of the power delivery portion and an output of the power delivery portion in response to determining that the determined value is outside the range of the pre-recorded value.

Some advantages of the above-described embodiments include avoiding a need for an expensive sensor at an output of a device of a plasma system to determine whether the plasma system is malfunctioning. For example, instead of using a metrology tool to measure a voltage at an output of an impedance matching circuit of a plasma system, the value is determined based on a sensor that is already within an RF generator of the plasma system or based on an inexpensive sensor that is not a cost burden. The measured value is compared with a pre-recorded value, which is generated based on the pre-set formula. Based on the comparison, it is determined whether the device of the plasma system is malfunctioning. Hence, there is no need for using the metrology tool to determine whether the plasma system is malfunctioning.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 8A is a diagram of a system used to illustrate a model of the filters to improve an accuracy of the variable, in accordance with an embodiment described in the present disclosure.

FIG. 8B is a diagram of a system used to illustrate a model of the filters, in accordance with an embodiment described in the present disclosure.

FIG. 12A is a diagram of graphs that illustrate a correlation between variables that are measured at a node within the system of FIG. 1 by using a probe and variables that are determined using the method of FIG. 2 when an x MHz RF generator is on, in accordance with an embodiment described in the present disclosure.

FIG. 12B is a diagram of a graph that illustrate a correlation between variables that are measured at a node within the system of FIG. 1 by using a probe and variables that are determined using the method of FIG. 2 when a y MHz RF generator is on, in accordance with an embodiment described in the present disclosure.

FIG. 12C is a diagram of a graph that illustrate a correlation between variables that are measured at a node within the system of FIG. 1 by using a probe and variables that are determined using the method of FIG. 2 when a z MHz RF generator is on, in accordance with one embodiment described in the present disclosure.

DETAILED DESCRIPTION

The following embodiments describe systems and methods for determining a malfunctioning device in a plasma system. It will be apparent that the present embodiments may be practiced without some or all of these specific details. In other instances, well known process operations have not been described in detail in order not to unnecessarily obscure the present embodiments.

Figure 1:
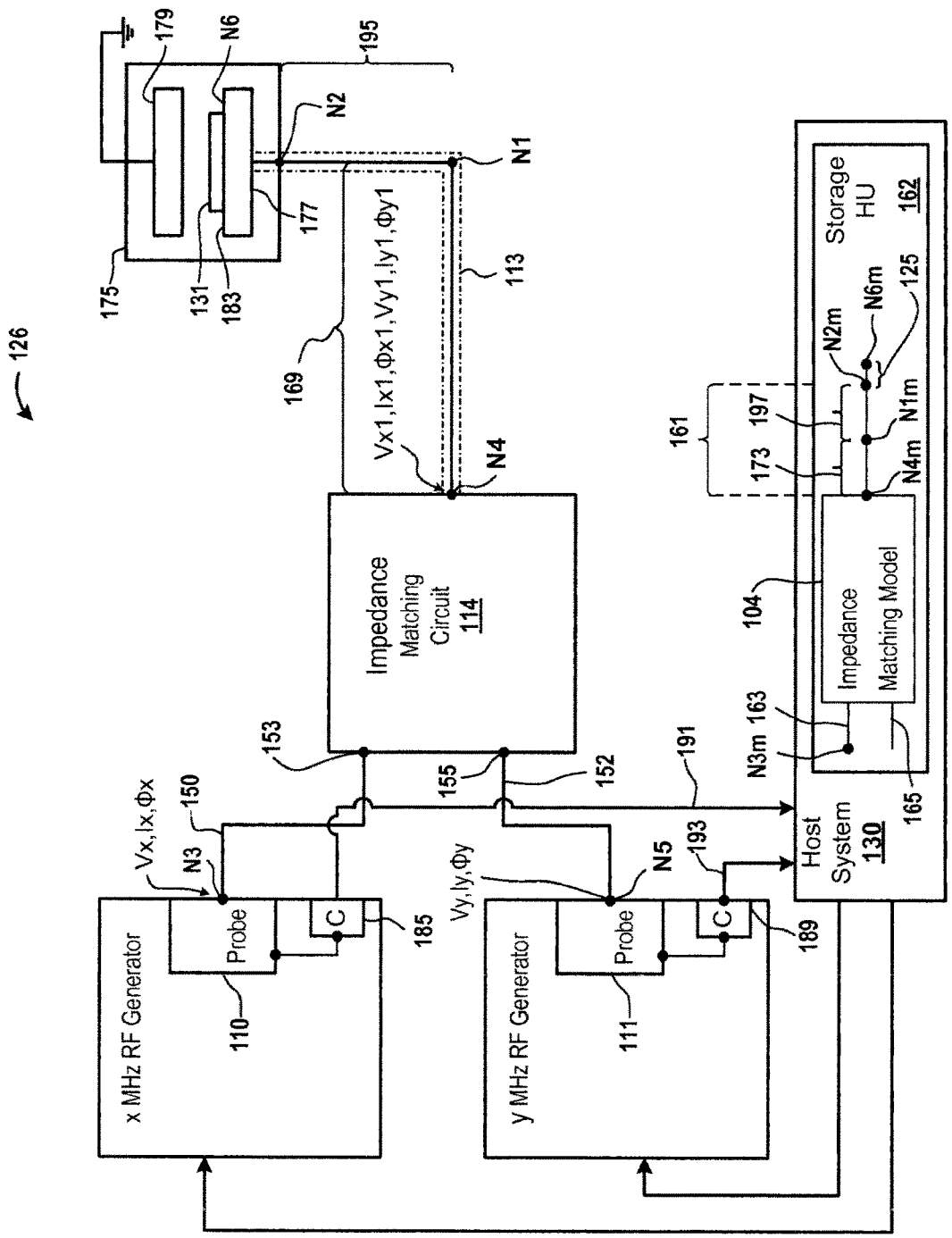
FIG. 1 is a block diagram of a system for determining a variable at an output of an impedance matching model, at an output of a portion of a radio frequency (RF) transmission model, and at an output of an electrostatic chuck (ESC) model, in accordance with an embodiment described in the present disclosure.

FIG. 1 is a block diagram of an embodiment of a system 126 for determining a variable at an output of an impedance matching model 104, at an output, e.g., a model node N1m, of a portion 173 of an RF transmission model 161, which is a model of an RF transmission line 113, and at an output, e.g., a model node N6m, of an electrostatic chuck (ESC) model 125. Examples of a variable include complex voltage, complex current, complex voltage and current, complex power, wafer bias, ion energy, etc. The RF transmission line 113 has an output, e.g., a node N2. A voltage and current (VI) probe 110 measures a complex voltage and current $V_{xMHz}$, $I_{xMHz}$, and $\phi_{xMHz}$, e.g., a first complex voltage and current, at an output, e.g., a node N3, of an x MHz RF generator. It should be noted that $V_{xMHz}$ represents a voltage magnitude, $I_{xMHz}$ represents a current magnitude, and $\phi x$ represents a phase between $V_{xMHz}$ and $I_{xMHz}$. The impedance matching model 104 has an output, e.g., a model node N4m.

Moreover, a voltage and current probe 111 measures a complex voltage and current $V_{yMHz}$, $I_{yMHz}$, and $\phi_{yMHz}$ at an output, e.g., a node N5, of a y MHz RF generator. It should be noted that $V_{yMHz}$ represents a voltage magnitude, $I_{yMHz}$ represents a current magnitude, and $\phi_{yMHz}$ represents a phase between $V_{yMHz}$ and $I_{yMHz}$.

In some embodiments, a node of a device is an input of the device, an output of the device, or a point within the device. A device, as used herein, is described below.

In various embodiments, a voltage magnitude includes a zero-to-peak magnitude, or a peak-to-peak magnitude, or a root mean square (RMS) magnitude, which is of one or more radio frequency values of an RF signal. In some embodiments, a current magnitude includes a zero-to-peak magnitude, or a peak-to-peak magnitude, or an RMS magnitude, which is of one or more radio frequency values of an RF signal. In several embodiments, a power magnitude is a product of a voltage magnitude, a current magnitude, and a phase between the current magnitude and the voltage magnitude.

Examples of x MHz include 2 MHz, 27 MHz, and 60 MHz. Examples of y MHz include 2 MHz, 27 MHz, and 60 MHz. The x MHz is different than y MHz. For example, when x MHz is 2 MHz, y MHz is 27 MHz or 60 MHz. When x MHz is 27 MHz, y MHz is 60 MHz.

An example of each voltage and current probe 110 and 111 includes a voltage and current probe that complies with a pre-set formula. An example of the pre-set formula includes a standard that is followed by an Association, which develops standards for sensors. Another example of the pre-set formula includes a National Institute of Standards and Technology (NIST) standard. As an illustration, the voltage and current probe 110 or 111 is calibrated according to NIST standard. In this illustration, the voltage and current probe 110 or 111 is coupled with an open circuit, a short circuit, or a known load to calibrate the voltage and current probe 110 or 111 to comply with the NIST standard. The voltage and current probe 110 or 111 may first be coupled with the open circuit, then with the short circuit, and then with the known load to calibrate the voltage and current probe 110 based on NIST standard.

In some embodiments, the voltage and current probe 110 or 111 is coupled to the known load, the open circuit, and the short circuit in any order to calibrate the voltage and current probe 110 or 111 according to NIST standard. Examples of a known load include a 50 ohm load, a 100 ohm load, a 200 ohm load, a static load, a direct current (DC) load, a resistor, etc. As an illustration, each voltage and current probe 110 and 111 is calibrated according NIST-traceable standards.

The voltage and current probe 110 is coupled to the output, e.g., the node N3, of the x MHz RF generator. The output, e.g., the node N3, of the x MHz RF generator is coupled to an input 153 of an impedance matching circuit 114 via a cable 150. Moreover, the voltage and current probe 111 is coupled to the output, e.g., the node N5, of the y MHz RF generator. The output, e.g., the node N5, of the y MHz RF generator is coupled to another input 155 of the impedance matching circuit 114 via a cable 152.

An output, e.g., a node N4, of the impedance matching circuit 114 is coupled to an input of the RF transmission line 113. The RF transmission line 113 includes a portion 169 and another portion 195. An input of the portion 169 is an input of the RF transmission line 113. An output, e.g., a node N1, of the portion 169 is coupled to an input of the portion 195. An output, e.g., the node N2, of the portion 195 is coupled to the plasma chamber 175. The output of the portion 195 is the output of the RF transmission line 113. An example of the portion 169 includes an RF cylinder and an RF strap. The RF cylinder is coupled to the RF strap. An example of the portion 195 includes an RF rod and/or a support, e.g., a cylinder, etc., for supporting the plasma chamber 175.

The plasma chamber 175 includes an electrostatic chuck (ESC) 177, an upper electrode 179, and other parts (not shown), e.g., an upper dielectric ring surrounding the upper electrode 179, an upper electrode extension surrounding the upper dielectric ring, a lower dielectric ring surrounding a lower electrode of the ESC 177, a lower electrode extension surrounding the lower dielectric ring, an upper plasma exclusion zone (PEZ) ring, a lower PEZ ring, etc. The upper electrode 179 is located opposite to and facing the ESC 177. A work piece 131, e.g., a semiconductor wafer, etc., is supported on an upper surface 183 of the ESC 177. The upper surface 183 includes an output N6 of the ESC 177. The work piece 131 is placed on the output N6. Various processes, e.g., chemical vapor deposition, cleaning, deposition, sputtering, etching, ion implantation, resist stripping, etc., are performed on the work piece 131 during production. Integrated circuits, e.g., application specific integrated circuit (ASIC), programmable logic device (PLD), etc. are developed on the work piece 131 and the integrated circuits are used in a variety of electronic items, e.g., cell phones, tablets, smart phones, computers, laptops, networking equipment, etc. Each of the lower electrode and the upper electrode 179 is made of a metal, e.g., aluminum, alloy of aluminum, copper, etc.

In one embodiment, the upper electrode 179 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 179 is grounded. The ESC 177 is coupled to the x MHz RF generator and the y MHz RF generator via the impedance matching circuit 114.

When the process gas is supplied between the upper electrode 179 and the ESC 177 and when the x MHz RF generator and/or the y MHz RF generator supplies RF signals via the impedance matching circuit 114 and the RF transmission line 113 to the ESC 177, the process gas is ignited to generate plasma within the plasma chamber 175.

When the x MHz RF generator generates and provides an RF signal via the node N3, the impedance matching circuit 114, and the RF transmission line 113 to the ESC 177 and when the y MHz generator generates and provides an RF signal via the node N5, the impedance matching circuit 114, and the RF transmission line 113 to the ESC 177, the voltage and current probe 110 measures the complex voltage and current at the node N3 and the voltage and current probe 111 measures the complex voltage and current at the node N5.

The complex voltages and currents measured by the voltage and current probes 110 and 111 are provided via corresponding communication devices 185 and 189 from the corresponding voltage and current probes 110 and 111 to a storage hardware unit (HU) 162 of a host system 130 for storage. For example, the complex voltage and current measured by the voltage and current probe 110 is provided via the communication device 185 and a cable 191 to the host system 130 and the complex voltage and current measured by the voltage and current probe 111 is provided via the communication device 189 and a cable 193 to the host system 130. Examples of a communication device include an Ethernet device that converts data into Ethernet packets and converts Ethernet packets into data, an Ethernet for Control Automation Technology (EtherCAT) device, a serial interface device that transfers data in series, a parallel interface device that transfers data in parallel, a Universal Serial Bus (USB) interface device, etc.

Examples of the host system 130 include a computer, e.g., a desktop, a laptop, a tablet, etc. As an illustration, the host system 130 includes a processor and the storage HU 162. As used herein, in various embodiments, a processor is a central processing unit (CPU), a microprocessor, an application specific integrated circuit (ASIC), a programmable logic device (PLD), etc. Examples of the storage HU include a read-only memory (ROM), a random access memory (RAM), or a combination thereof. Examples of a storage HU include a flash memory, a redundant array of storage disks (RAID), a hard disk, etc.

The impedance matching model 104 is stored within the storage HU 162. The impedance matching model 104 has similar characteristics, e.g., capacitances, inductances, complex power, complex voltage and currents, etc., as that of the impedance matching circuit 114. For example, the impedance matching model 104 has the same number of capacitors and/or inductors as that within the impedance matching circuit 114, and the capacitors and/or inductors are connected with each other in the same manner, e.g., serial, parallel, etc. as that within the impedance matching circuit 114. To provide an illustration, when the impedance matching circuit 114 includes a capacitor coupled in series with an inductor, the impedance matching model 104 also includes the capacitor coupled in series with the inductor.

As an example, the impedance matching circuit 114 includes one or more electrical components and the impedance matching model 104 includes a design, e.g., a computer-generated model, of the impedance matching circuit 114. In some embodiments, the computer-generated model is generated by a processor based upon input signals received from a user via an input hardware unit. The input signals include signals regarding which electrical components, e.g., capacitors, inductors, etc., to include in a model and a manner, e.g., series, parallel, etc., of coupling the electrical components with each other. As another example, the impedance circuit 114 includes hardware electrical components and hardware connections between the electrical components and the impedance matching model 104 include software representations of the hardware electrical components and of the hardware connections. As yet another example, the impedance matching model 104 is designed using a software program and the impedance matching circuit 114 is made on a printed circuit board. As used herein, electrical components may include resistors, capacitors, inductors, connections between the resistors, connections between the inductors, connections between the capacitors, and/or connections between a combination of the resistors, inductors, and capacitors.

Similarly, a cable model 163 and the cable 150 have similar characteristics, and a cable model 165 and the cable 152 has similar characteristics. As an example, an inductance of the cable model 163 is the same as an inductance of the cable 150. As another example, the cable model 163 is a computer-generated model of the cable 150 and the cable model 165 is a computer-generated model of the cable 152.

Similarly, an RF transmission model 161 and the RF transmission line 113 have similar characteristics. For example, the RF transmission model 161 has the same number of resistors, capacitors and/or inductors as that within the RF transmission line 113, and the resistors, capacitors and/or inductors are connected with each other in the same manner, e.g., serial, parallel, etc. as that within the RF transmission line 113. To further illustrate, when the RF transmission line 113 includes a capacitor coupled in parallel with an inductor, the RF transmission model 161 also includes the capacitor coupled in parallel with the inductor. As yet another example, the RF transmission line 113 includes one or more electrical components and the RF transmission model 161 includes a design, e.g., a computer-generated model, of the RF transmission line 113.

In some embodiments, the RF transmission model 161 is a computer-generated impedance transformation involving computation of characteristics, e.g., capacitances, resistances, inductances, a combination thereof, etc., of elements, e.g., capacitors, inductors, resistors, a combination thereof, etc., and determination of connections, e.g., series, parallel, etc., between the elements.

Based on the complex voltage and current received from the voltage and current probe 110 via the cable 191 and characteristics, e.g., capacitances, inductances, etc., of elements, e.g., inductors, capacitors, etc., within the impedance matching model 104, the processor of the host system 130 calculates a complex voltage and current V, I, and $\phi$, e.g., a second complex voltage and current, at the output, e.g., the model node N4m, of the impedance matching model 104. The complex voltage and current at the model node N4m is stored in the storage HU 162 and/or another storage HU, e.g., a compact disc, a flash memory, etc., of the host system 130. The complex V, I, and $\phi$ includes a voltage magnitude V, a current magnitude I, and a phase $\phi$ between the voltage and current.

The output of the impedance matching model 104 is coupled to an input of the RF transmission model 161, which is stored in the storage hardware unit 162. The impedance matching model 104 also has an input, e.g., a node N3m, which is used to receive the complex voltage and current measured at the node N3.

The RF transmission model 161 includes the portion 173, another portion 197, and an output N2m, which is coupled via the ESC model 125 to the model node N6m. The ESC model 125 is a model of the ESC 177. For example, the ESC model 125 has similar characteristics as that of the ESC 177. For example, the ESC model 125 has the same inductance, capacitance, resistance, or a combination thereof as that of the ESC 177.

An input of the portion 173 is the input of the RF transmission model 161. An output of the portion 173 is coupled to an input of the portion 197. The portion 172 has similar characteristics as that of the portion 169 and the portion 197 has similar characteristics as that of the portion 195.

Based on the complex voltage and current measured at the model node N4m, the processor of the host system 130 calculates a complex voltage and current V, I, and 4, e.g., a third complex voltage and current, at the output, e.g., the model node N1m, of the portion 173 of the RF transmission model 161. The complex voltage and current determined at the model node N1m is stored in the storage HU 162 and/or another storage HU, e.g., a compact disc, a flash memory, etc., of the host system 130.

In several embodiments, instead of or in addition to determining the third complex voltage and current, the processor of the host system 130 computes a complex voltage and current, e.g., an intermediate complex voltage and current V, I, and $\phi$, at a point, e.g., a node, etc., within the portion 173 based on the complex voltage and current at the output of the impedance matching model 104 and characteristics of elements between the input of the RF transmission model 161 and the point within the portion 173.

In various embodiments, instead of or in addition to determining the third complex voltage and current, the processor of the host system 130 computes a complex voltage and current, e.g., an intermediate complex voltage and current V, I, and $\phi$, at a point, e.g., a node, etc., within the portion 197 based on the complex voltage and current at the output of the impedance matching model 104 and characteristics of elements between the input of the RF transmission model 161 and the point within the portion 197.

It should be noted that in some embodiments, the complex voltage and current at the output of the impedance matching model 104 is calculated based on the complex voltage and current at the output of the x MHz RF generator, characteristics of elements the cable model 163, and characteristics of the impedance matching model 104.

It should further be noted that although two generators are shown coupled to the impedance matching circuit 114, in one embodiment, any number of RF generators, e.g., a single generator, three generators, etc., are coupled to the plasma chamber 175 via an impedance matching circuit. For example, a 2 MHz generator, a 27 MHz generator, and a 60 MHz generator are coupled to the plasma chamber 175 via an impedance matching circuit. For example, although the above-described embodiments are described with respect to using complex voltage and current measured at the node N3, in various embodiments, the above-described embodiments may also use the complex voltage and current measured at the node N5.

Figure 2:
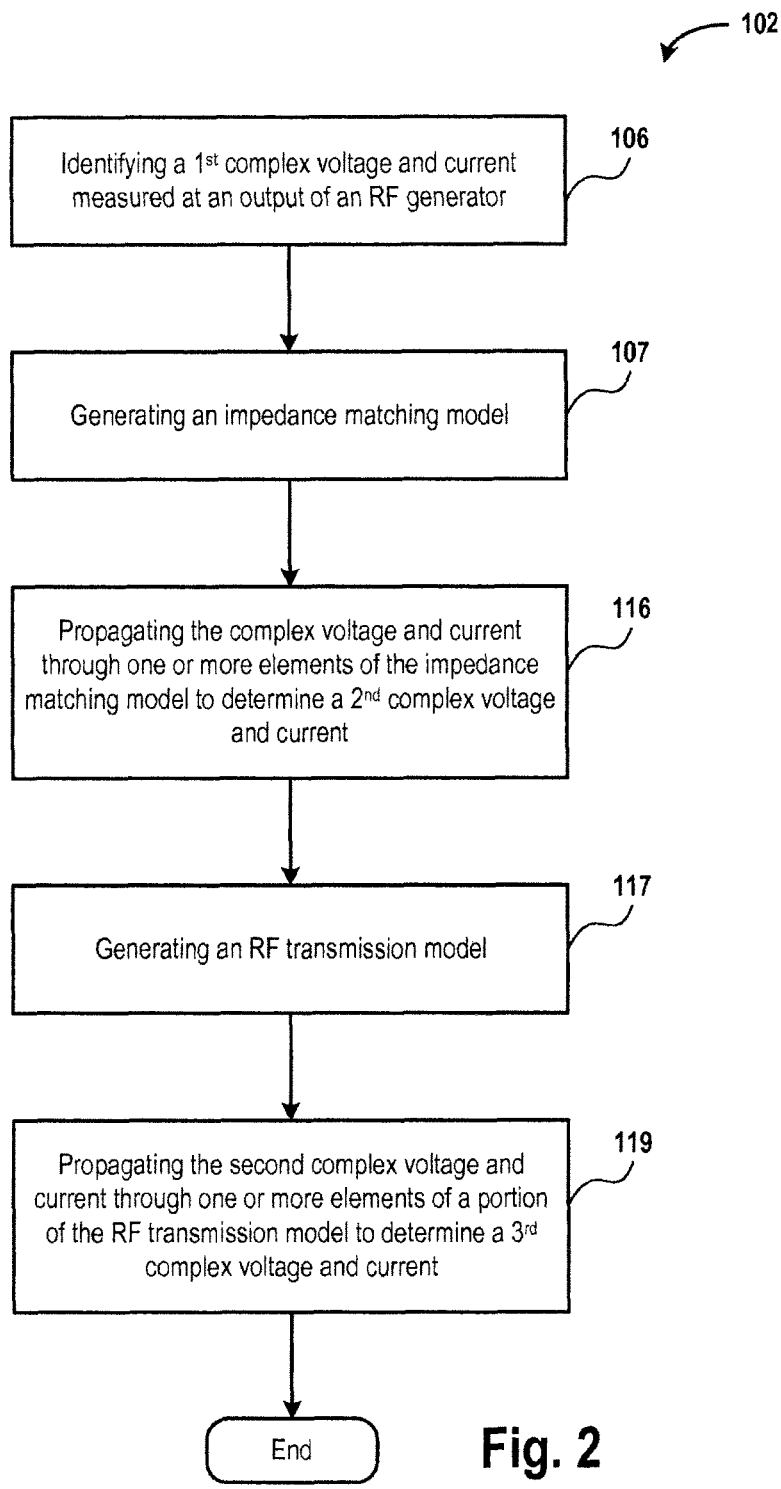
FIG. 2 is a flowchart of a method for determining a complex voltage and current at the output of the RF transmission model portion, in accordance with an embodiment described in the present disclosure.

FIG. 2 is a flowchart of an embodiment of a method 102 for determining the complex voltage and current at the output of the RF transmission model portion 173 (FIG. 1). The method 102 is executed by the processor of the host system 130 (FIG. 1). In an operation 106, the complex voltage and current, e.g., the first complex voltage and current, measured at the node N3 is identified from within the storage HU 162 (FIG. 1). For example, it is determined that the first complex voltage and current is received from the voltage and current probe 110 (FIG. 1). As another example, based on an identity, of the voltage and current probe 110, stored within the storage HU 162 (FIG. 1), it is determined that the first complex voltage and current is associated with the identity.

Furthermore, in an operation 107, the impedance matching model 104 (FIG. 1) is generated based on electrical components of the impedance matching circuit 114 (FIG. 1). For example, connections between electrical components of the impedance matching circuit 114 and characteristics of the electrical components are provided to the processor of the host system 130 by the user via an input hardware unit that is coupled with the host system 130. Upon receiving the connections and the characteristics, the processor generates elements that have the same characteristics as that of electrical components of the impedance matching circuit 114 and generates connections between the elements that have the same connections as that between the electrical components.

The input, e.g., the node N3m, of the impedance matching model 163 receives the first complex voltage and current. For example, the processor of the host system 130 accesses, e.g., reads, etc., from the storage HU 162 the first complex voltage and current and provides the first complex voltage and current to the input of the impedance matching model 104 to process the first complex voltage and current.

In an operation 116, the first complex voltage and current is propagated through one or more elements of the impedance matching model 104 (FIG. 1) from the input, e.g., the node N3m (FIG. 1), of the impedance matching model 104 to the output, e.g., the node N4m (FIG. 1), of the impedance matching model 104 to determine the second complex voltage and current, which is at the output of the impedance matching model 104. For example, with reference to FIG. 3B, when the 2 MHz RF generator is on, e.g., operational, powered on, coupled to the devices, such as, for example, the impedance matching circuit 104, of the plasma system 126, etc., a complex voltage and current Vx1, Ix1, and $\phi$x1, e.g., an intermediate complex voltage and current, which includes the voltage magnitude Vx1, the current magnitude Ix1, and the phase $\phi$x1 between the complex voltage and current, at a node 251, e.g., an intermediate node, is determined based on a capacitance of a capacitor 253, based on a capacitance of a capacitor C5, and based on the first complex voltage and current that is received at an input 255. Moreover, a complex voltage and current Vx2, Ix2, and $\phi$x2 at a node 257 is determined based on the complex voltage and current Vx1, Ix1, and $\phi$x1, and based on an inductance of an inductor L3. The complex voltage and current Vx2, Ix2, and $\phi$x2 includes the voltage magnitude Vx2, the current magnitude Ix2, and the phase $\phi$x2 between the voltage and current. When the 27 MHz RF generator and the 60 MHz RF generator are off, e.g., nonoperational, powered off, decoupled from the impedance matching circuit 104, etc., a complex voltage and current V2, I2, and $\phi$2 is determined to be the second complex voltage and current at an output 259, which is an example of the output, e.g., the model node N4m (FIG. 1), of the impedance matching model 104 (FIG. 1). The complex voltage and current V2, I2, and $\phi$2 is determined based on the complex voltage and current Vx2, Ix2, and $\phi$x2 and an inductor of an inductor L2. The complex voltage and current V2, I2, and $\phi$2 includes the voltage magnitude V2, the current magnitude I2, and the phase $\phi$2 between the voltage and current.

Similarly, when 27 MHz RF generator is on and the 2 MHz and the 60 MHz RF generators are off, a complex voltage and current V27, I27, and φ27 at the output 259 is determined based on a complex voltage and current received at a node 261 and characteristics of an inductor LPF2, a capacitor C3, a capacitor C4, and an inductor L2. The complex voltage and current V27, I27, and φ27 includes the voltage magnitude V27, the current magnitude I27, and the phase φ27 between the voltage and current. The complex voltage and current received at the node 261 is the same as the complex voltage and current measured at the node N5 (FIG. 1). When both the 2 MHz and 27 MHz RF generators are on and the 60 MHz RF generator is off, the complex voltages and currents V2, I2, φ2, V27, I27, and φ27 are an example of the second complex voltage and current. Moreover, similarly, when the 60 MHz RF generator is on and the 2 and 27 MHz RF generators are off, a complex voltage and current V60, I60, and φ60 at the output 259 is determined based on a complex voltage and current received at a node 265 and characteristics of an inductor LPF1, a capacitor C1, a capacitor C2, an inductor L4, a capacitor 269, and an inductor L1. The complex voltage and current V60, I60, and φ60 includes the voltage magnitude V60, the current magnitude I60, and the phase φ60 between the voltage and current. When the 2 MHz, 27 MHz, and the 60 MHz RF generators are on, the complex voltages and currents V2, I2, φ2, V27, I27, φ27, V60, I60, and φ60 are an example of the second complex voltage and current.

In an operation 117, the RF transmission model 161 (FIG. 1) is generated based on the electrical components of the RF transmission line 113 (FIG. 1). For example, connections between electrical components of the RF transmission line 113 and characteristics of the electrical components are provided to the processor of the host system 130 by the user via an input device that is coupled with the host system 130. Upon receiving the connections and the characteristics, the processor generates elements that have the same characteristics as that of electrical components of the RF transmission line 113 and generates connections between the elements that are the same as that between the electrical components.

In an operation 119, the second complex voltage and current is propagated through one or more elements of the RF transmission model portion 173 from the input of the RF transmission model 113 to the output, e.g., the model node N1m (FIG. 1), of the RF transmission model portion 173 to determine the third complex voltage and current at the output of the RF transmission model portion 173. For example, with reference to FIG. 5B, when the 2 MHz RF generator is on and the 27 and 60 MHz RF generators are off, a complex voltage and current Vx4, Ix4, and φx4, e.g., an intermediate complex voltage and current, at a node 293, e.g., an intermediate node, is determined based on an inductance of an inductor Ltunnel, based on a capacitance of a capacitor Ctunnel, and based on the complex voltage and current V2, I2, and φ2 (FIG. 3B), which is an example of the second complex voltage and current. It should be noted that Ltunnel is an inductance of a computer-generated model of an RF tunnel and Ctunnel is a capacitance of the RF tunnel model. Moreover, a complex voltage and current V21, I21, and φ21 at an output 297 of a tunnel and strap model 210 is determined based on the complex voltage and current Vx4, Ix4, and φx4, and based on an inductance of an inductor Lstrap. The output 297 is an example of the output, e.g., the model node N1m (FIG. 1), of the portion 173 (FIG. 1). It should be noted that Lstrap is an inductance of a computer-generated model of the RF strap. When the 2 MHz RF generator is on and the 27 and 60 MHz RF generators are off, the complex voltage and current V21, I21, and φ21 is determined to be the third complex voltage and current at the output 297.

Similarly, when the 27 MHz RF generator is on and the 2 and 60 MHz RF generators are off, a complex voltage and current V271, I271, and φ271 at the output 297 is determined based on the complex voltage and current V27, I27, φ27 (FIG. 3B) at the output 259 and characteristics of the inductor Ltunnel, the capacitor Ctunnel, and the inductor Lstrap. When both the 2 MHz and 27 MHz RF generators are on and the 60 MHz RF generator is off, the complex voltages and currents V21, I21, φ21, V271, I271, and φ271 are an example of the third complex voltage and current.

Moreover, similarly, when the 60 MHz RF generator is powered on and the 2 and 27 MHz RF generators are powered off, a complex voltage and current V601, I601, and φ601 at the output 297 is determined based on the complex voltage and current V60, I60, and φ60 (FIG. 3B) received at a node 259 and characteristics of the inductor Ltunnel, the capacitor Ctunnel, and the inductor Lstrap. When the 2 MHz, 27 MHz, and the 60 MHz RF generators are on, the complex voltages and currents V21, I21, φ21, V271, I271, φ271, V601, I601, and φ601 are an example of the third complex voltage and current. The method 102 ends after the operation 119.

Figure 3A:
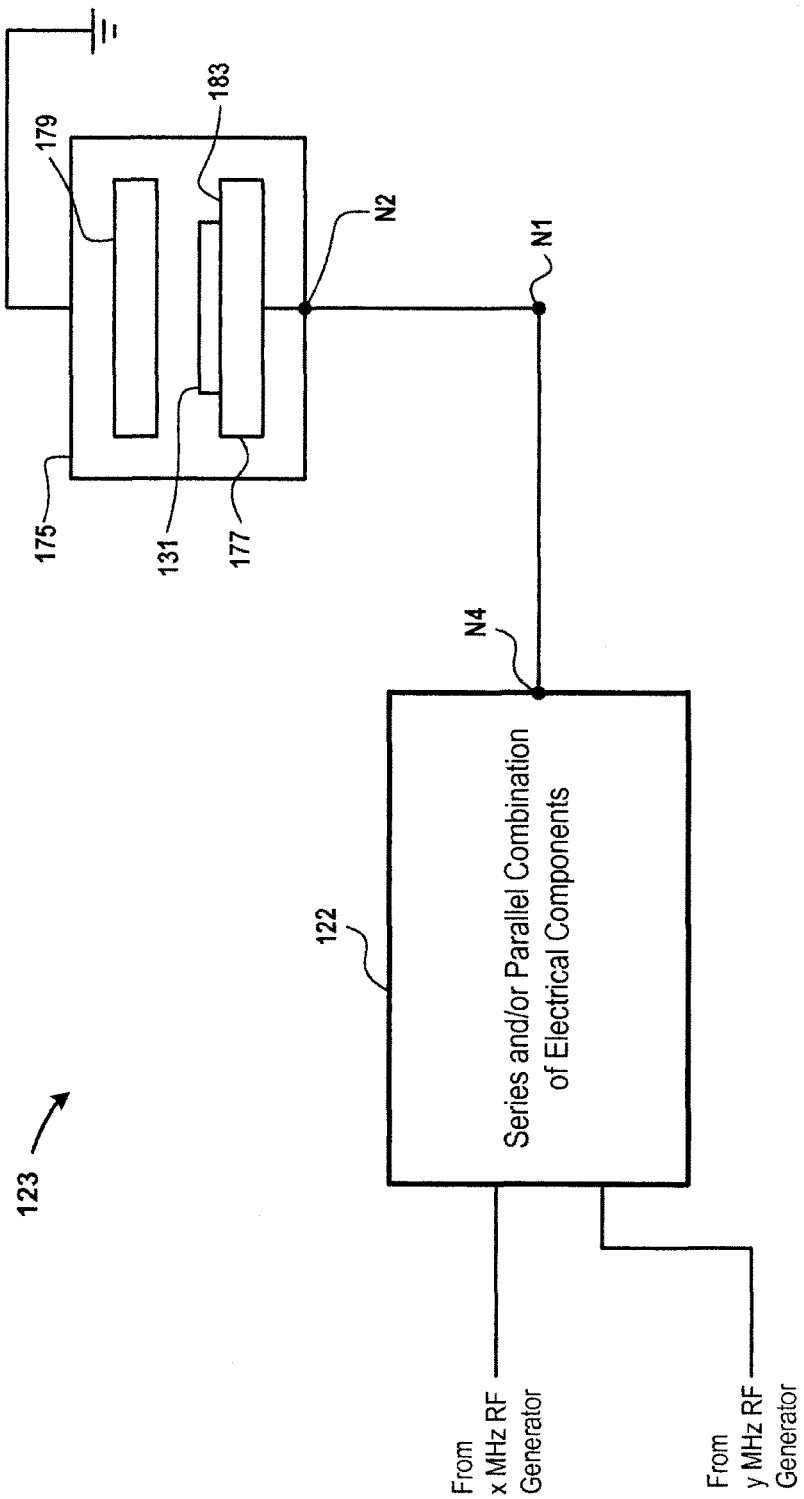
FIG. 3A is a block diagram of a system used to illustrate an impedance matching circuit, in accordance with an embodiment described in the present disclosure.

FIG. 3A is a block diagram of an embodiment of a system 123 used to illustrate an impedance matching circuit 122. The impedance matching circuit 122 is an example of the impedance matching circuit 114 (FIG. 1). The impedance matching circuit 122 includes series connections between electrical components and/or parallel connections between electrical components.

Figure 3B:
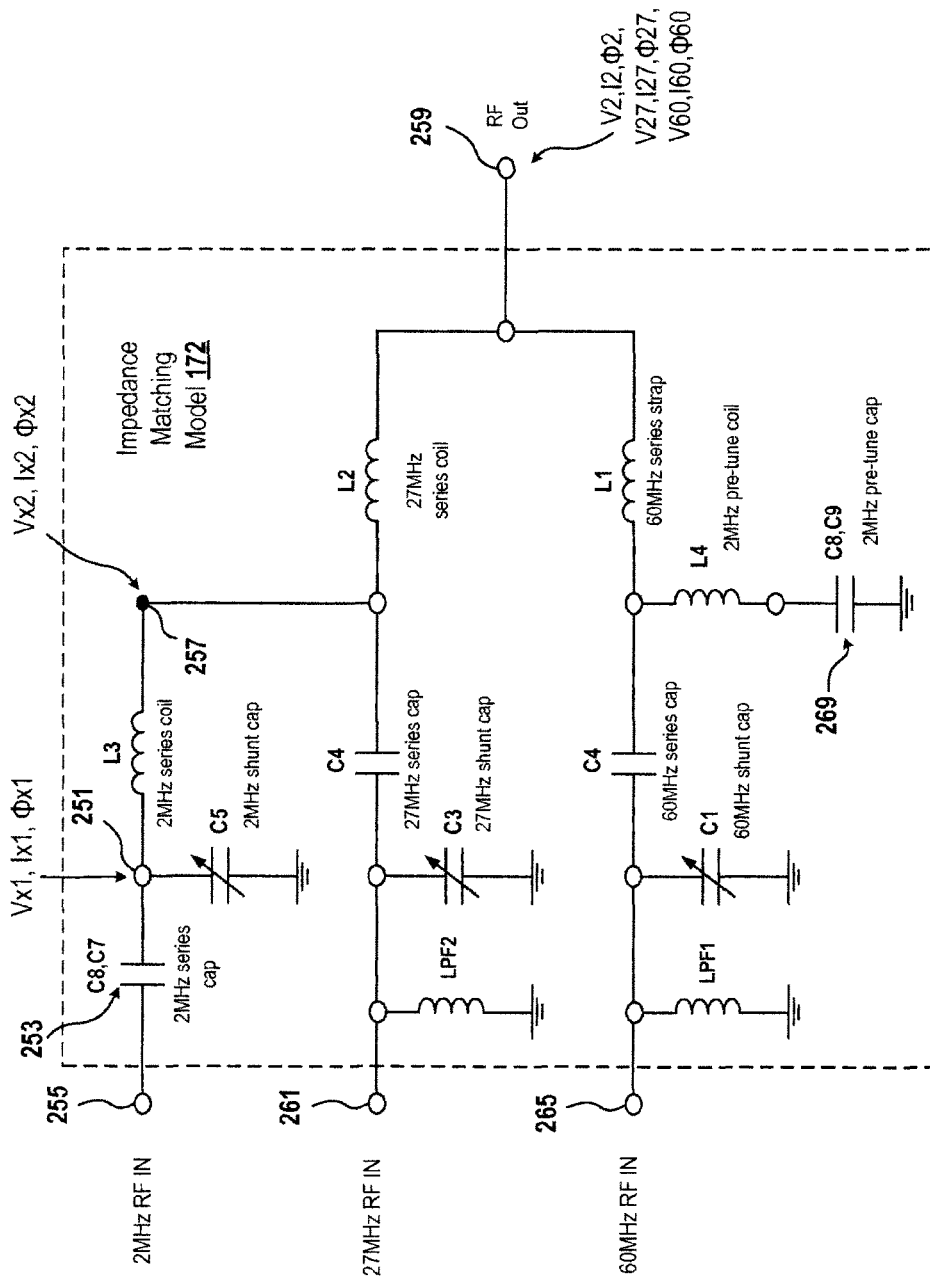
FIG. 3B is a circuit diagram of an impedance matching model, in accordance with an embodiment described in the present disclosure.

FIG. 3B is a circuit diagram of an embodiment of an impedance matching model 172. The impedance matching model 172 is an example of the impedance matching model 104 (FIG. 1). As shown, the impedance matching model 172 includes capacitors having capacitances C1 thru C9, inductors having inductances LPF1, LPF2, and L1 thru L4. It should be noted that the manner in which the inductors and/or capacitors are coupled with each other in FIG. 3B is an example. For example, the inductors and/or capacitors shown in FIG. 3B can be coupled in a series and/or parallel manner with each other. Also, in some embodiments, the impedance matching model 172 includes a different number of capacitors and/or a different number of inductors than that shown in FIG. 3B.

Figure 4:
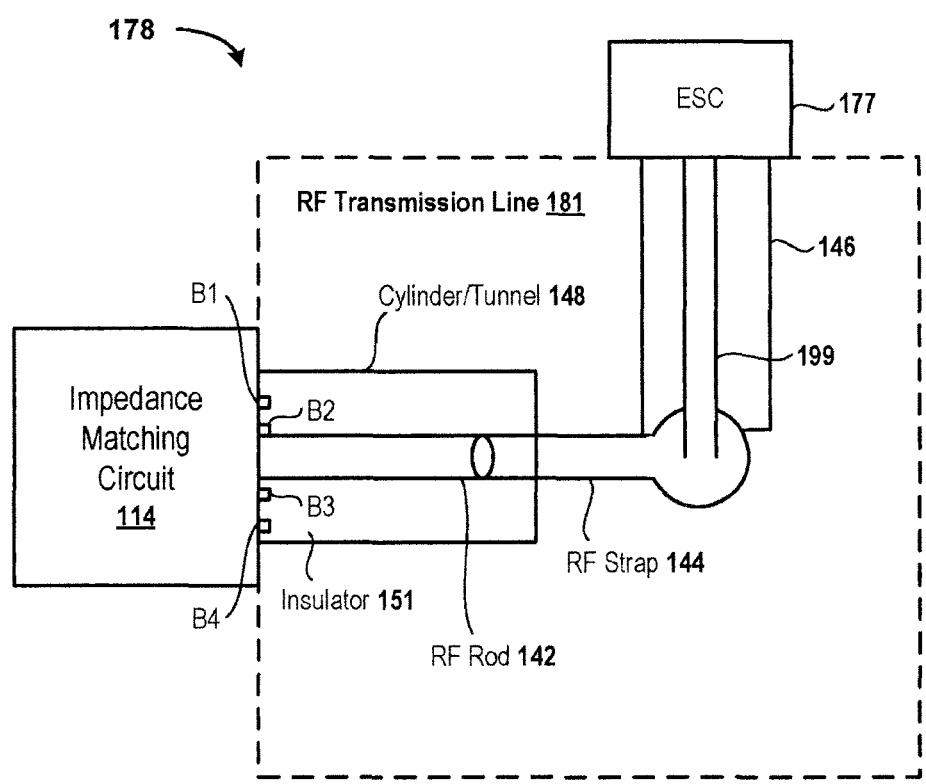
FIG. 4 is a diagram of a system used to illustrate an RF transmission line, in accordance with an embodiment described in the present disclosure.

FIG. 4 is a diagram of an embodiment of a system 178 used to illustrate an RF transmission line 181, which is an example of the RF transmission line 113 (FIG. 1). The RF transmission line 181 includes a cylinder 148, e.g., a tunnel. Within a hollow of the cylinder 148 lies an insulator 151 and an RF rod 142. A combination of the cylinder 148 and the RF rod 142 is an example of the portion 169 (FIG. 1) of the RF transmission line 113 (FIG. 1). The RF transmission line 181 is bolted via bolts B1, B2, B3, and B4 with the impedance matching circuit 114. In one embodiment, the RF transmission line 181 is bolted via any number of bolts with the impedance matching circuit 114. In some embodiments, instead of or in addition to bolts, any other form of attachment, e.g., glue, screws, etc., is used to attach the RF transmission line 181 to the impedance matching circuit 114.

The RF transmission rod 142 is coupled with the output of the impedance matching circuit 114. Also, an RF strap 144, also known as RF spoon, is coupled with the RF rod 142 and with an RF rod 199, a portion of which is located within a support 146, e.g., a cylinder. The support 146 that includes the RF rod 199 is an example of the portion 195

(FIG. 1). In an embodiment, a combination of the cylinder 148, the RF rod 142, the RF strap 144, the support 146 and the RF rod 199 forms the RF transmission line 181, which is an example of the RF transmission line 113 (FIG. 1). The support 146 provides support to the plasma chamber. The support 146 is attached to the ESC 177 of the plasma chamber. An RF signal is supplied from the x MHz generator via the cable 150, the impedance matching circuit 114, the RF rod 142, the RF strap 144, and the RF rod 199 to the ESC 177.

In one embodiment, the ESC 177 includes a heating element and an electrode on top of the heating element. In an embodiment, the ESC 177 includes a heating element and the lower electrode. In one embodiment, the ESC 177 includes the lower electrode and a heating element, e.g., coil wire, etc., embedded within holes formed within the lower electrode. In some embodiments, the electrode is made of a metal, e.g., aluminum, copper, etc. It should be noted that the RF transmission line 181 supplies an RF signal to the lower electrode of the ESC 177.

Figure 5A:
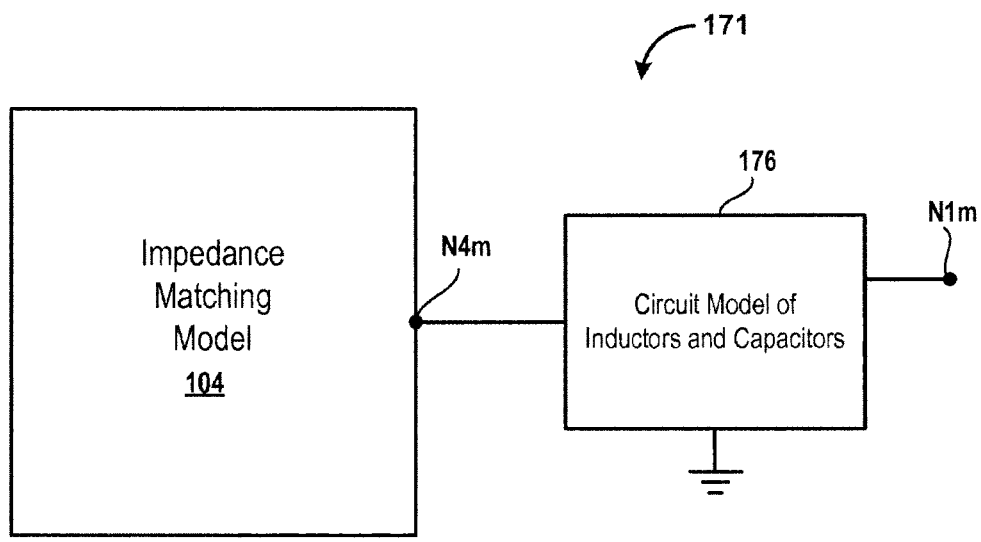
FIG. 5A is a block diagram of a system used to illustrate a circuit model of the RF transmission line, in accordance with an embodiment described in the present disclosure.

FIG. 5A is a block diagram of an embodiment of a system 171 used to illustrate a circuit model 176 of the RF transmission line 113 (FIG. 1). For example, the circuit model 176 includes inductors and/or capacitors, connections between the inductors, connections between the capacitors, and/or connections between the inductors and the capacitors. Examples of connections include series and/or parallel connections. The circuit model 176 is an example of the RF transmission model 161 (FIG. 1).

Figure 5B:
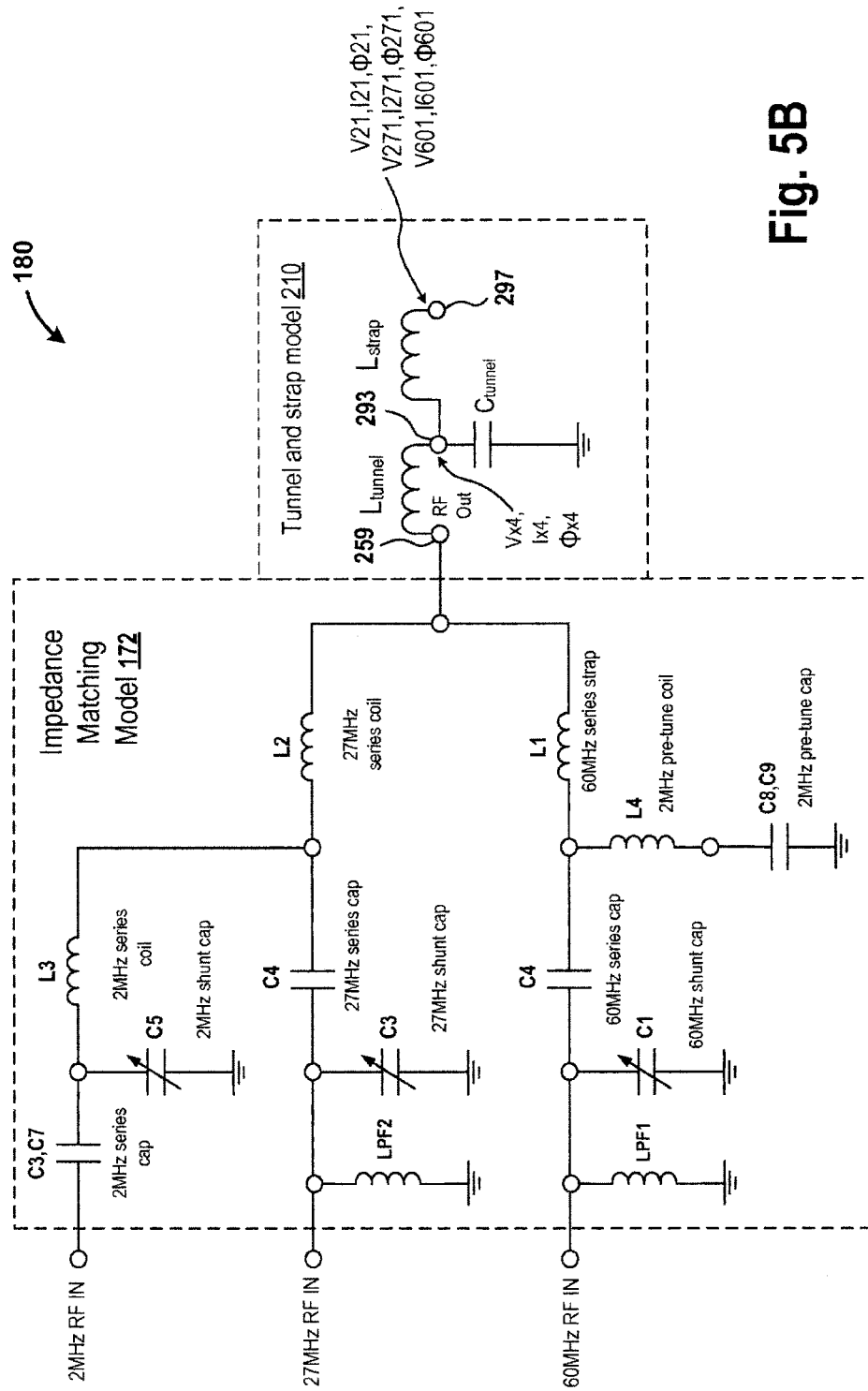
FIG. 5B is a diagram of an electrical circuit used to illustrate a tunnel and strap model of the RF transmission model, in accordance with an embodiment described in the present disclosure.

FIG. 5B is a diagram of an embodiment of an electrical circuit 180 used to illustrate the tunnel and strap model 210, which is an example of the portion 173 (FIG. 1) of the RF transmission model 161 (FIG. 1). The electrical circuit 180 includes the impedance matching model 172 and the tunnel and strap model 210. The tunnel and strap model 210 includes inductors Ltunnel and Lstrap and a capacitor Ctunnel. It should be noted that the inductor Ltunnel represents an inductance of the cylinder 148 (FIG. 4) and the RF rod 142 and the capacitor Ctunnel represents a capacitance of the cylinder 148 and the RF rod 142. Moreover, the inductor Lstrap represents an inductance of the RF strap 144 (FIG. 4).

In an embodiment, the tunnel and strap model 210 includes any number of inductors and/or any number of capacitors. In this embodiment, the tunnel and strap model 210 includes any manner, e.g., serial, parallel, etc. of coupling a capacitor to another capacitor, coupling a capacitor to an inductor, and/or coupling an inductor to another inductor.

Figure 5C:
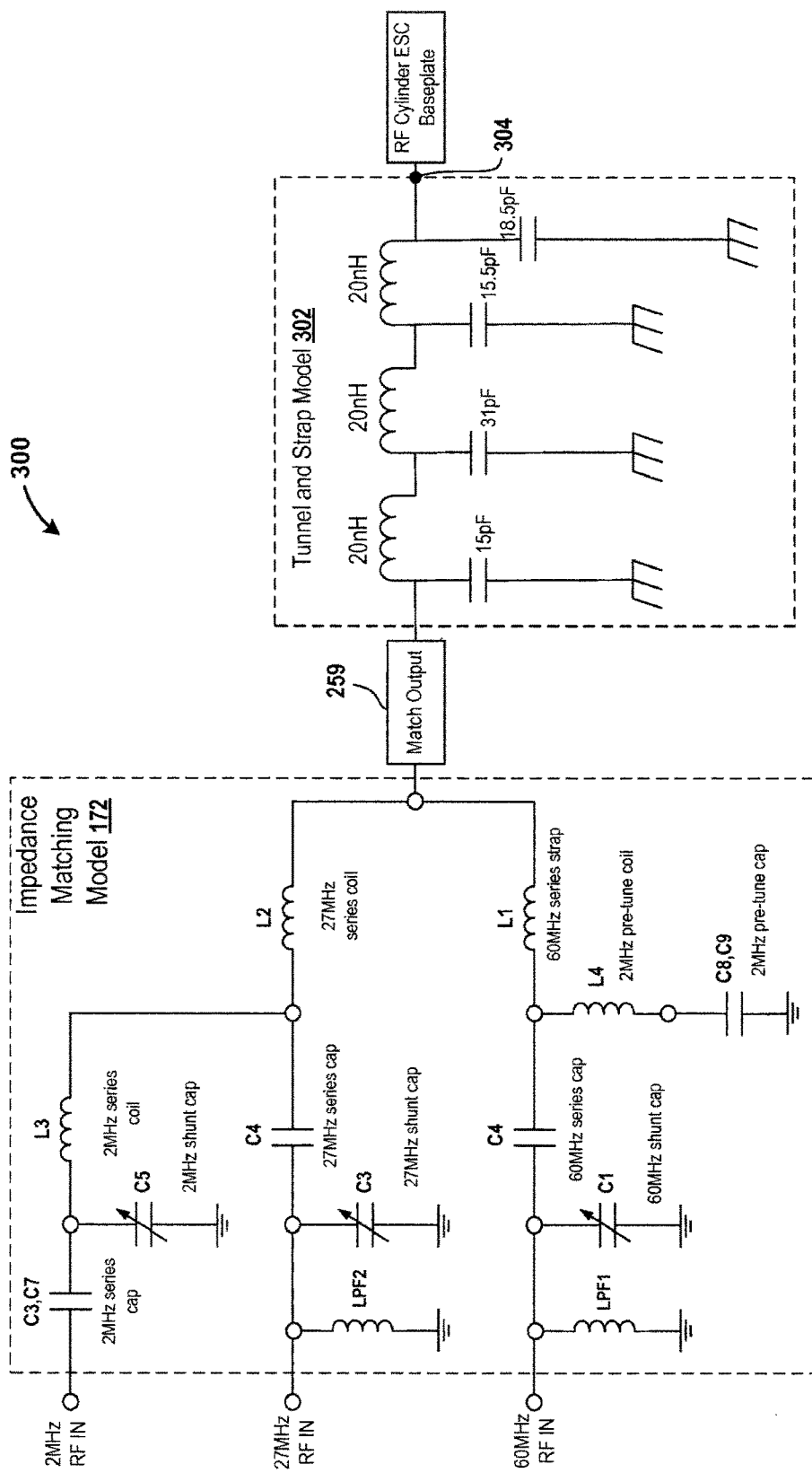
FIG. 5C is a diagram of an electrical circuit used to illustrate a tunnel and strap model, in accordance with an embodiment described in the present disclosure.

FIG. 5C is a diagram of an embodiment of an electrical circuit 300 used to illustrate a tunnel and strap model 302, which is an example of the portion 173 (FIG. 1) of the RF transmission model 161 (FIG. 1). The tunnel and strap model 302 is coupled via the output 259 to the impedance matching model 172. The tunnel and strap model 302 includes inductors having inductances 20 nanoHenry (nH) and capacitors having capacitances of 15 picoFarads (pF), 31 pF, 15.5 pF, and 18.5 pF. The tunnel and strap model 302 is coupled via a node 304 to an RF cylinder, which is coupled to the ESC 177 (FIG. 1). The RF cylinder is an example of the portion 195 (FIG. 1).

It should be noted that in some embodiments, the inductors and capacitors of the tunnel and strap model 302 have other values. For example, the 20 nH inductors have an inductance ranging between 15 and 20 nH or between 20 and 25 nH. As another example, two or more of the inductors of the tunnel and strap model 302 have difference inductances. As yet another example, the 15 pF capacitor has a capacitance ranging between 8 pF and 25 pF, the 31 pF capacitor has a capacitance ranging between 15 pF and 45 pF, the 15.5 pF capacitor has a capacitance ranging between 9 pF and 20 pF, and the 18.5 pF capacitor has a capacitance ranging between 10 pF and 27 pF.

In various embodiments, any number of inductors are included in the tunnel and strap model 302 and any number of capacitors are included in the tunnel and strap model 302.

Figure 6:
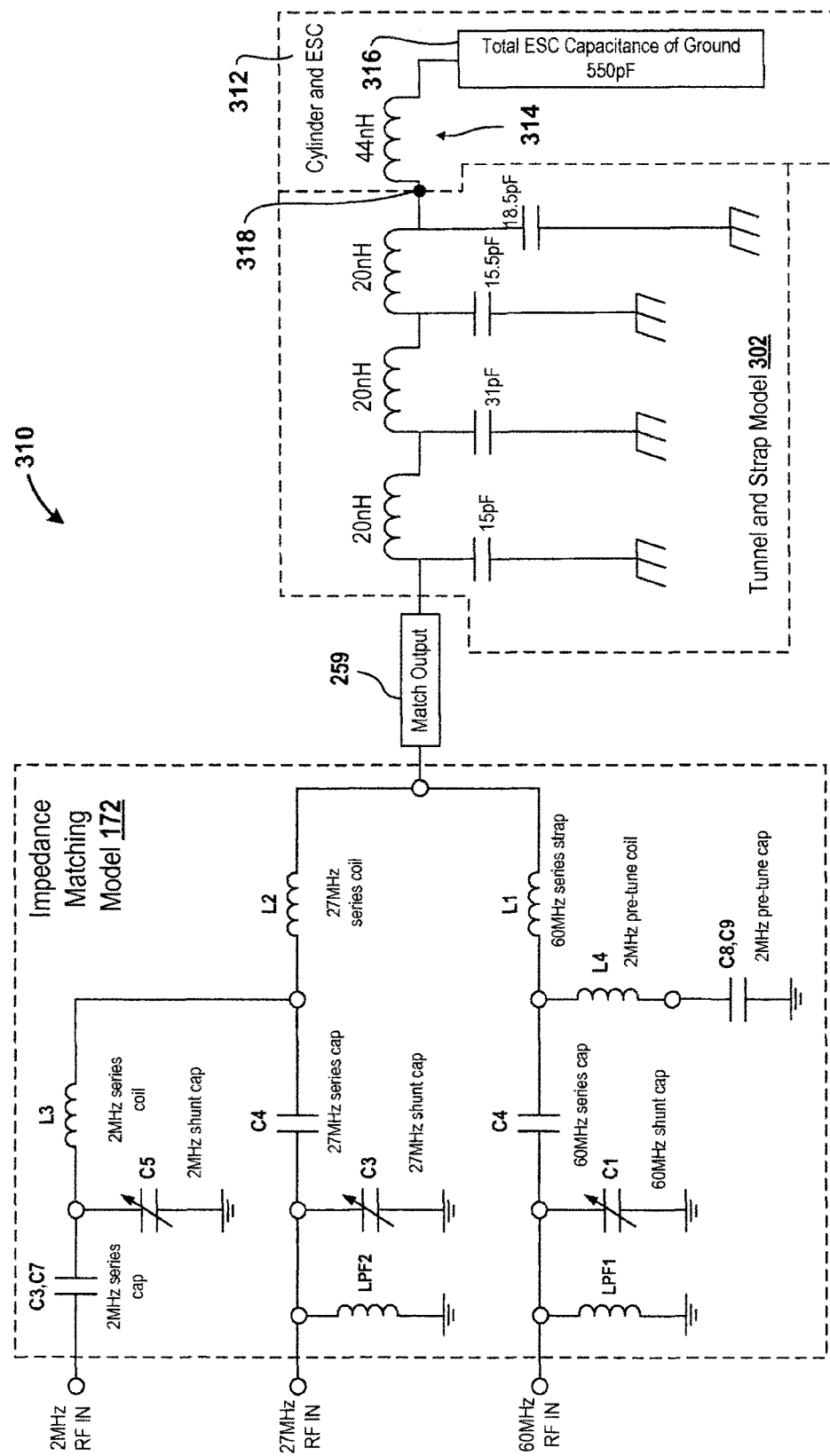
FIG. 6 is a diagram of an electrical circuit used to illustrate a cylinder and ESC model, in accordance with an embodiment described in the present disclosure.

FIG. 6 is a diagram of an embodiment of an electrical circuit 310 used to illustrate a cylinder and ESC model 312, which is a combination of an inductor 313 and a capacitor 316. The cylinder and ESC model 312 includes a cylinder model and an ESC model, which is an example of the ESC model 125 (FIG. 1). The cylinder model is an example of the portion 197 (FIG. 1) of the RF transmission model 161 (FIG. 1). The cylinder and ESC model 312 has similar characteristics as that of a combination of the portion 195 and the ESC 177 (FIG. 1). For example, the cylinder and ESC model 312 has the same resistance as that of a combination of the portion 195 and the ESC 177. As another example, the cylinder and ESC model 312 has the same inductance as that of a combination of the portion 195 and the ESC 177. As yet another example, the cylinder and ESC model 312 has the same capacitance as that of a combination of the portion 195 and the ESC 177. As yet another example, the cylinder and ESC model 312 has the same inductance, resistance, capacitance, or a combination thereof, as that of a combination of the portion 195 and the ESC 177.

The cylinder and ESC model 312 is coupled via a node 318 to the tunnel and strap model 302. The node 318 is an example of the model node N1m (FIG. 1).

It should be noted that in some embodiments, an inductor having an inductance other than the 44 milliHenry (mH) is used in the cylinder and ESC model 312. For example, an inductor having an inductance ranging from 35 mH to 43.9 mH or from 45.1 mH too 55 mH is used. In various embodiments, a capacitor having a capacitance other than 550 pF is used. For example, instead of the 550 pF capacitor, a capacitor having a capacitance ranging between 250 and 550 pF or between 550 and 600 pF is used.

The processor of the host system 130 (FIG. 1) calculates a combined impedance, e.g., total impedance, etc., of a combination of the model 172, the tunnel and strap model 302, and the cylinder and ESC model 312. The combined impedance and complex voltage and current determined at the model node 318 are used as inputs by the processor of the host system 130 to calculate a complex voltage and impedance at the node N6m. It should be noted that an output of the cylinder and ESC model 312 is the model node N6m.

Figure 7:
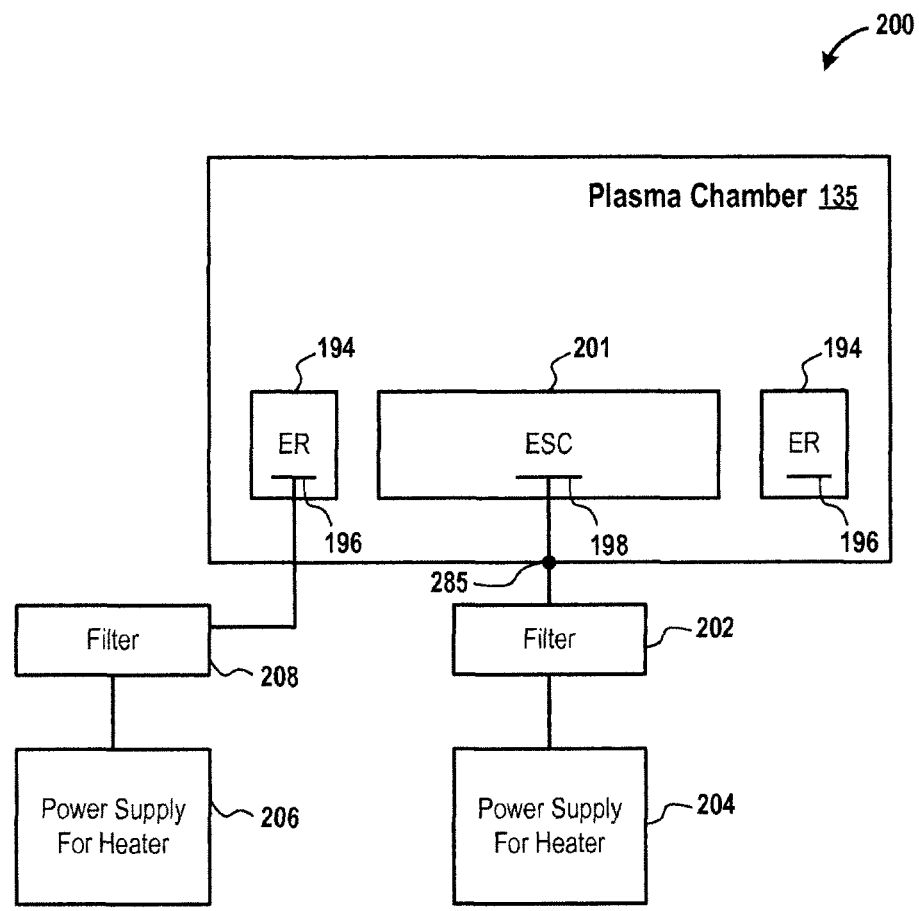
FIG. 7 is a block diagram of a plasma system that includes filters used to determine the variable, in accordance with an embodiment described in the present disclosure.

FIG. 7 is a block diagram of an embodiment of a system 200 that is used to determine a variable. The system 200 includes a plasma chamber 135, which further includes an ESC 201 and has an input 285. The plasma chamber 135 is an example of the plasma chamber 175 (FIG. 1) and the ESC 201 is an example of the ESC 177 (FIG. 1). The ESC 201 includes a heating element 198. Also, the ESC 201 is surrounded by an edge ring (ER) 194. The ER 194 includes a heating element 196. In an embodiment, the ER 194 facilitates a uniform etch rate and reduced etch rate drift near an edge of the work piece 131 that is supported by the ESC 201.

A power supply 206 provides power to the heating element 196 via a filter 208 to heat the heating element 196 and a power supply 204 provides power to the heating element 198 via a filter 202 to heat the heating element 198. In an embodiment, a single power supply provides power to both the heating elements 196 and 198. The filter 208 filters out predetermined frequencies of a power signal that is received from the power supply 206 and the filter 202 filters out predetermined frequencies of a power signal that is received from the power supply 204.

The heating element 198 is heated by the power signal received from the power supply 204 to maintain an electrode of the ESC 201 at a desirable temperature to further maintain an environment within the plasma chamber 135 at a desirable temperature. Moreover, the heating element 196 is heated by the power signal received from the power supply 206 to maintain the ER 194 at a desirable temperature to further maintain an environment within the plasma chamber 135 at a desirable temperature.

It should be noted that in an embodiment, the ER 194 and the ESC 201 include any number of heating elements and any type of heating elements. For example, the ESC 201 includes an inductive heating element or a metal plate. In one embodiment, each of the ESC 201 and the ER 194 includes one or more cooling elements, e.g., one or more tubes that allow passage of cold water, etc., to maintain the plasma chamber 135 at a desirable temperature.

It should further be noted that in one embodiment, the system 200 includes any number of filters. For example, the power supplies 204 and 206 are coupled to the ESC 201 and the ER 194 via a single filter.

FIG. 8A is a diagram of an embodiment of a system 217 used to illustrate a model of the filters 202 and 208 (FIG. 7) to improve an accuracy of the variable. The system 217 includes the tunnel and strap model 210 that is coupled via a cylinder model 211 to a model 216, which includes capacitors and/or inductors and connections therebetween of the filters 202 and 208. The model 216 is stored within the storage HU 162 (FIG. 1) and/or the other storage HU. The capacitors and/or inductors of the model 216 are coupled with each other in a manner, e.g., a parallel manner, a serial manner, a combination thereof, etc. The model 216 represents capacitances and/or inductances of the filters 202 and 208.

Moreover, the system 217 includes the cylinder model 211, which is a computer-generated model of the RF rod 199 (FIG. 4) and the support 146 (FIG. 4). The cylinder model 211 has similar characteristics as that of electrical components of the RF rod 199 and the support 146. The cylinder model 211 includes one or more capacitors, one or more inductors, connections between the inductors, connections between the capacitors, and/or connections between a combination of the capacitors and inductors.

The processor of the host system 130 (FIG. 1) calculates a combined impedance, e.g., total impedance, etc., of the model 216, the tunnel and strap model 210, and the cylinder model 211. The combined impedance provides a complex voltage and impedance at the node N2m. With the inclusion of the model 216 and the tunnel and strap model 210 in determining the variable at the node N2m, accuracy of the variable is improved. It should be noted that an output of the model 216 is the model node N2m.

FIG. 8B is a diagram of an embodiment of a system 219 used to illustrate a model of the filters 202 and 208 (FIG. 7) to improve an accuracy of the variable. The system 219 includes the tunnel and strap model 210 and a model 218, which is coupled in parallel to the tunnel and strap model 210. The model 218 is an example of the model 216 (FIG. 8A). The model 218 includes an inductor Lfilter, which represents a combined inductance of the filters 202 and 208. The model 218 further includes a capacitor Cfilter, which represents directed combined capacitance of the filters 202 and 208.

Figure 9:
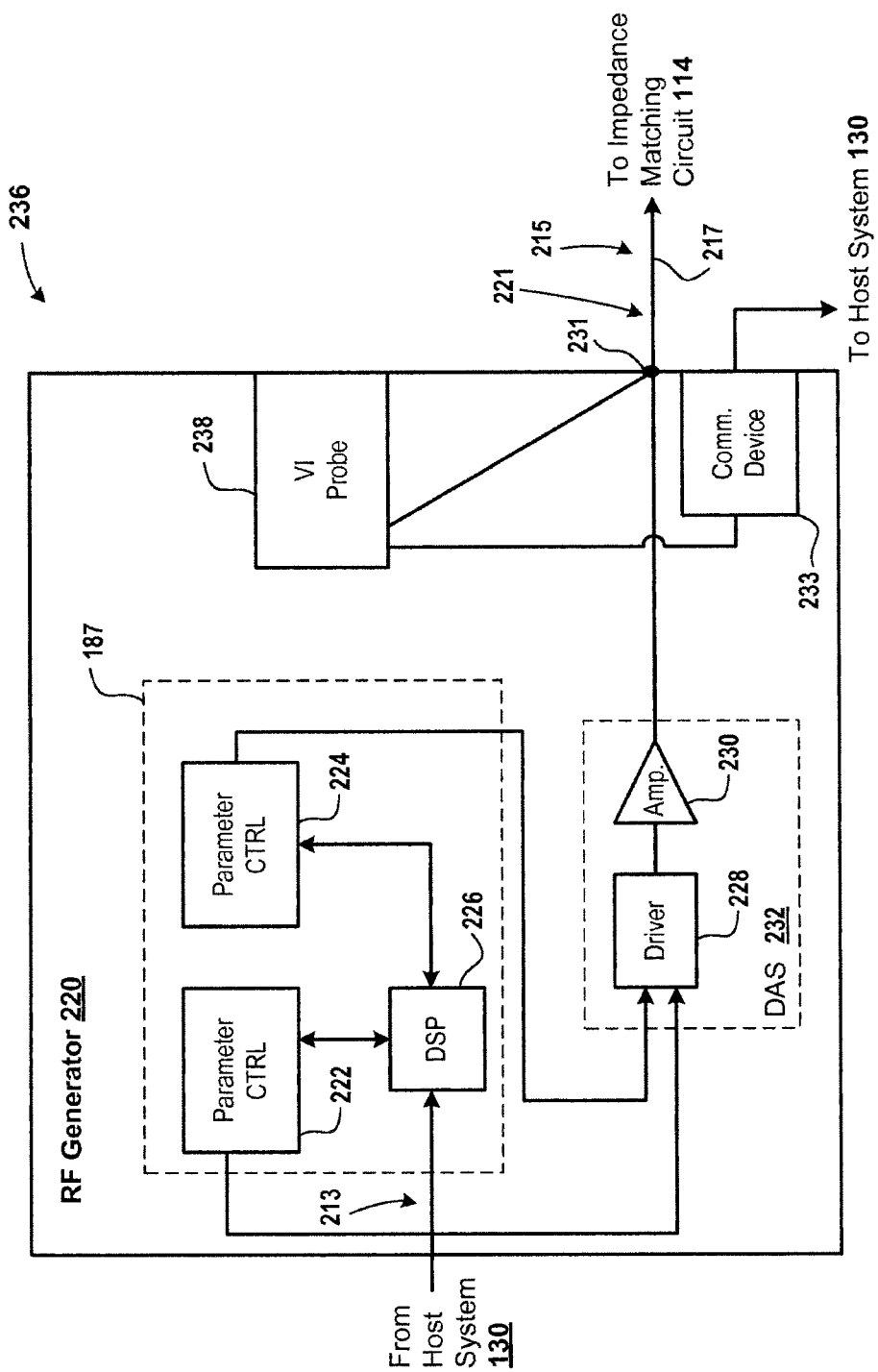
FIG. 9 is a block diagram of a system for using a voltage and current probe to measure the variable at an output of an RF generator of the system of FIG. 1, in accordance with one embodiment described in the present disclosure.

FIG. 9 is a block diagram of an embodiment of a system 236 for using a voltage and current probe 238 to measure a variable at an output 231 of an RF generator 220. The output 231 is an example of the node N3 (FIG. 1) or of the node N5 (FIG. 1). The RF generator 220 is an example of the x MHz generator or the y MHz generator (FIG. 1). The host system 130 generates and provides a digital pulsing signal 213 having two or more states to a digital signal processor (DSP) 226. In one embodiment, the digital pulsing signal 213 is a transistor-transistor logic (TTL) signal. Examples of the states include an on state and an off state, a state having a digital value of 1 and a state having a digital value of 0, a high state and a low state, etc.

In another embodiment, instead of the host system 130, a clock oscillator, e.g., a crystal oscillator, etc., is used to generate an analog clock signal, which is converted by an analog-to-digital converter into a digital signal similar to the digital pulsing signal 213.

The digital pulsing signal 213 is sent to the DSP 226. The DSP 226 receives the digital pulsing signal 213 and identifies the states of the digital pulsing signal 213. For example, the DSP 226 determines that the digital pulsing signal 213 has a first magnitude, e.g., the value of 1, the high state magnitude, etc., during a first set of time periods and has a second magnitude, e.g., the value of 0, the low state magnitude, etc., during a second set of time periods. The DSP 226 determines that the digital pulsing signal 213 has a state S1 during the first set of time periods and has a state S0 during the second set of time periods. Examples of the state S0 include the low state, the state having the value of 0, and the off state. Examples of the state S1 include the high state, the state having the value of 1, and the on state. As yet another example, the DSP 226 compares a magnitude of the digital pulsing signal 213 with a pre-stored value to determine that the magnitude of the digital pulsing signal 213 is greater than the pre-stored value during the first set of time periods and that the magnitude during the state S0 of the digital pulsing signal 213 is not greater than the pre-stored value during the second set of time periods. In the embodiment in which the clock oscillator is used, the DSP 226 receives an analog clock signal from the clock oscillator, converts the analog signal into a digital form, and then identifies the two states S0 and S1.

When a state is identified as S1, the DSP 226 provides a power value P1 and/or a frequency value F1 to a parameter control 222. Moreover, when the state is identified as S0, the DSP 226 provides a power value P0 and/or a frequency value F0 to a parameter control 224. An example of a parameter control that is used to tune a frequency includes an auto frequency tuner (AFT).

It should be noted that the parameter control 222, the parameter control 224, and the DSP 226 are portions of a control system 187. For example, the parameter control 222 and the parameter control 224 are logic blocks, e.g., tuning loops, etc., which are portions of a computer program that is executed by the DSP 226. In some embodiments, the computer program is embodied within a non-transitory computer-readable medium, e.g., a storage HU.

In an embodiment, a controller, e.g., hardware controller, ASIC, PLD, etc., is used instead of a parameter control. For example, a hardware controller is used instead of the parameter control 222 and another hardware controller is used instead of the parameter control 224.

Upon receiving the power value P1 and/or the frequency value F1, the parameter control 222 provides the power value P1 and/or the frequency value F1 to a driver 228 of a drive and amplifier system (DAS) 232. Examples of a driver includes a power driver, a current driver, a voltage driver, a transistor, etc. The driver 228 generates an RF signal having the power value P1 and/or the frequency value F1 and provides the RF signal to an amplifier 230 of the DAS 232.

In one embodiment, the driver 228 generates an RF signal having a drive power value that is a function of the power value P1 and/or having a drive frequency value that is a function of the frequency value F1. For example, the drive power value is within a few watts, e.g. 1 thru 5 watts, etc., of the power value P1 and the drive frequency value is within a few Hz, e.g. 1 thru 5 Hz, etc., of the frequency value F1.

The amplifier 230 amplifies the RF signal having the power value P1 and/or the frequency value F1 and generates an RF signal 215 that corresponds to the RF signal received from the driver 228. For example, the RF signal 215 has a higher amount of power than that of the power value P1. As another example, the RF signal 215 has the same amount of power as that of the power value P1. The RF signal 215 is transferred via a cable 217 and the impedance matching circuit 114 to the ESC 177 (FIG. 1).

The cable 217 is an example of the cable 150 or the cable 152 (FIG. 1). For example, when the RF generator 220 is an example of the x MHz RF generator (FIG. 1), the cable 217 is an example of the cable 150 and when the RF generator 220 is an example of the y MHz RF generator (FIG. 1), the cable 217 is an example of the cable 152.

When the power value P1 and/or the frequency value F1 are provided to the DAS 232 by the parameter control 222 and the RF signal 215 is generated, the voltage and current probe 238 measures values of the variable at the output 231 that is coupled to the cable 217. The voltage and current probe 238 is an example of the voltage and current probe 110 or the voltage and current probe 111 (FIG. 1). The voltage and current probe 238 sends the values of the variable via a communication device 233 to the host system 130 for the host system 130 to execute the method 102 (FIG. 3) and methods 340, 351, and 397 (FIGS. 13, 15, and 17) described herein. The communication device 233 is an example of the communication device 185 or 189 (FIG. 1). The communication device 233 applies a protocol, e.g., Ethernet, EtherCAT, USB, serial, parallel, packetization, depacketization, etc., to transfer data from the voltage and current probe 238 to the host system 130. In various embodiments, the host system 130 includes a communication device that applies the protocol applied by the communication device 233. For example, when the communication 233 applies packetization, the communication device of the host system 130 applies depacketization. As another example, when the communication device 233 applies a serial transfer protocol, the communication device of the host system 130 applies a serial transfer protocol.

Similarly, upon receiving the power value P0 and/or the frequency value F0, the parameter control 224 provides the power value P0 and/or the frequency value F0 to the driver 228. The driver 228 creates an RF signal having the power value P0 and/or the frequency value F0 and provides the RF signal to the amplifier 230.

In one embodiment, the driver 228 generates an RF signal having a drive power value that is a function of the power value P0 and/or having a drive frequency value that is a function of the frequency value F0. For example, the drive power value is within a few, e.g. 1 thru 5, watts of the power value P0 and the drive frequency value is within a few, e.g. 1 thru 5, Hz of the frequency value F0.

The amplifier 230 amplifies the RF signal having the power value P0 and/or the frequency value F0 and generates an RF signal 221 that corresponds to the RF signal received from the driver 228. For example, the RF signal 221 has a higher amount of power than that of the power value P0. As another example, the RF signal 221 has the same amount of power as that of the power value P0. The RF signal 221 is transferred via the cable 217 and the impedance matching circuit 114 to the known load 112 (FIG. 2).

Figure 17:
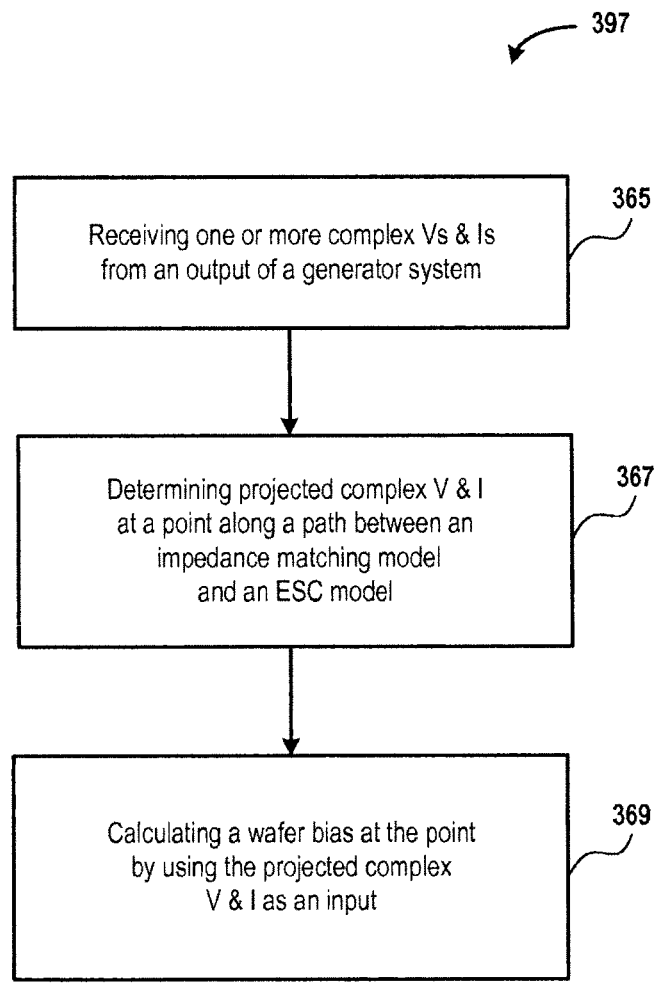
FIG. 17 is a flowchart of a method for determining a wafer bias at a model node of the system of FIG. 1, in accordance with an embodiment described in the present disclosure.

When the power value P0 and/or the frequency value F0 are provided to the DAS 232 by the parameter control 222 and the RF signal 121 is generated, the voltage and current probe 238 measures values of the variable at the output 231. The voltage and current probe 238 sends the values of the variable to the host system 130 for the host system 130 to execute the method 102 (FIG. 2), the method 340 (FIG. 13), the method 351 (FIG. 15), or the method 397 (FIG. 17).

It should be noted that the in one embodiment, the voltage and current probe 238 is decoupled from the DSP 226. In some embodiments, the voltage and current probe 238 is coupled to the DSP 226. It should further be noted that the RF signal 215 generated during the state S1 and the RF signal 221 generated during the state S0 are portions of a combined RF signal. For example, the RF signal 215 is a portion of the combined RF signal that has a higher amount of power than the RF signal 221, which is another portion of the combined RF signal.

Figure 10:
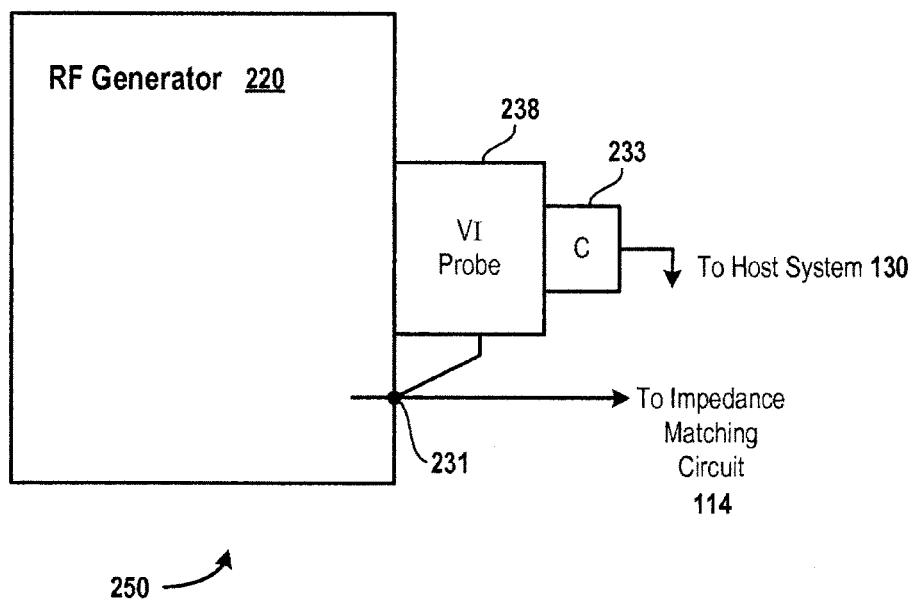
FIG. 10 is a block diagram of a system in which the voltage and current probe and a communication device are located outside the RF generator, in accordance with an embodiment described in the present disclosure.

FIG. 10 is a block diagram of an embodiment of a system 250 in which the voltage and current probe 238 and the communication device 233 are located outside the RF generator 220. In FIG. 1, the voltage and current probe 110 is located within the x MHz RF generator to measure the variable at the output of the x MHz RF generator. The voltage and current probe 238 is located outside the RF generator 220 to measure the variable at the output 231 of the RF generator 220. The voltage and current probe 238 is associated, e.g., coupled, to the output 231 of the RF generator 220.

Figure 11:
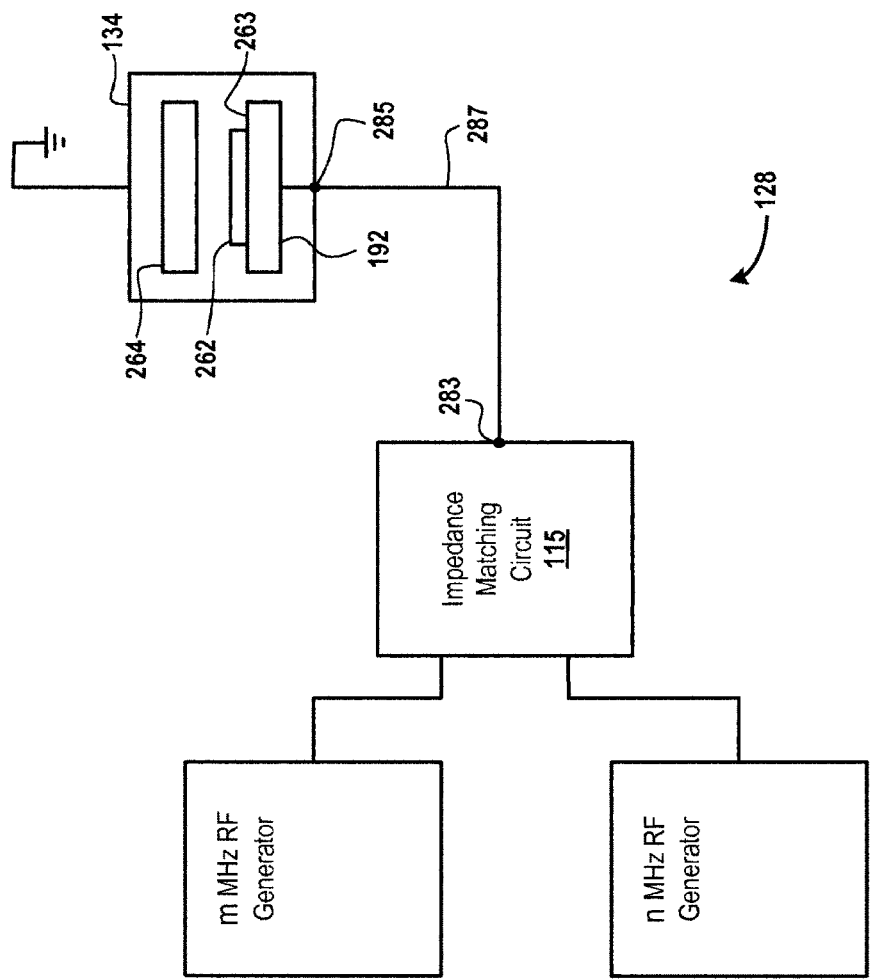
FIG. 11 is a block diagram of a system in which values of the variable determined using the system of FIG. 1 are used, in accordance with an embodiment described in the present disclosure.

FIG. 11 is a block diagram of an embodiment of a system 128 in which the values of the variable determined using the system 126 of FIG. 1 are used. The system 128 includes an m MHz RF generator, an n MHz RF generator, an impedance matching circuit 115, an RF transmission line 287, and a plasma chamber 134. In various embodiments, the plasma chamber 134 is similar to the plasma chamber 175.

It should be noted that in an embodiment, the x MHz RF generator of FIG. 2 is similar to the m MHz RF generator and the y MHz RF generator of FIG. 2 is similar to the n MHz RF generator. As an example, x MHz is equal to m MHz and y MHz is equal to n MHz. As another example, the x MHz generator and the m MHz generators have similar frequencies and the y MHz generator and the n MHz generator have similar frequencies. An example of similar frequencies is when the x MHz is within a window, e.g., within kHz or Hz, of the m MHz frequency. In some embodiments, the x MHz RF generator of FIG. 2 is not similar to the m MHz RF generator and the y MHz RF generator of FIG. 2 is not similar to the n MHz RF generator.

It is further noted that in various embodiments, a different type of sensor is used in each of the m MHz and n MHz RF generators than that used in each of the x MHz and y MHz RF generators. For example, a sensor that does not comply with the NIST standard is used in the m MHz RF generator. As another example, a voltage sensor that measures only voltage is used in the m MHz RF generator.

It should further be noted that in an embodiment, the impedance matching circuit 115 is similar to the impedance matching circuit 114 (FIG. 1). For example, an impedance of the impedance matching circuit 114 is the same as an impedance of the impedance matching circuit 115. As another example, an impedance of the impedance matching circuit 115 is within a window, e.g., within 10-20%, of the impedance of the impedance matching circuit 114. In some embodiments, the impedance matching circuit 115 is not similar to the impedance matching circuit 114.

The impedance matching circuit 115 includes electrical components, e.g., inductors, capacitors, etc., to match an impedance of a load coupled to the impedance matching circuit 115 with an impedance of a source coupled to the circuit 115. For example, the impedance matching circuit 114 matches an impedance of a load, e.g., a combination of the plasma chamber 134 and the RF transmission line 287, a filter coupled to the impedance matching circuit 114, etc., with an impedance of a source coupled to the impedance matching circuit 114, e.g., a combination of the m MHz RF generator, the n MHz RF generator, and cables coupling the m and n MHz RF generators to the impedance matching circuit 114, a filter coupled to the impedance matching circuit 114, etc. As another example, the impedance matching circuit 114 matches an impedance of a load, e.g., components coupled to the impedance matching circuit 114 on a side on which the plasma chamber 175 (FIG. 1) is located, etc., with an impedance of a source, e.g., components coupled to the impedance matching circuit 114 on a side on which the m and n MHz RF generators are located, etc.

It should be noted that in an embodiment, the RF transmission line 287 is similar to the RF transmission line 113 (FIG. 1). For example, an impedance of the RF transmission line 287 is the same as an impedance of the RF transmission line 113. As another example, an impedance of the RF transmission line 287 is within a window, e.g., within 10-20%, of the impedance of the RF transmission line 113. In various embodiments, the RF transmission line 287 is not similar to the RF transmission line 113.

The plasma chamber 134 includes an ESC 192, an upper electrode 264, and other parts (not shown), e.g., an upper dielectric ring surrounding the upper electrode 264, an upper electrode extension surrounding the upper dielectric ring, a lower dielectric ring surrounding a lower electrode of the ESC 192, a lower electrode extension surrounding the lower dielectric ring, an upper plasma exclusion zone (PEZ) ring, a lower PEZ ring, etc. The upper electrode 264 is located opposite to and facing the ESC 192. A work piece 262, e.g., a semiconductor wafer, etc., is supported on an upper surface 263 of the ESC 192. Each of the upper electrode 264 and the lower electrode of the ESC 192 is made of a metal, e.g., aluminum, alloy of aluminum, copper, etc.

In one embodiment, the upper electrode 264 includes a hole that is coupled to a central gas feed (not shown). The central gas feed receives one or more process gases from a gas supply (not shown). The upper electrode 264 is grounded. The ESC 192 is coupled to the m MHz RF generator and the n MHz RF generator via the impedance matching circuit 115.

When the process gas is supplied between the upper electrode 264 and the ESC 192 and when the m MHz RF generator and/or the n MHz RF generator supplies power via the impedance matching circuit 115 to the ESC 192, the process gas is ignited to generate plasma within the plasma chamber 134.

It should be noted that the system 128 lacks a probe, e.g., a metrology tool, a voltage and current probe, a voltage probe, etc., to measure the variable at an output 283 of the impedance matching circuit 115, at a point on the RF transmission line 287, or at the ESC 192. The values of the variable at the model nodes N1m, N2m, N4m, and N6m are used to determine whether the system 128 is functioning as desired.

In various embodiments, the system 128 lacks a wafer bias sensor, e.g., an in-situ direct current (DC) probe pick-up pin, and related hardware that is used to measure wafer bias at the ESC 192. The nonuse of the wafer bias sensor and the related hardware saves cost.

It should also be noted that in an embodiment, the system 128 includes any number of RF generators coupled to an impedance matching circuit.

FIGS. 12A, 12B, and 12C are diagrams of embodiments of graphs 268, 272, and 275 that illustrate a correlation between voltage, e.g., RMS voltage, peak voltage, etc., that is measured at the output, e.g., the node N4, of the impedance matching circuit 114 (FIG. 1) within the system 126 (FIG. 1) by using a voltage probe and a voltage, e.g., peak voltage, etc., at a corresponding model node output, e.g., the node N4m, determined using the method 102 (FIG. 2). Moreover, FIGS. 12A, 12B, and 12C are diagrams of embodiments of graphs 270, 274, and 277 that illustrate a correlation between current, e.g., root mean square (RMS) current, etc., that is measured the output, e.g., the node N4, of the system 126 (FIG. 1) by using a current probe and a current, e.g., RMS current, etc., at a corresponding output, e.g., the node N4m, determined using the method 102 (FIG. 2).

The voltage determined using the method 102 is plotted on an x-axis in each graph 268, 272, and 275 and the voltage measured with the voltage probe is plotted on a y-axis in each graph 268, 272, and 275. Similarly, the current determined using the method 102 is plotted on an x-axis in each graph 270, 274, and 277 and the current measured with the current probe is plotted on a y-axis in each graph 270, 274, and 277.

The voltages are plotted in the graph 268 when the x MHz RF generator is on and the y MHz RF generator and a z MHz RF generator, e.g., 60 MHz RF generator, are off. Moreover, the voltages are plotted in the graph 272 when the y MHz RF generator is on and the x and z MHz RF generators are off. Also, the voltages are plotted in the graph 275 when the z MHz RF generator is on and the x and y MHz RF generators are off.

Similarly, currents are plotted in the graph 270 when the x MHz RF generator is on and the y MHz RF generator and a z MHz RF generator are off. Also, the currents are plotted in the graph 274 when the y MHz RF generator is on and the x and z MHz RF generators are off. Also, the currents are plotted in the graph 277 when the z MHz RF generator is on and the x and y MHz RF generators are off.

It can be seen in each graph 268, 272, and 275 that an approximately linear correlation exists between the voltage plotted on the y-axis of the graph and the voltage plotted on the x-axis of the graph. Similarly, it can be seen in each graph 270, 274, and 277 that an approximately linear correlation exists between the current plotted on the y-axis and the current plotted on the x-axis.

Figure 13:
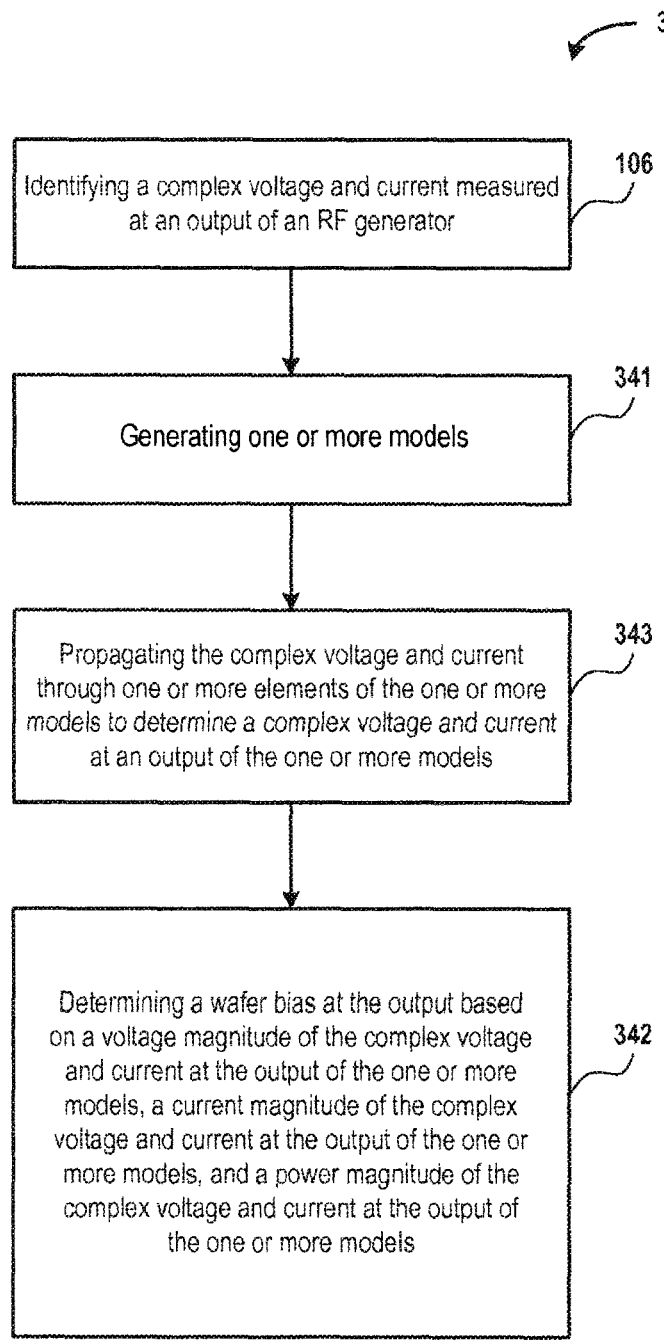
FIG. 13 is a flowchart of a method for determining wafer bias at a model node of the impedance matching model, the RF transmission model, or the ESC model, in accordance with an embodiment described in the present disclosure.

FIG. 13 is a flowchart of an embodiment of the method 340 for determining wafer bias at a model node, e.g., the model node N4m, the model node N1m, the model node N2m, the model node N6m, etc., of the plasma system 126 (FIG. 1). It should be noted that in some embodiments, wafer bias is a direct current (DC) voltage that is created by plasma generated within the plasma chamber 175 (FIG. 1). In these embodiments, the wafer bias is present on a surface, e.g., the upper surface 183, of the ESC 177 (FIG. 1) and/or on a surface, e.g., an upper surface, of the work piece 131 (FIG. 1).

It should further be noted that the model nodes N1m and N2m are on the RF transmission model 161 (FIG. 1) and the model node N6m is on the ESC model 125 (FIG. 1). The method 340 is executed by the processor of the host system 130 (FIG. 1). In the method 340, the operation 106 is performed.

Moreover, in an operation 341, one or more models, e.g. the impedance matching model 104, the RF transmission model 161, the ESC model 125 (FIG. 1), a combination thereof, etc., of corresponding one or more devices, e.g., the impedance matching circuit 114, the RF transmission line 113, the ESC 177, a combination thereof, etc., are generated. For example, the ESC model 125 is generated with similar characteristics to that of the ESC 177 (FIG. 1).

In an operation 343, the complex voltage and current identified in the operation 106 is propagated through one or more elements of the one or more models to determine a complex voltage and current at an output of the one or more models. For example, the second complex voltage and current is determined from the first complex voltage and current. As another example, the second complex voltage and current is determined from the first complex voltage and current and the third complex voltage and current is determined from the second complex voltage and current. As yet another example, the second complex voltage and current is determined from the first complex voltage and current, the third complex voltage and current is determined from the second complex voltage and current, and the third complex voltage and current is propagated through the portion 197 of the RF transmission model 161 (FIG. 1) to determine a fourth complex voltage and current at the model node N2m. In this example, the fourth complex voltage and current is determined by propagating the third complex voltage and current through impedances of elements of the portion 197. As yet another example, the RF transmission model 161 provides an algebraic transfer function that is executed by the processor of the host system 130 to translate the complex voltage and current measured at one or more outputs of one or more RF generators to an electrical node, e.g., the model node N1m, the model node N2m, etc., along the RF transmission model 161.

As another example of the operation 343, the second complex voltage and current is determined from the first complex voltage and current, the third complex voltage and current is determined from the second complex voltage and current, the fourth complex voltage and current is determined from the third complex voltage and current, and the fourth complex voltage and current is propagated through the ESC model 125 to determine a fifth complex voltage and current at the model node N6m. In this example, the fifth complex voltage and current is determined by propagating the fourth complex voltage and current through impedances of elements, e.g., capacitors, inductors, etc., of the ESC model 125.

In an operation 342, a wafer bias is determined at the output of the one or more models based on a voltage magnitude of the complex voltage and current at the output, a current magnitude of the complex voltage and current at the output, and a power magnitude of the complex voltage and current at the output. For example, wafer bias is determined based on a voltage magnitude of the second complex voltage and current, a current magnitude of the second complex voltage and current, and a power magnitude of the second complex voltage and current. To further illustrate, when the x MHz RF generator is on and the y MHz and z MHz RF generators are off, the processor of the host system 130 (FIG. 1) determines wafer bias at the model node N4m (FIG. 1) as a sum of a first product, a second product, a third product, and a constant. In this illustration, the first product is a product of a first coefficient and the voltage magnitude of the second complex voltage and current, the second product is a product of a second coefficient and the current magnitude of the second complex voltage and current, and the third product is a product of a square root of a third coefficient and a square root of a power magnitude of the second complex voltage and current.

As an example, a power magnitude is a power magnitude of delivered power, which is determined by the processor of the host system 130 as a difference between forward power and reflected power. Forward power is power supplied by one or more RF generators of the system 126 (FIG. 1) to the plasma chamber 175 (FIG. 1). Reflected power is power reflected back from the plasma chamber 175 towards one or more RF generators of the system 126 (FIG. 1). As an example, a power magnitude of a complex voltage and current is a determined by the processor of the host system 130 as a product of a current magnitude of the complex voltage and current and a voltage magnitude of the complex voltage and current. Moreover, each of a coefficient and a constant used to determine a wafer bias is a positive or a negative number. As another example of determination of the wafer bias, when the x MHz RF generator is on and the y and z MHz RF generators are off, the wafer bias at a model node is represented as $ax*Vx+bx*Ix+cx*sqrt(Px)+dx$, where "ax" is the first coefficient, "bx" is the second coefficient, "dx" is the constant, "Vx" is a voltage magnitude of a complex voltage and current at the model node "Ix" is a current magnitude of the complex voltage and current at the model node, and "Px" is a power magnitude of the complex voltage and current at the model node. It should be noted that "sqrt" is a square root operation, which is performed by the processor of the host system 130. In some embodiments, the power magnitude Px is a product of the current magnitude Ix and the voltage magnitude Vx.

In various embodiments, a coefficient used to determine a wafer bias is determined by the processor of the host system 130 (FIG. 1) based on a projection method. In the projection method, a wafer bias sensor, e.g., a wafer bias pin, etc., measures wafer bias on a surface, e.g., the upper surface 183 (FIG. 1), etc., of the ESC 177 for a first time. Moreover, in the projection method, a voltage magnitude, a current magnitude, and a power magnitude are determined at a model node within the plasma system 126 based on complex voltage and current measured at an output of an RF generator. For example, the complex voltage and current measured at the node N3 (FIG. 1) for the first time is propagated by the processor of the host system 130 to a model node, e.g., the model node N4m, the model node N1m, the model node N2m, or the model node N6m (FIG. 1), etc., to determine complex voltage and current at the model node for the first time. Voltage magnitude and current magnitude are extracted by the processor of the host system 130 from the complex voltage and current at the model node for the first time. Also, power magnitude is calculated by the processor of the host system 130 as a product of the current magnitude and the voltage magnitude for the first time.

Similarly, in the example, complex voltage and current is measured at the node N3 for one or more additional times and the measured complex voltage and current is propagated to determine complex voltage and current at the model node, e.g., the model node N4m, the model node N1m, the model node N2m, the model node N6m, etc., for the one or more additional times. Also, for the one or more additional times, voltage magnitude, current magnitude, and power magnitude are extracted from the complex voltage and current determined for the one or more additional times. A mathematical function, e.g., partial least squares, linear regression, etc., is applied by the processor of the host system 130 to the voltage magnitude, the current magnitude, the power magnitude, and the measured wafer bias obtained for the first time and for the one or more additional times to determine the coefficients ax, bx, cx and the constant dx.

As another example of the operation 342, when the y MHz RF generator is on and the x and z MHz RF generators are off, a wafer bias is determined as ay*Vy+by*Iy+cy*sqrt (Py)+dy, where "ay" is a coefficient, "by" is a coefficient, "dy" is a constant, "Vy" is a voltage magnitude of the second complex voltage and current, "Iy" is a current magnitude of the second complex voltage and current, and "Px" is a power magnitude of the second complex voltage and current. The power magnitude Py is a product of the current magnitude Iy and the voltage magnitude Vy. As yet another example of the operation 342, when the z MHz RF generator is on and the x and y MHz RF generators are off, a wafer bias is determined as az*Vz+bz*Iz+cz*sqrt (Pz)+dz, where "az" is a coefficient, "bz" is a coefficient, "dz" is a constant, "Vz" is a voltage magnitude of the second complex voltage and current, "Iz" is a current magnitude of the second complex voltage and current, and "Pz" is a power magnitude of the second complex voltage and current. The power magnitude Pz is a product of the current magnitude Iz and the voltage magnitude Vz.

As another example of the operation 342, when the x and y MHz RF generators are on and the z MHz RF generator is off, the wafer bias is determined as a sum of a first product, a second product, a third product, a fourth product, a fifth product, a sixth product, and a constant. The first product is a product of a first coefficient and the voltage magnitude Vx, the second product is a product of a second coefficient and the current magnitude Ix, the third product is a product of a third coefficient and a square root of the power magnitude Px, the fourth product is a product of a fourth coefficient and the voltage magnitude Vy, the fifth product is a product of a fifth coefficient and the current magnitude Iy, and the sixth product is a product of a sixth coefficient and a square root of the power magnitude Py. When the x and y MHz RF generators are on and the z MHz RF generator is off, the wafer bias is represented as axy*Vx+bxy*Ix+cxy*sqrt (Px)+ dxy*Vy+exy*Iy+fxy*sqrt (Py)+gxy, where "axy", "bxy", "cxy", "dxy", "exy", "fxy", "dxy", "exy", and "fxy" are coefficients, and "gxy" is a constant.

As another example of the operation 342, when the y and z MHz RF generators are on and the x MHz RF generator is off, a wafer bias is determined as ayz*Vy+byz*Iy+cyz*sqrt (Py)+dyz*Vz+eyz*Iz+fyz*sqrt (Pz)+gyz, where "ayz", "byz", "cyz", "dyz", "eyz", and "fyz" are coefficients, and "gyz" is a constant. As yet another example of the operation 342, when the x and z MHz RF generators are on and the y MHz RF generator is off, a wafer bias is determined as axz*Vx+bxz*Ix+cxz*sqrt (Px)+dxz*Vz+exz*Iz+fxz*sqrt (Pz)+gxz, where "axz", "bxz", "cxz", "dxz", "exz", and "fxz" are coefficients, and gxz is a constant.

As another example of the operation 342, when the x, y, and z MHz RF generators are on, the wafer bias is determined as a sum of a first product, a second product, a third product, a fourth product, a fifth product, a sixth product, a seventh product, an eighth product, a ninth product, and a constant. The first product is a product of a first coefficient and the voltage magnitude Vx, the second product is a product of a second coefficient and the current magnitude Ix, the third product is a product of a third coefficient and a square root of the power magnitude Px, the fourth product is a product of a fourth coefficient and the voltage magnitude Vy, the fifth product is a product of a fifth coefficient and the current magnitude Iy, the sixth product is a product of a sixth coefficient and a square root of the power magnitude Py, the seventh product is a product of a seventh coefficient and the voltage magnitude Vz, the eighth product is a product of an eighth coefficient and the current magnitude Iz, and the ninth product is a product of a ninth coefficient and a square root of a power magnitude Pz. When the x, y, and z MHz RF generators are on, the wafer bias is represented as axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz, where "axyz", "bxyz", "cxyz", "dxyz", "exyz", "fxyz", "gxyz", "hxyz", and "ixyz" are coefficients, and "jxyz" is a constant.

As another example of determination of wafer bias at the output of the one or more models, wafer bias at the model node N1m is determined by the processor of the host system 130 based on voltage and current magnitudes determined at the model node N1m. To further illustrate, the second complex voltage and current is propagated along the portion 173 (FIG. 1) to determine complex voltage and current at the model node N1m. The complex voltage and current is determined at the model node N1m from the second complex voltage and current in a manner similar to that of determining the second complex voltage and current from the first complex voltage and current. For example, the second complex voltage and current is propagated along the portion 173 based on characteristics of elements of the portion 173 to determine a complex voltage and current at the model node N1m.

Based on the complex voltage and current determined at the model node N1m, wafer bias is determined at the model node N1m by the processor of the host system 130. For example, wafer bias is determined at the model node N1m from the complex voltage and current at the model node N1m in a manner similar to that of determining the wafer bias at the model node N4m from the second complex voltage and current. To illustrate, when the x MHz RF generator is on and the y MHz and z MHz RF generators are off, the processor of the host system 130 (FIG. 1) determines wafer bias at the model node N1m as a sum of a first product, a second product, a third product, and a constant. In this example, the first product is a product of a first coefficient and the voltage magnitude of the complex voltage and current at the model node N1m, the second product is a product of a second coefficient and the current magnitude of the complex voltage and current at the model node N1m, and the third product is a product of a square root of a third coefficient and a square root of a power magnitude of the complex voltage and current at the model node N1m. When the x MHz RF generator is on and the y and z MHz RF generators are off, the wafer bias at the model node N1m is represented as ax*Vx+bx*Ix+cx*sqrt (Px)+dx, where ax is the first coefficient, bx is the second coefficient, cx is the third coefficient, dx is the constant, Vx is the voltage magnitude at the model node N1m, Ix is the current magnitude at the model node N1m, and Px is the power magnitude at the model node N1m.

Similarly, based on the complex voltage and current at the model node N1m and based on which of the x, y, and z MHz RF generators are on, the wafer bias ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined.

As yet another example of determination of wafer bias at the output of the one or more models, wafer bias at the model node N2m is determined by the processor of the host system 130 based on voltage and current magnitudes determined at the model node N2m in a manner similar to that of determining wafer bias at the model node N1m based on voltage and current magnitudes determined at the model node N1m. To further illustrate, wafer bias ax*Vx+bx*Ix+cx*sqrt (Px)+dx, ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined at the model node N2m.

As another example of determination of wafer bias at the output of the one or more models, wafer bias at the model node N6m is determined by the processor of the host system 130 based on voltage and current magnitudes determined at the model node N6m in a manner similar to that of determining wafer bias at the model node N2m based on voltage and current magnitudes determined at the model node N2m. To further illustrate, wafer bias ax*Vx+bx*Ix+cx*sqrt (Px)+dx, ay*Vy+by*Iy+cy*sqrt (Py)+dy, az*Vz+bz*Iz+cz*sqrt (Pz)+dz, axy*Vx+bxy*Ix+cxy*sqrt (Px)+dxy*Vy+exy*Iy+fxy*sqrt (Py)+gxy, axz*Vx+bxz*Ix+cxz*sqrt (Px)+dxz*Vz+exz*Iz+fxz*sqrt (Pz)+gxz, ayz*Vy+byz*Iy+cyz*sqrt (Py)+dyz*Vz+eyz*Iz+fyz*sqrt (Pz)+gyz, and axyz*Vx+bxyz*Ix+cxyz*sqrt (Px)+dxyz*Vy+exyz*Iy+fxyz*sqrt (Py)+gxyz*Vz+hxyz*Iz+ixyz*sqrt (Pz)+jxyz are determined at the model node N6m.

It should be noted that in some embodiments, wafer bias is stored within the storage HU 162 (FIG. 1).

Figure 14:
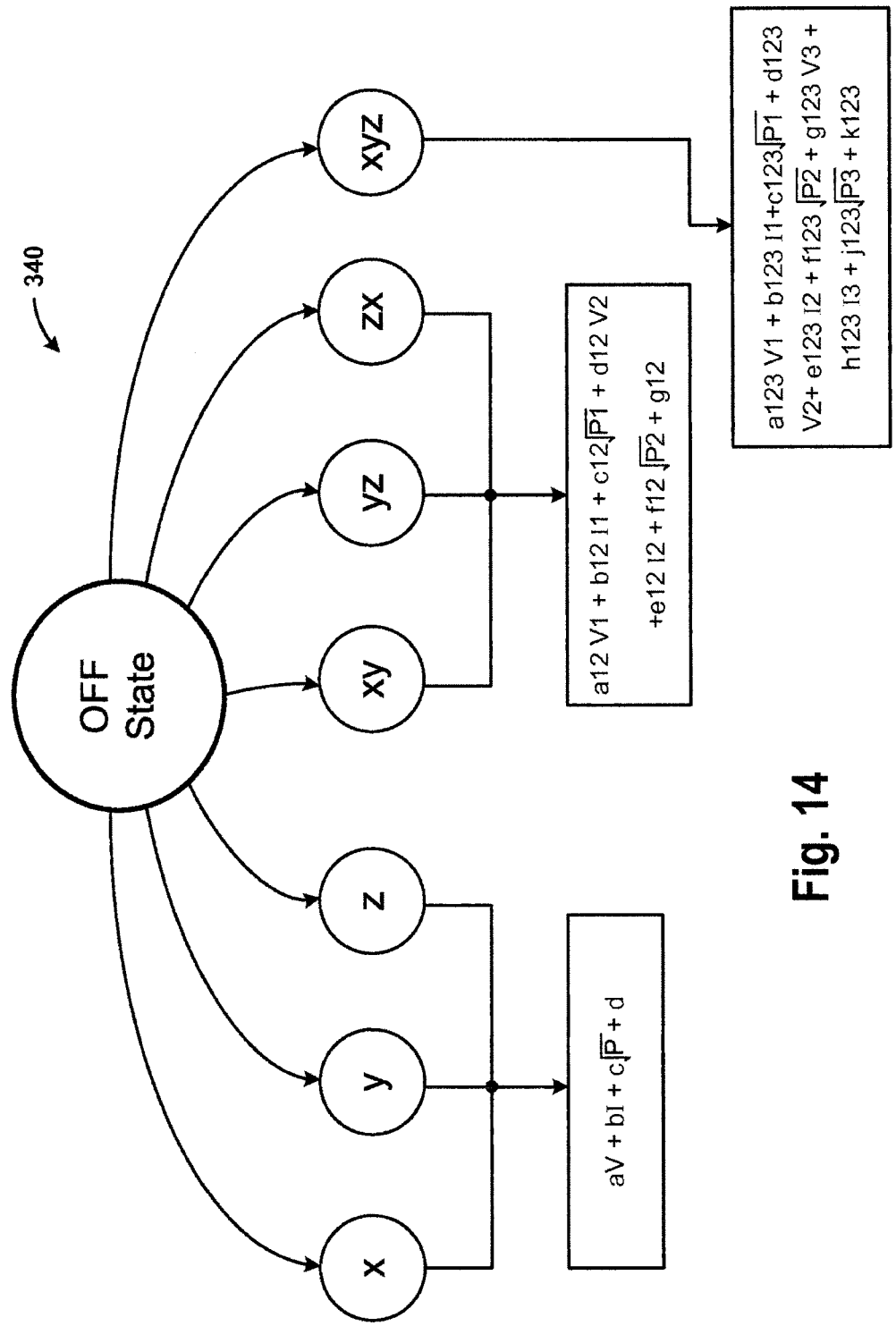
FIG. 14 is a state diagram illustrating a wafer bias generator used to generate a wafer bias, in accordance with an embodiment described in the present disclosure.

FIG. 14 is a state diagram illustrating an embodiment of a wafer bias generator 340, which is implemented within the host system 130 (FIG. 1). When all of the x, y, and z MHz RF generators are off, wafer bias is zero or minimal at a model node, e.g., the model node N4m, N1m, N2m, N6m (FIG. 1), etc. When the x, y, or z MHz RF generator is on and the remaining of the x, y, and z MHz RF generators are off, the wafer bias generator 340 determines a wafer bias at a model node, e.g., the model node N4m, N1m, N2m, N6m, etc., as a sum of a first product a*V, a second product b*I, a third product c*sqrt(P), and a constant d, where V is a voltage magnitude of a complex voltage and current at the model node, I is a current magnitude of the complex voltage and current, P is a power magnitude of the complex voltage and current, a is a coefficient, b is a coefficient, c is a coefficient, and d is a constant. In various embodiments, a power magnitude at a model node is a product of a current magnitude at the model node and a voltage magnitude at the model node. In some embodiments, the power magnitude is a magnitude of delivered power.

When two of the x, y, and z MHz RF generators are on and the remaining of the x, y, and z MHz RF generators are off, the wafer bias generator 340 determines a wafer bias at a model node, e.g., the model node N4m, N1m, N2m, N6m, etc., as a sum of a first product a12*V1, a second product b12*I1, a third product c12*sqrt(P1), a fourth product d12*V2, a fifth product e12*I2, a sixth product f12*sqrt (P2), and a constant g12, where "V1" is a voltage magnitude of a complex voltage and current at the model node determined by propagating a voltage measured at an output of a first one of the RF generators that is on, "I1" is a current magnitude of the complex voltage and current determined by propagating a current measured at the output of the first RF generator that is on, "P1" is a power magnitude of the complex voltage and current determined as a product of V1 and I1, "V2" is a voltage magnitude of the complex voltage and current at the model node determined by propagating a voltage measured at an output of a second one of the RF generators that is on, I2" is a current magnitude of the complex voltage and current determined by propagating the current measured at an output of the second RF generator that is on, "P2" is a power magnitude determined as a product of V2 and I2, each of "a12", "b12", "c12", "d12", "e12" and "f12" is a coefficient, and "g12" is a constant.

When all of the x, y, and z MHz RF generators are on, the wafer bias generator 340 determines a wafer bias at a model node, e.g., the model node N4m, N1m, N2m, N6m, etc., as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where "V1" is a voltage magnitude of a complex voltage and current at the model node determined by propagating a voltage measured at an output of a first one of the RF generators, "I1" is a current magnitude of the complex voltage and current determined by propagating a current measured at the output of the first RF generator, "P1" is a power magnitude of the complex voltage and current determined as a product of V1 and I1, "V2" is a voltage magnitude of the complex voltage and current at the model node determined by propagating a voltage measured at an output of a second one of the RF generators, I2" is a current magnitude of the complex voltage and current determined by propagating a current measured at the output of the second RF generator, "P2" is a power magnitude of the complex voltage and current determined as a product of V2 and I2, "V3" is a voltage magnitude of the complex voltage and current at the model node determined by propagating a voltage measured at an output of a third one of the RF generators, I3" is a current magnitude of the complex voltage and current determined by propagating a current at the output of the third RF generator, "P3" is a power magnitude of the complex voltage and current determined as a product of V3 and I3, each of "a123", "b123", "c123", "d123", "e123", "f123", "g123", "h123", and "i123" is a coefficient, and "j123" is a constant.

Figure 15:
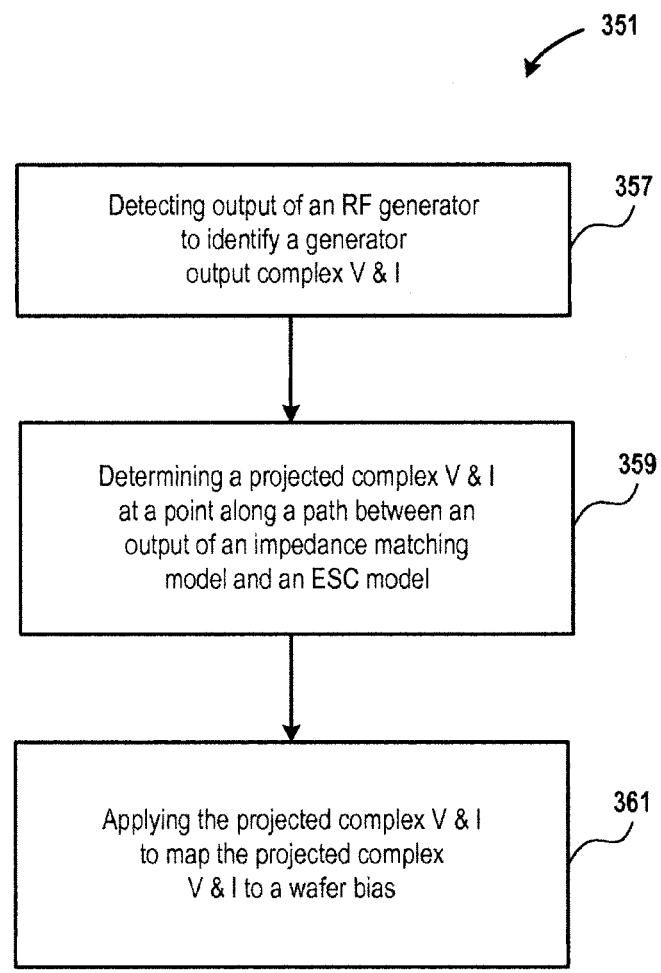
FIG. 15 is a flowchart of a method for determining a wafer bias at a point along a path between the impedance matching model and the ESC model, in accordance with an embodiment described in the present disclosure.
Figure 16:
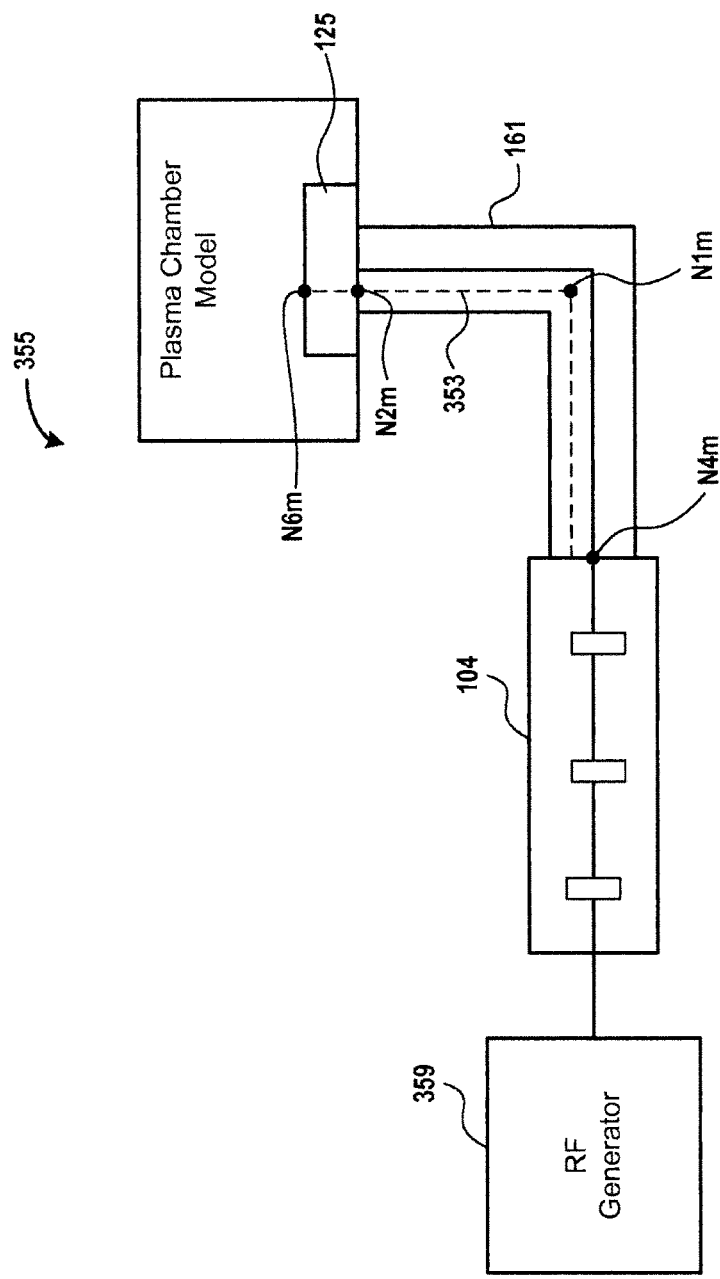
FIG. 16 is a block diagram of a system for determining a wafer bias at a node of a model, in accordance with an embodiment described in the present disclosure.

FIG. 15 is a flowchart of an embodiment of the method 351 for determining a wafer bias at a point along a path 353 (FIG. 16) between the model node N4m (FIG. 16) and the ESC model 125 (FIG. 16). FIG. 15 is described with reference to FIG. 16, which is a block diagram of an embodiment of a system 355 for determining a wafer bias at an output of a model.

In an operation 357, output of the x, y, or z MHz RF generator is detected to identify a generator output complex voltage and current. For example, the voltage and current probe 110 (FIG. 1) measures complex voltage and current at the node N3 (FIG. 1). In this example, the complex voltage and current is received from the voltage and current probe 110 via the communication device 185 (FIG. 1) by the host system 130 (FIG. 1) for storage within the storage HU 162

(FIG. 1). Also, in the example, the processor of the host system 130 identifies the complex voltage and current from the storage HU 162.

In an operation 359, the processor of the host system 130 uses the generator output complex voltage and current to determine a projected complex voltage and current at a point along the path 353 between the model node N4m and the model node N6m. The path 161 extends from the model node N4m to the model node N6m. For example, the fifth complex voltage and current is determined from the complex voltage and current measured at the output of the x MHz RF generator, the y MHz RF generator, or the z MHz RF generator. As another example, the complex voltage and current measured at the node N3 or the node N5 is propagated via the impedance matching model 104 to determine a complex voltage and current at the model node N4m (FIG. 1). In the example, the complex voltage and current at the model node N4m is propagated via one or more elements of the RF transmission model 161 (FIG. 16) and/or via one or more elements of the ESC model 125 (FIG. 16) to determine complex voltage and current at a point on the path 353.

In an operation 361, the processor of the host system 130 applies the projected complex voltage and current determined at the point on the path 353 as an input to a function to map the projected complex voltage and current to a wafer bias value at the node N6m of the ESC model 125 (FIG. 15). For example, when the x, y, or z MHz RF generator is on, a wafer bias at the model node N6m is determined as a sum of a first product a*V, a second product b*I, a third product c*sqrt(P), and a constant d, where, V is a voltage magnitude of the projected complex voltage and current at the model node N6m, I is a current magnitude of the projected complex voltage and current at the model node N6m, P is a power magnitude of the projected complex voltage and current at the model node N6m, a, b, and c are coefficients, and d is a constant.

As another example, when two of the x, y, and z MHz RF generators are on and the remaining of the x, y, and z MHz RF generators are off, a wafer bias at the model node N6m is determined as a sum of a first product a12*V1, a second product b12*I1, a third product c12*sqrt(P1), a fourth product d12*V2, a fifth product e12*I2, a sixth product f12*sqrt(P2), and a constant g12, where V1 is a voltage magnitude at the model node N6m as a result of a first one of the two RF generators being on, I1 is a current magnitude at the model node N6m as a result of the first RF generator being on, P1 is a power magnitude at the model node N6m as a result of the first RF generator being on, V2 is a voltage magnitude at the model node N6m as a result of a second one of the two RF generators being on, I2 is a current magnitude at the model node N6m as a result of the second RF generator being on, and P2 is a power magnitude at the model node N6m as a result of the second RF generator being on, a12, b12, c12, d12, e12, and f12 are coefficients, and g12 is a constant.

As yet another example, when all of the x, y, and z MHz RF generators are on, a wafer bias at the model node N6m is determined as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where V1, I1, P1, V2, I2, and P2 are described above in the preceding example, V3 is a voltage magnitude at the model node N6m as a result of a third one of the RF generators being on, I3 is a current magnitude at the model node N6m as a result of the third RF generator being on, and P3 is a power magnitude at the model node N6m as a result of the third RF generator being on, a123, b123, c123, d123, e123, f123, g123, h123, and i123 are coefficients and j123 is a constant.

As another example, a function used to determine a wafer bias is a sum of characterized values and a constant. The characterized values include magnitudes, e.g., the magnitudes V, I, P, V1, I1, P1, V2, I2, P2, V3, I3, P3, etc. The characterized values also include coefficients, e.g., the coefficients, a, b, c, a12, b12, c12, d12, e12, f12, a123, b123, c123, d123, e123, f123, g123, h123, i123, etc. Examples of the constant include the constant d, the constant g12, the constant j123, etc.

It should be noted that the coefficients of the characterized values and the constant of the characterized values incorporate empirical modeling data. For example, wafer bias is measured for multiple times at the ESC 177 (FIG. 1) using a wafer bias sensor. Moreover, in the example, for the number of times the wafer bias is measured, complex voltages and currents at the point along the path 353 (FIG. 16) are determined by propagating the complex voltage and current from one or more of the nodes, e.g., the nodes N3, N5, etc., of one or more of the RF generators, e.g., the x MHz RF generator, the y MHz RF generator, the z MHz RF generator, etc., via one or more of the models, e.g., the impedance matching model 104, the model portion 173, the RF transmission model 161, the ESC model 125 (FIG. 1), to reach to the point on the path 353 (FIG. 16). Moreover, in this example, a statistical method, e.g., partial least squares, regression, etc., is applied by the processor of the host system 130 to the measured wafer bias and to voltage magnitudes, current magnitudes, and power magnitudes extracted from the complex voltages and currents at the point to determine the coefficients of the characterized values and the constant of the characterized values.

In various embodiments, a function used to determine a wafer bias is characterized by a summation of values that represent physical attributes of the path 353. The physical attributes of the path 353 are derived values from test data, e.g., empirical modeling data, etc. Examples of physical attributes of the path 353 include capacitances, inductances, a combination thereof, etc., of elements on the path 353. As described above, the capacitances and/or inductances of elements along the path 353 affect voltages and currents empirically determined using the projection method at the point on the path 353 and in turn, affect the coefficients of the characterized values and the constant of the characterized values.

In some embodiments, a function used to determine a wafer bias is a polynomial.

FIG. 17 is a flowchart of an embodiment of the method 397 for determining a wafer bias at a model node of the system 126 (FIG. 1). FIG. 17 is described with reference to FIGS. 1 and 16. The method 397 is executed by the processor of the host system 130 (FIG. 1). In an operation 365, one or more complex voltages and currents are received by the host system 130 from one or more communication devices of a generator system, which includes one or more of the x MHz RF generator, the y MHz RF generator, and the z MHz RF generator. For example, complex voltage and current measured at the node N3 is received from the communication device 185 (FIG. 1). As another example, complex voltage and current measured at the node N5 is received from the communication device 189 (FIG. 1). As yet another example, complex voltage and current measured at the node N3 and complex voltage and current measured at the node N5 are received. It should be noted that an output of the generator system includes one or more of the nodes N3, N5, and an output node of the z MHz RF generator.

In an operation 367, based on the one or more complex voltages and currents at the output of the generator system, a projected complex voltage and current is determined at a point along, e.g., on, etc., the path 353 (FIG. 16) between the impedance matching model 104 and the ESC model 125 (FIG. 16). For example, the complex voltage and current at the output of the generator system is projected via the impedance matching model 104 (FIG. 16) to determine a complex voltage and current at the model node N4m. As another example, the complex voltage and current at the output of the generator system is projected via the impedance matching model 104 and the portion 173 (FIG. 1) of the RF transmission model 161 to determine a complex voltage and current at the model node N1m (FIG. 1). As yet another example, the complex voltage and current at the output of the generator system is projected via the impedance matching model 104 and the RF transmission model 161 to determine a complex voltage and current at the model node N2m (FIG. 1). As another example, the complex voltage and current at the output of the generator system is projected via the impedance matching model 104, the RF transmission model 161, and the ESC model 125 to determine a complex voltage and current at the model node N6m (FIG. 1).

In an operation 369, a wafer bias is calculated at the point along the path 353 by using the projected complex V&I as an input to a function. For example, when the x, y, or z MHz RF generator is on and the remaining of the x, y, and z MHz RF generators are off, a wafer bias at the point is determined from a function, which is as a sum of a first product a*V, a second product b*I, a third product c*sqrt(P), and a constant d, where, V is a voltage magnitude of the projected complex voltage and current at the point, I is a current magnitude of the projected complex voltage and current at the point, P is a power magnitude of the projected complex voltage and current at the point, a, b, and c are coefficients, and d is a constant.

As another example, when two of the x, y, and z MHz RF generators are on and the remaining of the x, y, and z MHz RF generators are off, a wafer bias at the point is determined as a sum of a first product a12*V1, a second product b12*I1, a third product c12*sqrt(P1), a fourth product d12*V2, a fifth product e12*I2, a sixth product f12*sqrt(P2), and a constant g12, where V1 is a voltage magnitude at the point as a result of a first one of the two RF generators being on, I1 is a current magnitude at the point as a result of the first RF generator being on, P1 is a power magnitude at the point as a result of the first RF generator being on, V2 is a voltage magnitude at the point as a result of a second one of the two RF generators being on, I2 is a current magnitude at the point as a result of the second RF generator being on, and P2 is a power magnitude at the point as a result of the second RF generator being on, a12, b12, c12, d12, e12, and f12 are coefficients, and g12 is a constant.

As yet another example, when all of the x, y, and z MHz RF generators are on, a wafer bias at the point is determined as a sum of a first product a123*V1, a second product b123*I1, a third product c123*sqrt(P1), a fourth product d123*V2, a fifth product e123*I2, a sixth product f123*sqrt(P2), a seventh product g123*V3, an eighth product h123*I3, a ninth product i123*sqrt(P3), and a constant j123, where V1, I1, P1, V2, I2, and P2 are described above in the preceding example, V3 is a voltage magnitude at the point as a result of a third one of the RF generators being on, I3 is a current magnitude at the point as a result of the third RF generator being on, and P3 is a power magnitude at the point as a result of the third RF generator being on, a123, b123, c123, d123, e123, f123, g123, h123, and i123 are coefficients, and j123 is a constant.

Figure 18:
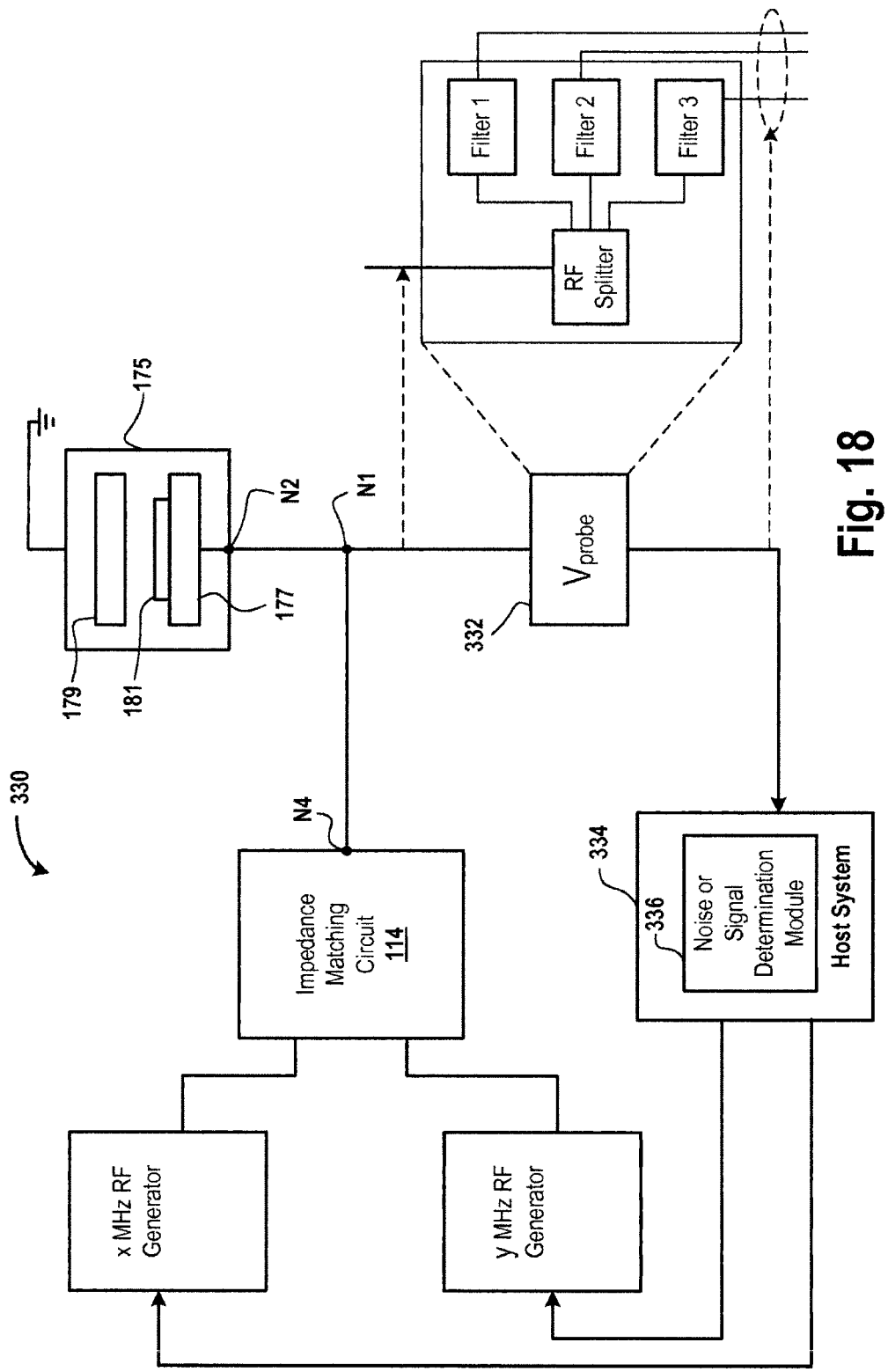
FIG. 18 is a block diagram of a system that is used to illustrate advantages of determining wafer bias by using the method of FIG. 13, FIG. 15, or FIG. 17 instead of by using a voltage probe, in accordance with an embodiment described in the present disclosure.

FIG. 18 is a block diagram of an embodiment of a system 330 that is used to illustrate advantages of determining wafer bias by using the method 340 (FIG. 13), the method 351 (FIG. 15), or the method 397 (FIG. 17) instead of by using a voltage probe 332, e.g., a voltage sensor, etc.

The voltage probe 332 is coupled to the node N1 to determine a voltage at the node N1. In some embodiments, the voltage probe 332 is coupled to another node, e.g., node N2, N4, etc., to determine voltage at the other node. The voltage probe 332 includes multiple circuits, e.g., an RF splitter circuit, a filter circuit 1, a filter circuit 2, a filter circuit 3, etc.

Also, the x and y MHz RF generators are coupled to a host system 334 that includes a noise or signal determination module 336. Examples of a module include a processor, an ASIC, a PLD, a software executed by a processor, or a combination thereof.

The voltage probe 332 measures a voltage magnitude, which is used by the host system 334 to determine a wafer bias. The module 336 determines whether the voltage magnitude measured by the voltage probe 332 is a signal or noise. Upon determining that the voltage magnitude measured by the voltage probe 332 is a signal, the host system 334 determines wafer bias.

The system 126 (FIG. 1) is cost effective compared to the system 330 and saves time and effort compared to the system 330. The system 330 includes the voltage probe 332, which does not need to be included in the system 126. There is no need to couple a voltage probe at the node N4, N1, or N2 of the system 126 to determine wafer bias. In the system 126, wafer bias is determined based on the impedance matching model 104, RF transmission model 161, and/or the ESC model 125 (FIG. 1). Moreover, the system 330 includes the module 336, which also does not need to be included in the system 126. There is no need to spend time and effort to determine whether a complex voltage and current is a signal or noise. No such determination needs to be made by the host system 130 (FIG. 1).

Figure 19A:
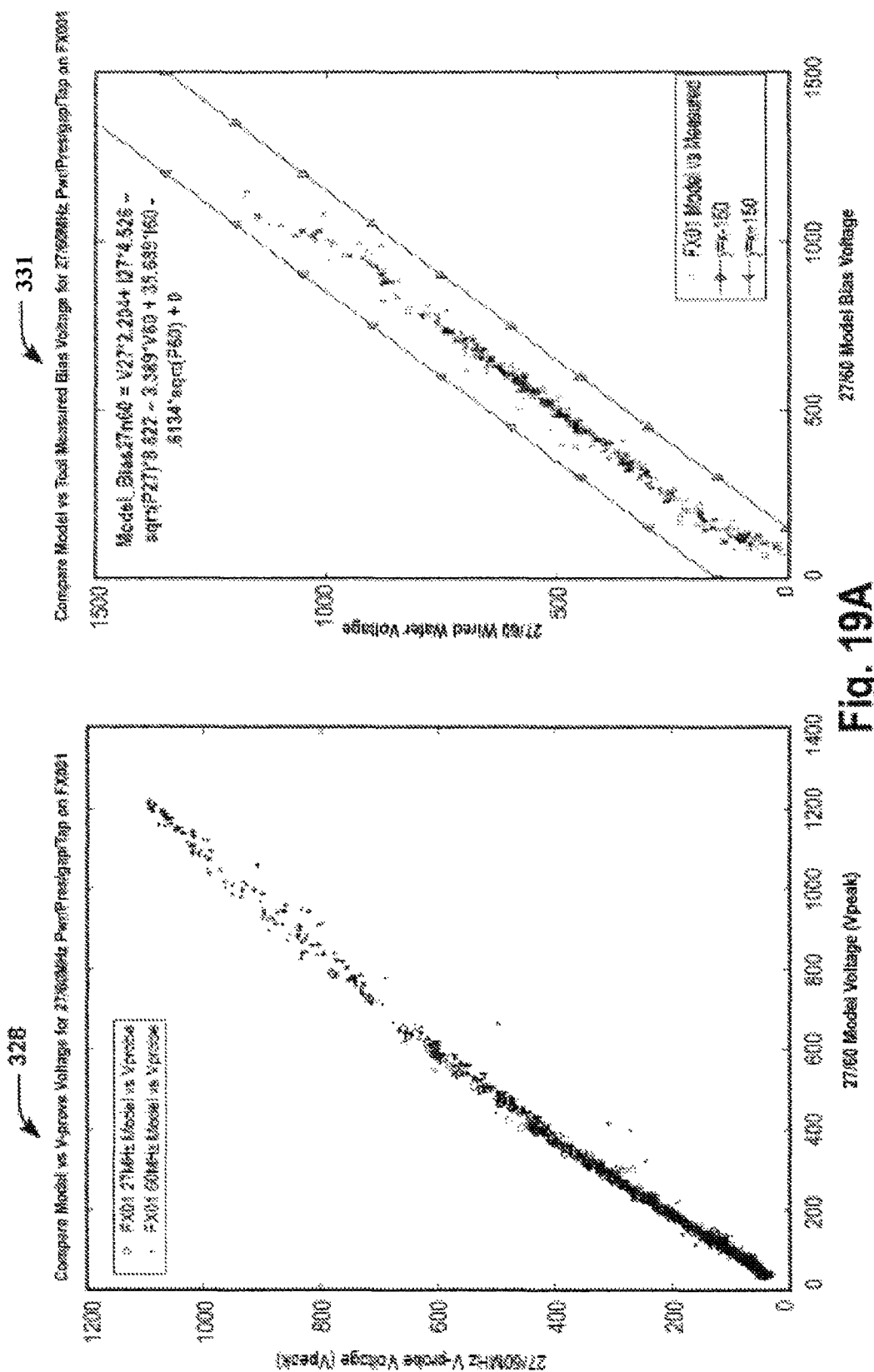
FIG. 19A show embodiments of graphs to illustrate a correlation between variables that are measured at a node of the plasma system of FIG. 1 by using probes and variables at a corresponding model node output determined using the method of FIG. 2, 13, 15, or 17 when the y and z MHz RF generators are on, in accordance with an embodiment described in the present disclosure.
Figure 19B:
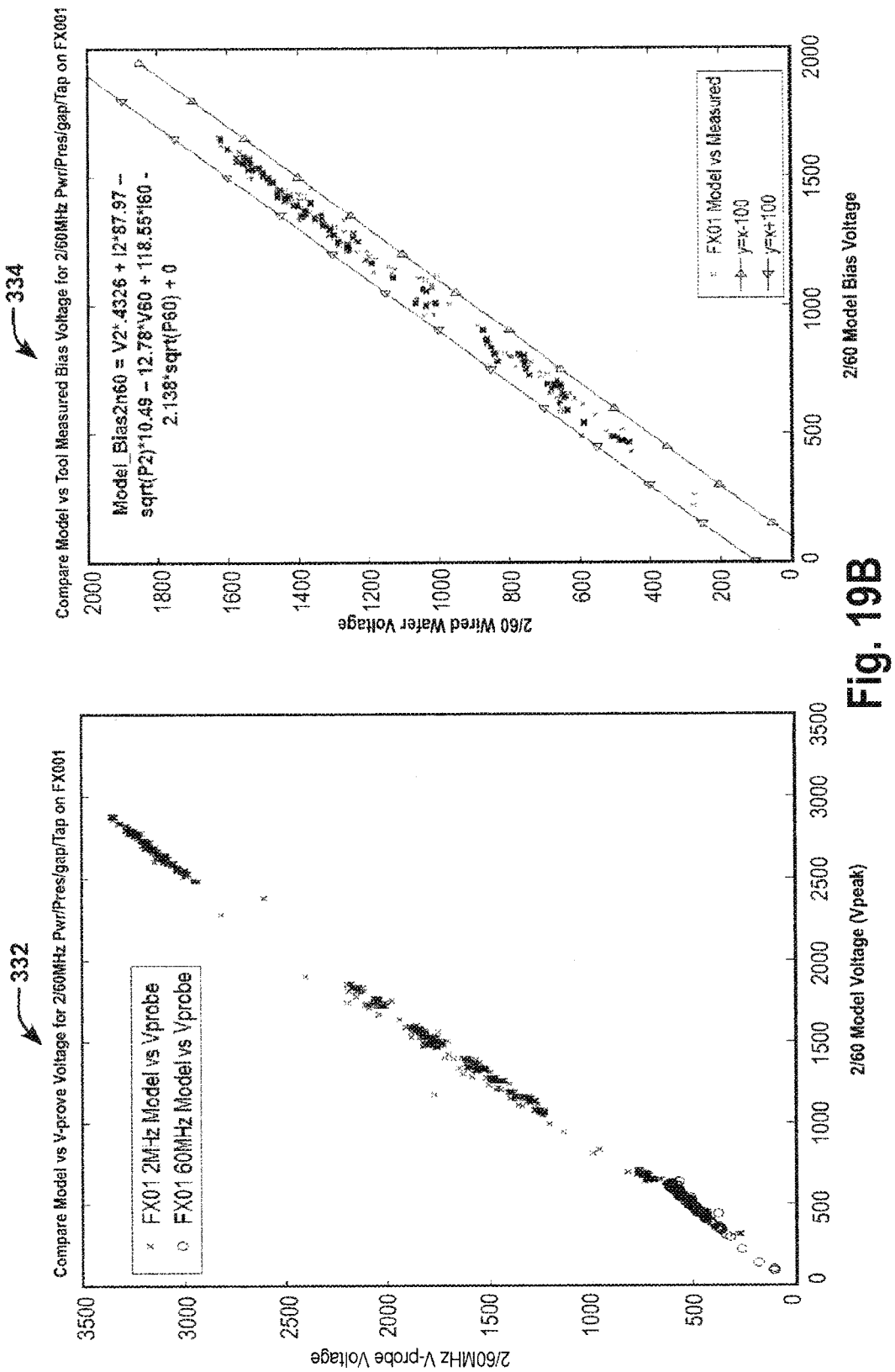
FIG. 19B show embodiments of graphs to illustrate a correlation between variables that are measured at a node of the plasma system of FIG. 1 by using probes and variables at a corresponding model node output determined using the method of FIG. 2, 13, 15, or 17 when the x and z MHz RF generators are on, in accordance with an embodiment described in the present disclosure.
Figure 19C:
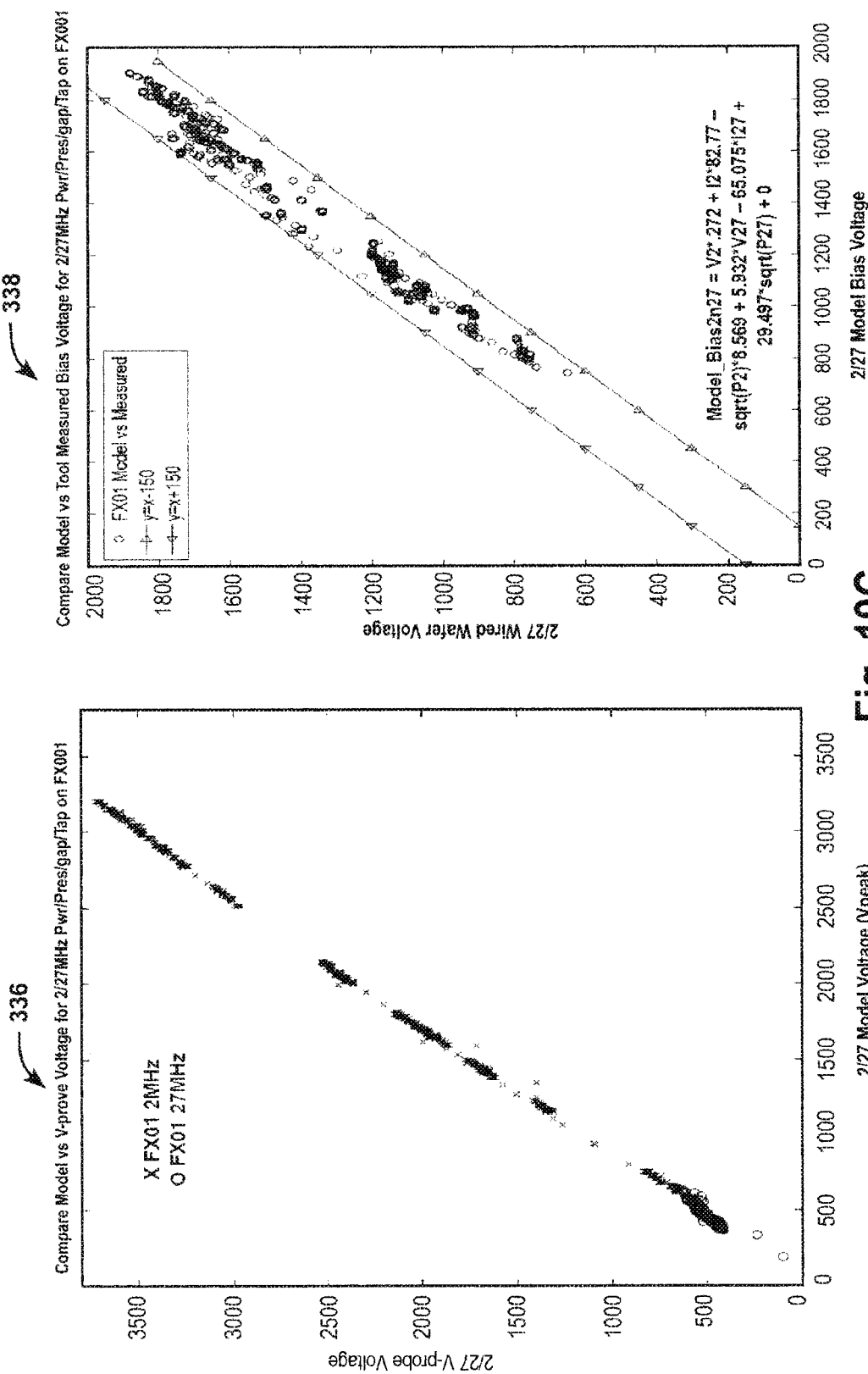
FIG. 19C show embodiments of graphs to illustrate a correlation between variables that are measured at a node of the plasma system of FIG. 1 by using probes and variables at a corresponding model node output determined using the method of FIG. 2, 13, 15, or 17 when the x and y MHz RF generators are on, in accordance with an embodiment described in the present disclosure.

FIGS. 19A, 19B, and 19C show embodiments of graphs 328, 332, and 336 to illustrate a correlation, e.g., a linear correlation, etc., between voltage, e.g., peak voltage, etc., that is measured at the output, e.g., the node N1, of the portion 195 (FIG. 1) by using a voltage probe and a voltage, e.g., peak voltage, etc., at a corresponding model node output, e.g., the node N1m, determined using the method 102 (FIG. 2). In each graph 328, 332, and 336, the measured voltage is plotted on a y-axis and the voltage determined using the method 102 is plotted on an x-axis.

Moreover, FIGS. 19A, 19B, and 19C show embodiments of graphs 331, 334, and 338 to illustrate a correlation, e.g., a linear correlation, etc., between wafer bias that is measured at the output N6 (FIG. 1) by using a wafer bias probe and wafer bias at a corresponding model node output, e.g., the node N6m, determined using the method 340 (FIG. 13), the method 351 (FIG. 15), or the method 397 (FIG. 17). In each graph 331, 334, and 338, the wafer bias determined using the wafer bias probe is plotted on a y-axis and the wafer bias determined using the method 340, the method 351, or the method 397 is plotted on an x-axis.

The voltages and wafer bias are plotted in the graphs 328 and 331 when the y MHz and z MHz RF generators are on and the x MHz RF generator is off. Moreover, the voltages and wafer bias are plotted in the graphs 332 and 334 when the x MHz and z MHz RF generators are on and the y MHz RF generator is off. Also, the voltages are plotted in the graphs 336 and 338 when the x MHz and y MHz RF generators are on and the z MHz RF generator is off.

Figure 20A:
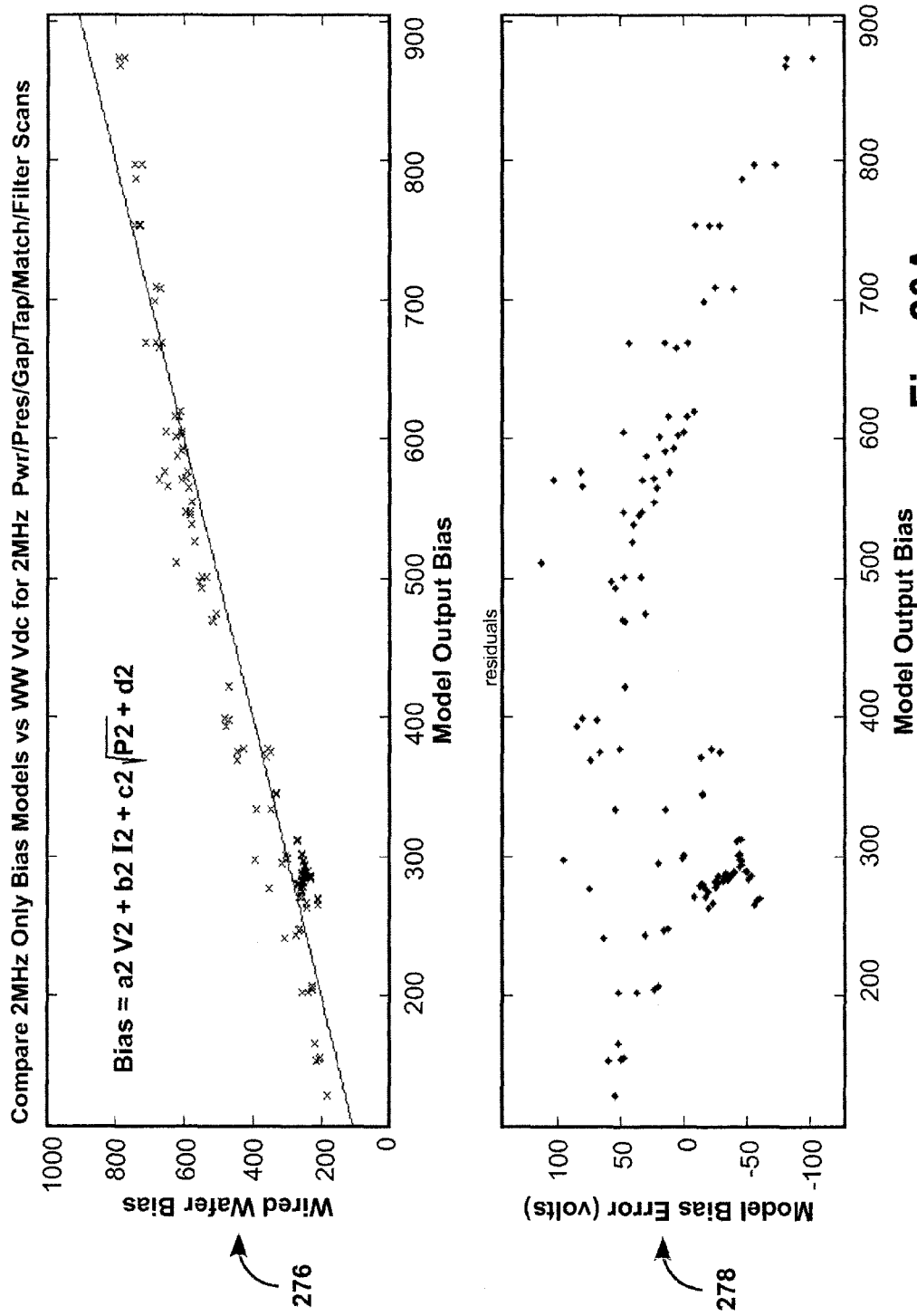
FIG. 20A is a diagram of graphs used to illustrate a correlation between a wired wafer bias measured using a sensor tool, a model wafer bias that is determined using the method of FIG. 13, 15, or 17 and an error in the model bias when the x MHz RF generator is on, in accordance with an embodiment described in the present disclosure.

FIG. 20A is a diagram of an embodiment of graphs 276 and 278 to illustrate that there is a correlation between a wired wafer bias measured using a sensor tool, e.g., a metrology tool, a probe, a sensor, a wafer bias probe, etc., a model wafer bias that is determined using the method 340 (FIG. 13), the method 351 (FIG. 15), or the method 397 (FIG. 17), and an error in the model bias. The wired wafer bias that is plotted in the graph 276 is measured at a point, e.g., a node on the RF transmission line 113, a node on the upper surface 183 (FIG. 1) of the ESC 177, etc. and the model bias that is plotted in the graph 276 is determined at the corresponding model point, e.g., the model node N4m, the model node N1m, the model node N2m, the model node N6m, etc. (FIG. 1), on the path 353 (FIG. 16). The wired wafer bias is plotted along a y-axis in the graph 276 and the model bias is plotted along an x-axis in the graph 276.

The wired wafer bias and the model bias are plotted in the graph 276 when the x MHz RF generator is on, and the y and z MHz RF generators are off. Moreover, the model bias of graph 276 is determined using an equation $a2*V2+b2*I2+c2*sqrt(P2)+d2$, where "*" represents multiplication, "sqrt" represents a square root, "V2" represents voltage at the point along the path 353 (FIG. 16), I2 represents current at the point, P2 represents power at the point, "a2" is a coefficient, "b2" is a coefficient, "c2" is a coefficient, and "d2" is a constant value.

The graph 278 plots an error, which is an error in the model bias at the point, on a y-axis and plots the model bias at the point on an x-axis. The model error is an error, e.g., a variance, a standard deviation, etc., in the model bias. The model error and the model bias are plotted in the graph 278 when the x MHz RF generator is on and the y and z MHz RF generators are off.

Figure 20B:
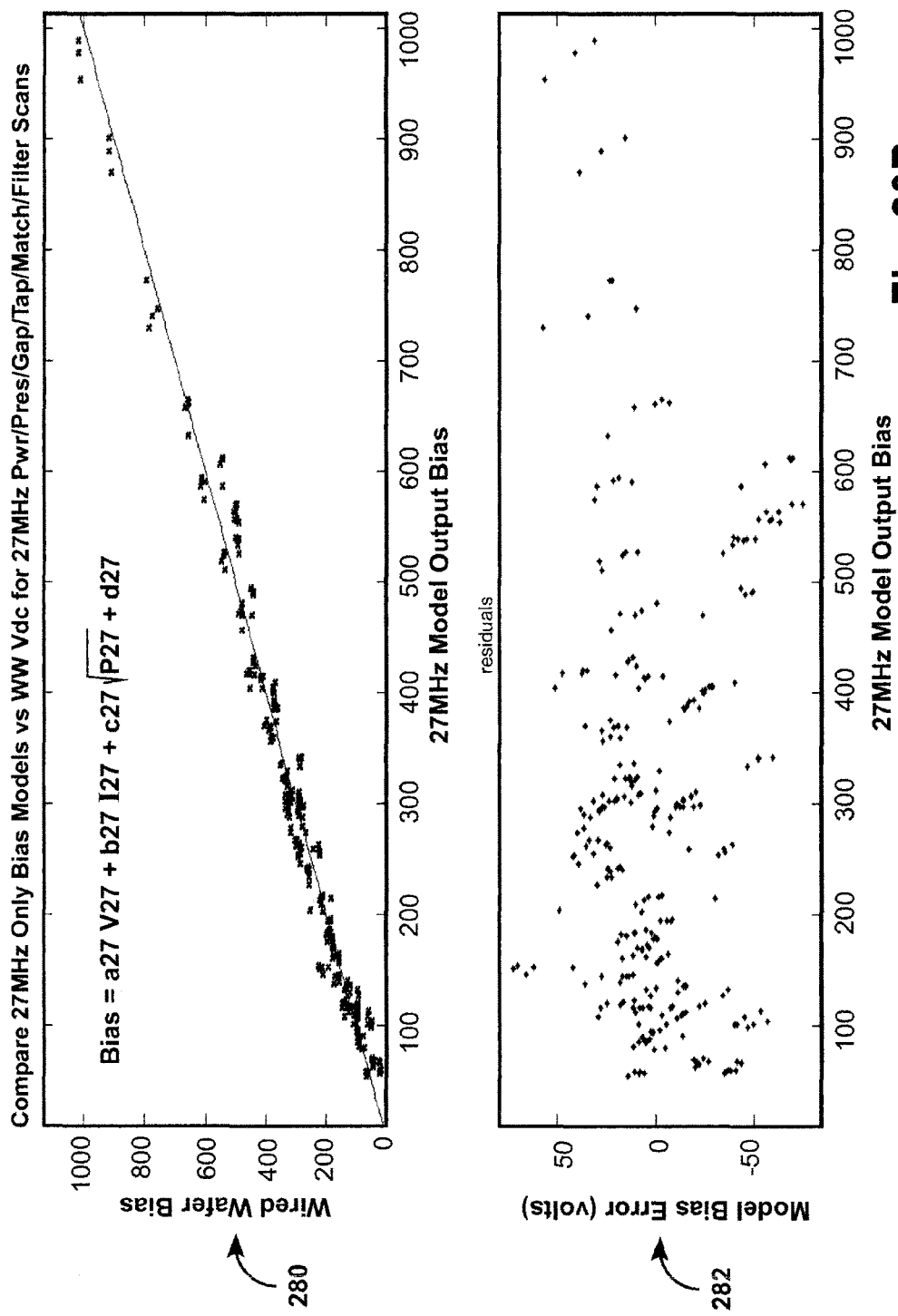
FIG. 20B is a diagram of graphs used to illustrate a correlation between a wired wafer bias measured using a sensor tool, a model bias that is determined using the method of FIG. 13, 15, or 17 and an error in the model bias when the y MHz RF generator is on, in accordance with one embodiment described in the present disclosure.

FIG. 20B is a diagram of an embodiment of graphs 280 and 282 to illustrate that there is a correlation between a wired wafer bias, a model bias that is determined using the method 340 (FIG. 13), the method 351 (FIG. 15) or method 397 (FIG. 17), and an error in the model bias. The graphs 280 and 282 are plotted in a manner similar to the graphs 276 and 278 (FIG. 17A) except that the graphs 280 and 282 are plotted when the y MHz RF generator is on and the x and z MHz RF generators are off. Moreover, the model bias of the graphs 280 and 282 is determined using an equation $a27*V27+b27*I27+c27*sqrt(P27)+d27$, where "V27" represents a voltage magnitude at the point along the path 353 (FIG. 16), "I27" represents a current magnitude at the point, "P27" represents a power magnitude at the point, "a27" is a coefficient, "b27" is a coefficient, "c27" is a coefficient, and "d27" is a constant value.

Figure 20C:
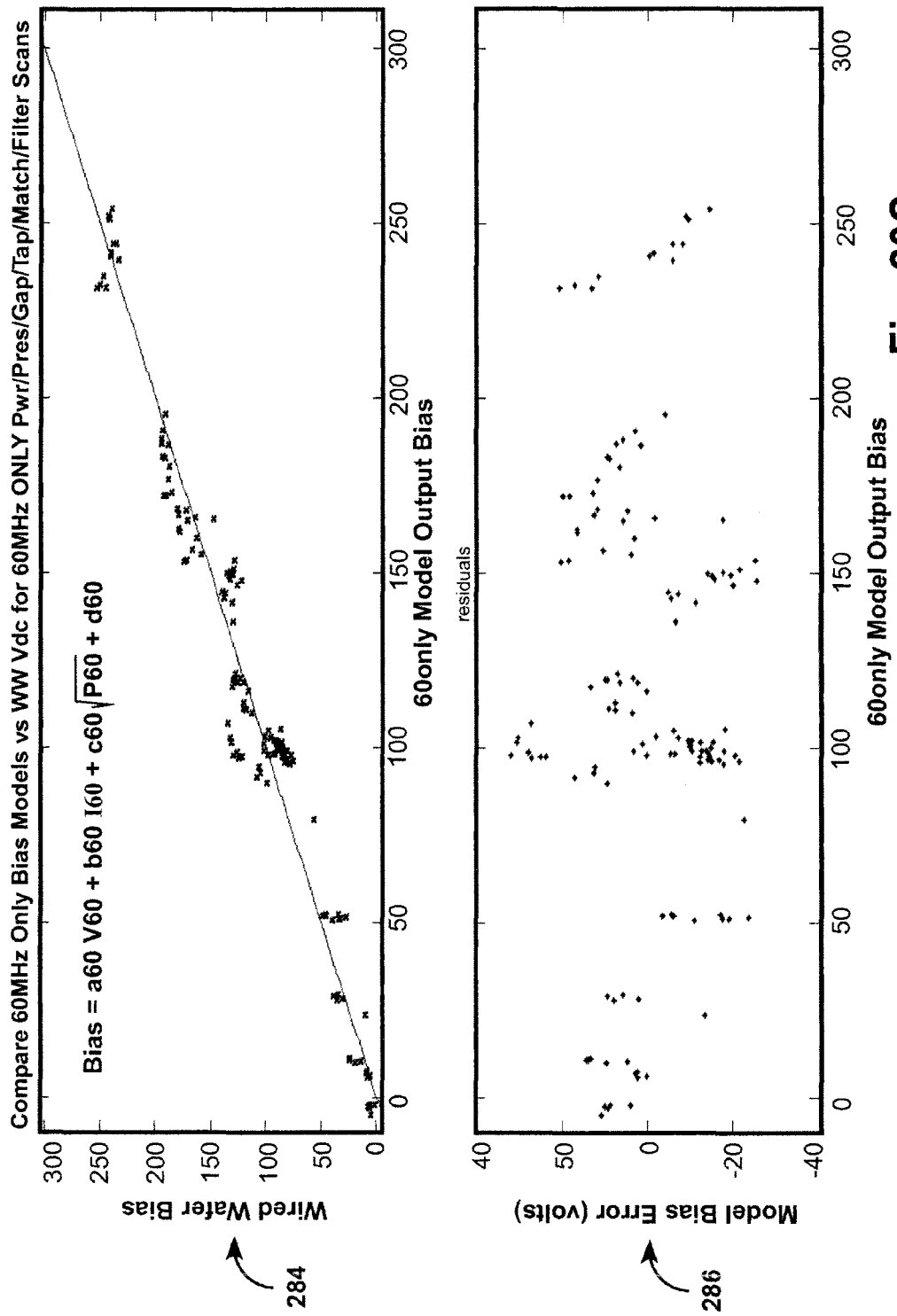
FIG. 20C is a diagram of embodiments of graphs used to illustrate a correlation between a wired wafer bias measured using a sensor tool, a model bias that is determined using the method of FIG. 13, 15, or 17 and an error in the model bias when the z MHz RF generator is on, in accordance with one embodiment described in the present disclosure.

FIG. 20C is a diagram of an embodiment of graphs 284 and 286 to illustrate that there is a correlation between a wired wafer bias, a model bias that is determined using the method 340 (FIG. 13), the method 351 (FIG. 15) or method 397 (FIG. 17), and an error in the model bias. The graphs 284 and 286 are plotted in a manner similar to the graphs 276 and 278 (FIG. 17A) except that the graphs 284 and 286 are plotted when the z MHz RF generator is on and the x and y MHz RF generators are off. Moreover, the model bias of the graphs 284 and 286 is determined using an equation $a60*V60+b60*I60+c60*sqrt(P60)+d60$, where "V60" represents a voltage magnitude at the point along the path 353 (FIG. 16), I60" represents a current magnitude at the point, "P60" represents a power magnitude at the point, "a60" is a coefficient, "b60" is a coefficient, "c60" is a coefficient, and "d60" is a constant value.

Figure 20D:
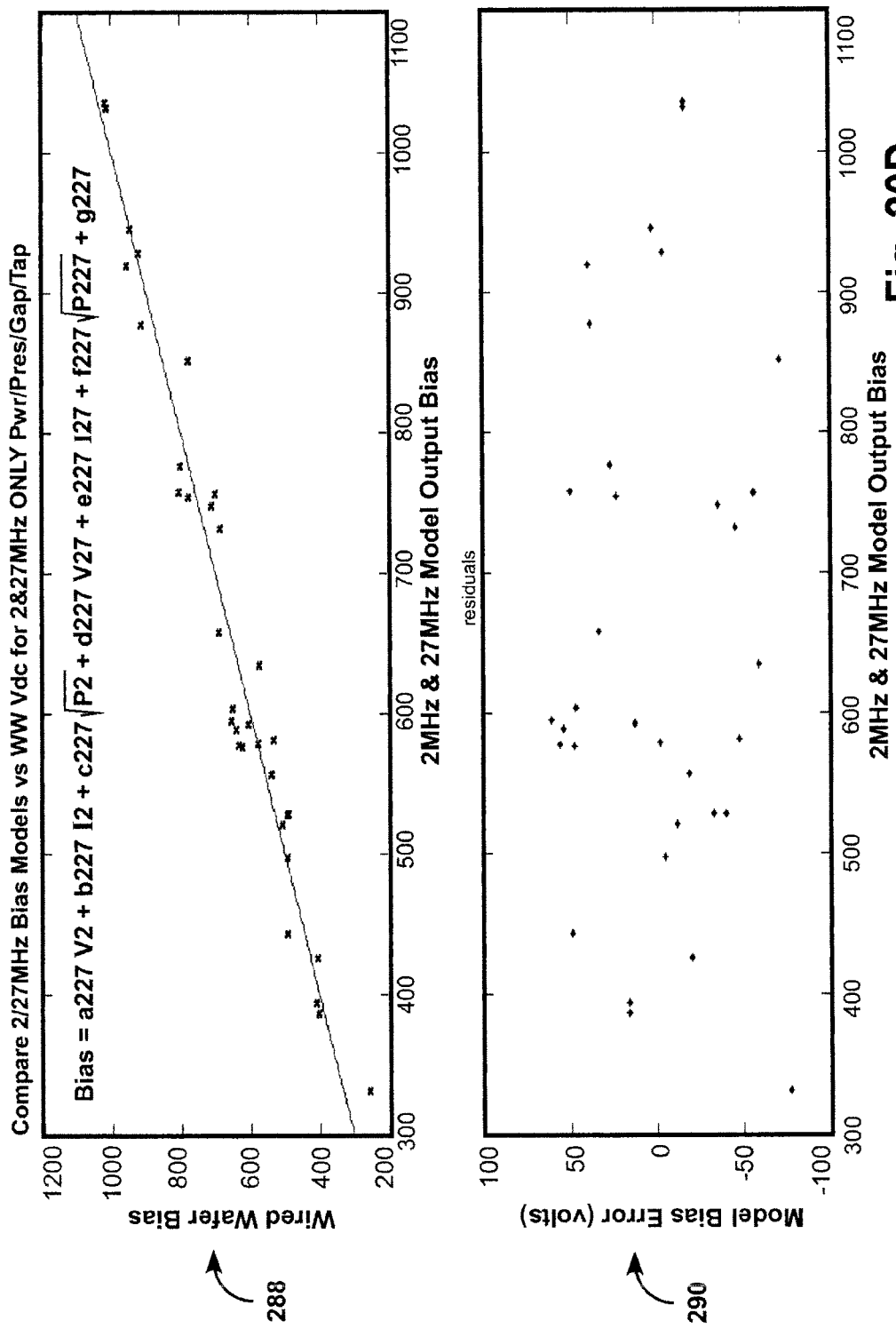
FIG. 20D is a diagram of graphs used to illustrate a correlation between a wired wafer bias measured using a sensor tool, a model bias that is determined using the method of FIG. 13, 15, or 17 and an error in the model bias when the x and y MHz RF generators are on, in accordance with an embodiment described in the present disclosure.

FIG. 20D is a diagram of an embodiment of graphs 288 and 290 to illustrate that there is a correlation between a wired wafer bias, a model bias that is determined using the method 340 (FIG. 13), the method 351 (FIG. 15) or method 397 (FIG. 17), and an error in the model bias. The graphs 288 and 290 are plotted in a manner similar to the graphs 276 and 278 (FIG. 20A) except that the graphs 288 and 290 are plotted when the x and y MHz RF generators are on, and the z MHz RF generator is off. Moreover, the model bias of the graphs 288 and 290 is determined using an equation $a227*V2+b227*I2+c227*sqrt(P2)+d227*V27+e227*I27+f227*sqrt(P27)+g227$, where "a227", "b227" and "c227", "d227", "e227" and "f227" are coefficients, and "g227" is a constant value.

Figure 20E:
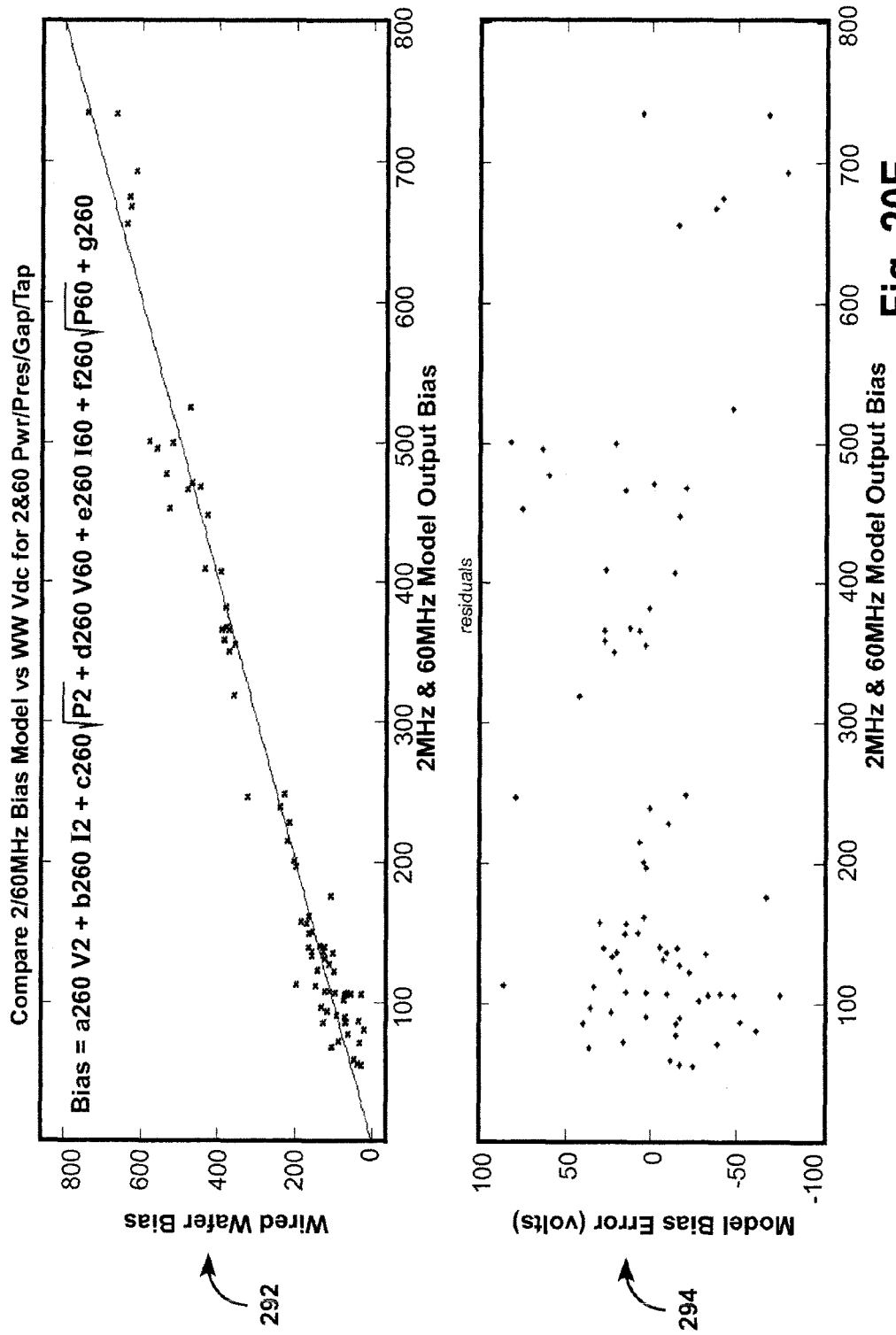
FIG. 20E is a diagram of graphs used to illustrate a correlation between a wired wafer bias measured using a sensor tool, a model bias that is determined using the method of FIG. 13, 15, or 17 and an error in the model bias when the x and z MHz RF generators are on, in accordance with an embodiment described in the present disclosure.

FIG. 20E is a diagram of an embodiment of graphs 292 and 294 to illustrate that there is a correlation between a wired wafer bias, a model bias that is determined using the method 340 (FIG. 13), the method 351 (FIG. 15) or method 397 (FIG. 17), and an error in the model bias. The graphs 292 and 294 are plotted in a manner similar to the graphs 276 and 278 (FIG. 20A) except that the graphs 292 and 294 are plotted when the x and z MHz RF generators are on, and the y MHz RF generator is off. Moreover, the model bias of the graphs 292 and 294 is determined using an equation $a260*V2+b260*I2+c260*sqrt(P2)+d20*V60+e260*I60+f260*sqrt(P60)+g260$, where "a260", "b260" "c260", "d260", "e260" and "f260" are coefficients, and "g260" is a constant value.

Figure 20F:
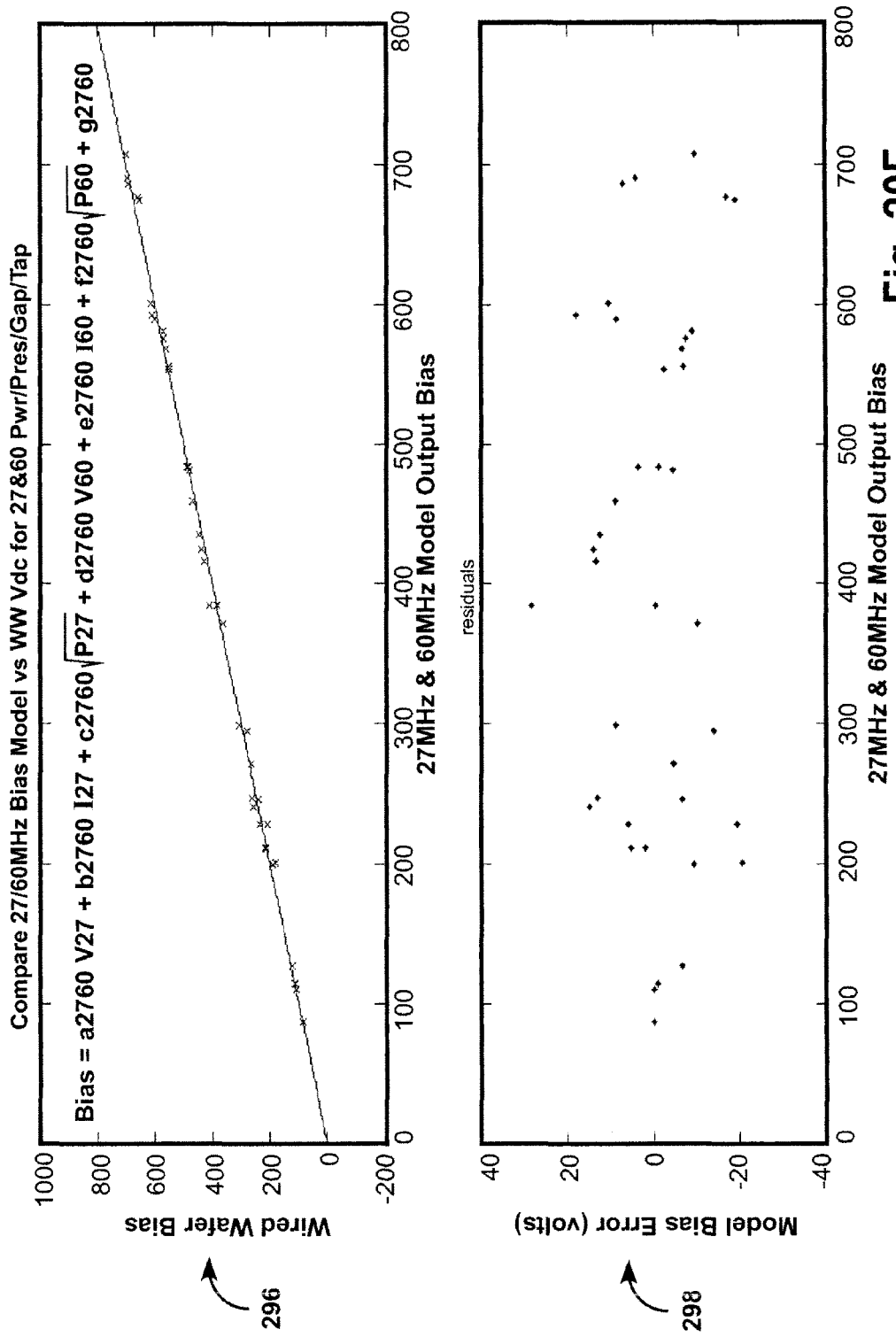
FIG. 20F is a diagram of graphs used to illustrate a correlation between a wired wafer bias measured using a sensor tool, a model bias that is determined using the method of FIG. 13, 15, or 17 and an error in the model bias when the y and z MHz RF generators are on, in accordance with an embodiment described in the present disclosure.

FIG. 20F is a diagram of an embodiment of graphs 296 and 298 to illustrate that there is a correlation between a wired wafer bias, a model bias that is determined using the method 340 (FIG. 13), the method 351 (FIG. 15) or method 397 (FIG. 17), and an error in the model bias. The graphs 296 and 298 are plotted in a manner similar to the graphs 276 and 278 (FIG. 20A) except that the graphs 296 and 298 are plotted when the y and z MHz RF generators are on, and the x MHz RF generator is off. Moreover, the model bias of the graphs 296 and 298 is determined using an equation $a2760*V27+b2760*I27+c2760*sqrt(P27)+d2760*V60+e2760*I60+f2760*sqrt(P60)+g2760$, where "a2760", "b2760" "c2760", "d2760", "e2760" and "f2760" are coefficients, and "g2760" is a constant value.

Figure 20G:
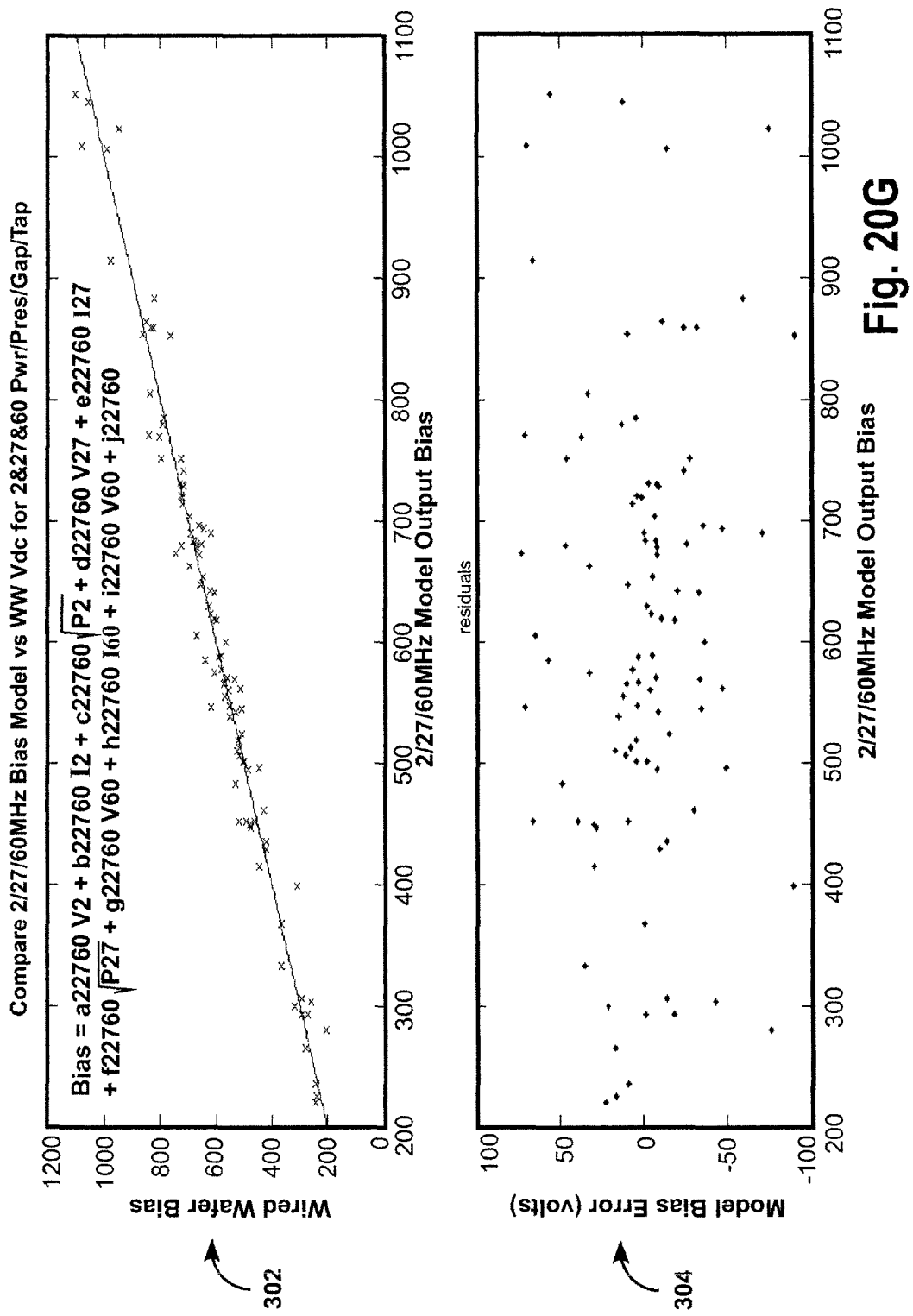
FIG. 20G is a diagram of graphs used to illustrate a correlation between a wired wafer bias measured using a sensor tool, a model bias that is determined using the method of FIG. 13, 15, or 17 and an error in the model bias when the x, y, and z MHz RF generators are on, in accordance with an embodiment described in the present disclosure.

FIG. 20G is a diagram of an embodiment of graphs 302 and 304 to illustrate that there is a correlation between a wired wafer bias, a model bias that is determined using the method 340 (FIG. 13), the method 351 (FIG. 15) or method 397 (FIG. 17), and an error in the model bias. The graphs 302 and 304 are plotted in a manner similar to the graphs 276 and 278 (FIG. 20A) except that the graphs 302 and 304 are plotted when the x, y and z MHz RF generators are on. Moreover, the model bias of the graphs 302 and 304 is determined using an equation $a22760*V2+b22760*I2+c22760*sqrt(P2)+d22760*V60+e22760*I60+f22760*sqrt(P60)+g22760*V27+h22760*I27+i22760*sqrt(P27)+j22760$, where "a22760", "b22760", "c22760", "d22760", "e22760", "f22760" "g22760", "h22760", and "i22760" are coefficients and "j22760" is a constant value.

Figure 21:
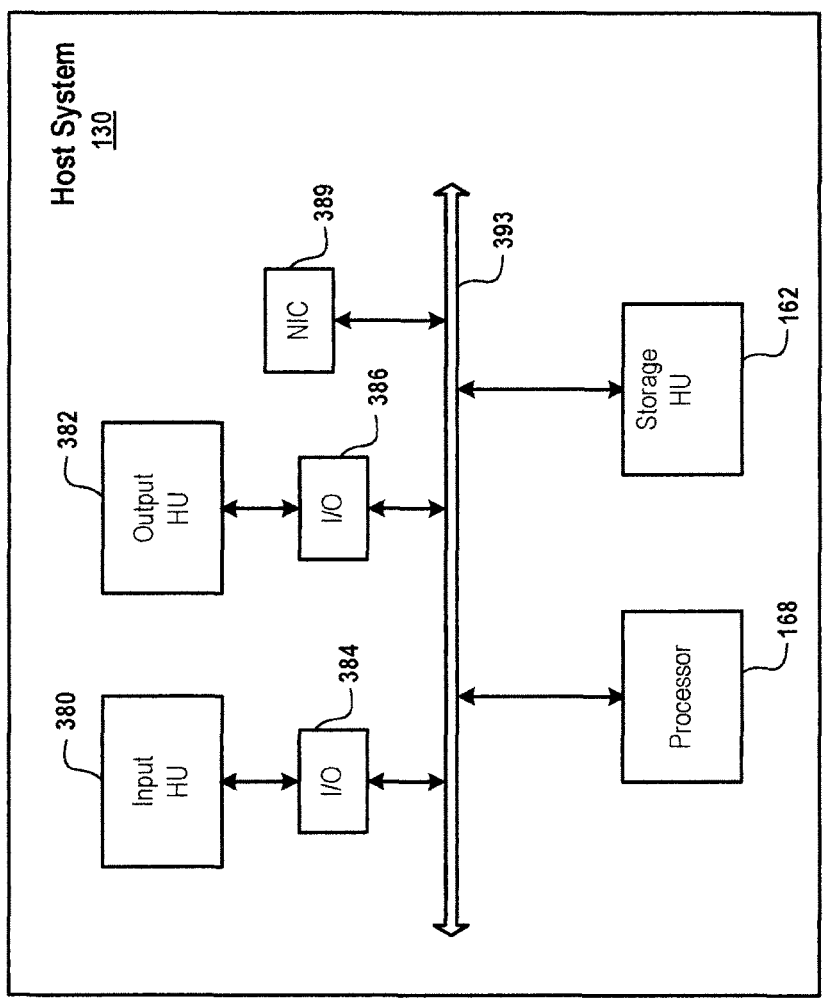
FIG. 21 is a block diagram of a host system of the system of FIG. 1, in accordance with an embodiment described in the present disclosure.

FIG. 21 is a block diagram of an embodiment of the host system 130. The host system 130 includes a processor 168, the storage HU 162, an input HU 380, an output HU 382, an input/output (I/O) interface 384, an I/O interface 386, a network interface controller (NIC) 389, and a bus 390. The processor 168, the storage HU 162, the input HU 380, the output HU 382, the I/O interface 384, the I/O interface 386, and the NIC 389 are coupled with each other via a bus 393. Examples of the input HU 380 include a mouse, a keyboard, a stylus, etc. Examples of the output HU 382 include a display, a speaker, or a combination thereof. Examples of a display include a liquid crystal display, a light emitting diode display, a cathode ray tube, a plasma display, etc. Examples of the NIC 388 include a network interface card, a network adapter, etc.

Examples of an I/O interface include an interface that provides compatibility between pieces of hardware coupled to the interface. For example, the I/O interface 384 converts a signal received from the input HU 380 into a form, amplitude, and/or speed compatible with the bus 393. As another example, the I/O interface 386 converts a signal received from the bus 393 into a form, amplitude, and/or speed compatible with the output HU 382.

It should be noted that in some embodiments, wafer bias is used to determine a clamping voltage that is used to clamp the work piece 131 (FIG. 1) to the ESC 177 (FIG. 1). For example, when wafer bias is absent from the plasma chamber 175 (FIG. 1), two electrodes within the ESC 177 have matching voltages with opposite polarities to clamp the work piece 131 to the ESC 177. In the example, when the wafer bias is present within the plasma chamber 175, voltages supplied to the two electrodes are different in magnitude to compensate for the presence of the wafer bias. In various embodiments, wafer bias is used to compensate for bias at the ESC 177 (FIG. 1).

It is also noted that the use of three parameters, e.g., current magnitude, voltage magnitude, and phase between the current and voltage, etc., to determine wafer bias compared to use of voltage to compensate for bias at the ESC 177 allows better determination of wafer bias. For example, wafer bias calculated using the three parameters has a stronger correlation to non-linear plasma regimes compared to a relation between RF voltage and the non-linear plasma regimes. As another example, wafer bias calculated using the three parameters is more accurate than that determined using a voltage probe.

In various embodiments, a determination of ion energy is performed by the processor 168 of the host system 130. For example, the ion energy is calculated as a sum of a coefficient "C1" multiplied by a wafer bias, e.g., modeled bias, etc., at the model node N6m and a coefficient "C2" multiplied by a peak magnitude of a voltage. Examples of the coefficient "C1" include a negative real number and of the coefficient "C2" include a positive real number.

In various embodiments, the coefficient "C1" is a positive real number. In various embodiments, the coefficient "C2" is a negative real number. The coefficients "C1" and "C2", the wafer bias, and the peak magnitude are stored in the storage HU 162 (FIG. 21). Examples of the peak magnitude include a peak-to-peak magnitude and a zero-to-peak magnitude.

In some embodiments, the peak magnitude used to determine the ion energy is extracted by the processor 168 of the host system 130 from the complex voltage and current at the model node N6m (FIG. 1). In various embodiments, the peak magnitude used to determine the ion energy is extracted by the processor 168 of the host system 130 from the complex voltage and current at the model node N2m, or the model node N1m, or the model node N4m (FIG. 1).

In various embodiments, the peak magnitude used to calculate the ion energy is measured by a voltage and current probe that is coupled to the node N1, or the node N2 (FIG. 1), or the node N6 (FIG. 1) at one end and to the processor 168 at another end. The voltage and current probe coupled to the node N1, or the node N2, or the node N6 is capable of distinguishing between frequencies of the x and y MHz RF generator.

In some embodiments, both the peak magnitude and wafer bias used to determine the ion energy is at a model node. For example, the peak magnitude used to determine the ion energy is extracted from complex voltage and current at the model node N6m, and the wafer bias used to determine the ion energy is calculated at the model node N6m. As another example, the peak magnitude used to determine the ion energy is extracted from complex voltage and current at the model node N2m, and the wafer bias used to determine the ion energy is calculated at the model node N2m.

In a variety of embodiments, the peak magnitude used to determine the ion energy is extracted from a complex voltage and current at a first model node and wafer bias used to determine the ion energy is determined at a second model node, other than the first model node. For example, the peak magnitude used to determine the ion energy is extracted from complex voltage and current at the model node N6m, and the wafer bias used to determine the ion energy is calculated at the model node N2m. As another example, the peak magnitude used to determine the ion energy is extracted from complex voltage and current at the model node N2m, and the wafer bias used to determine the ion energy is calculated at the model node N6m.

In several embodiments, the peak magnitude used to calculate the ion energy is a voltage at one or more outputs, e.g., the node N3, the node N5, etc. (FIG. 1) of one or more of the x and y MHz RF generators (FIG. 1). In embodiments in which multiple RF generators are used, e.g., both the x and y MHz RF generators are used, a peak voltage is measured by a voltage and current probe coupled to the node N3 at one end and to the processor 168 at another end and a peak voltage is measured by a voltage and current probe coupled to the node N5 at one end and to the processor 168 at another end, and the processor 168 calculates an algebraic combination, e.g., a sum, a mean, etc., of the peak voltages measured at the outputs to calculate the peak magnitude that is used to calculate the ion energy. An example of a voltage and current probe that is coupled to any of the nodes N3 and N5 includes a NIST probe.

In some embodiments, instead of the peak magnitude, a root mean square magnitude is used.

In some embodiments, ion energy is determined by the processor 168 of the host system 130 as a function of the wafer bias and an RF voltage magnitude, e.g., Vx, Vy, Vz, etc., used to calculate the wafer bias. For example, the processor of the host system 130 determines the ion energy as:

$$Ei = (-\tfrac{1}{2})Vdc + (\tfrac{1}{2})V\text{peak}$$

where Ei is the ion energy, Vdc is the wafer bias potential and Vpeak is a zero-to-peak voltage that is used to calculate the wafer bias potential. It should be noted that $-\tfrac{1}{2}$ and $\tfrac{1}{2}$ used in the equation are examples. For example, instead of $-\tfrac{1}{2}$, another negative number, e.g., $-\tfrac{1}{3}$, $-1/2.5$, etc., is used. As another example, instead of $\tfrac{1}{2}$, another positive number, e.g., $\tfrac{1}{3}$, $\tfrac{1}{4}$, etc., is used. The Vpeak is a peak voltage, e.g., the voltage Vx, Vy, or Vz. In various embodiments, any other equation is used to determine the ion energy.

In some embodiments, when multiple RF generators are on, the Vpeak used to calculate the ion energy is that of the RF generator having the lowest frequency among all RF generators. For example, Vpeak is equal to Vx. In various embodiments, when multiple RF generators are on, the Vpeak used to calculate the ion energy is that of the RF generator having the highest frequency. For example, Vpeak is equal to Vz. In various embodiments, when multiple RF generators are on, the Vpeak used to calculate the ion energy is that of the RF generator having a frequency between the lowest frequency and the highest frequency. For example, Vpeak is equal to Vy. In several embodiments, Vpeak is a peak voltage of a statistical value, e.g., median, mean, etc., of peak RF voltages of the RF generators that are on. The ion energy calculated in this manner removes a need to use an expensive VI probe equipment to measure the Vpeak and also removes a need to use a bias compensation circuit to measure the wafer bias. An example of the bias compensation circuit includes a silicon carbide pin. The ion energy determined using various embodiments of the present disclosure results in a low measured time between failures (MTBF).

It should be noted that in some embodiments, a value of the ion energy is stored in the storage HU 162.

Figure 22:
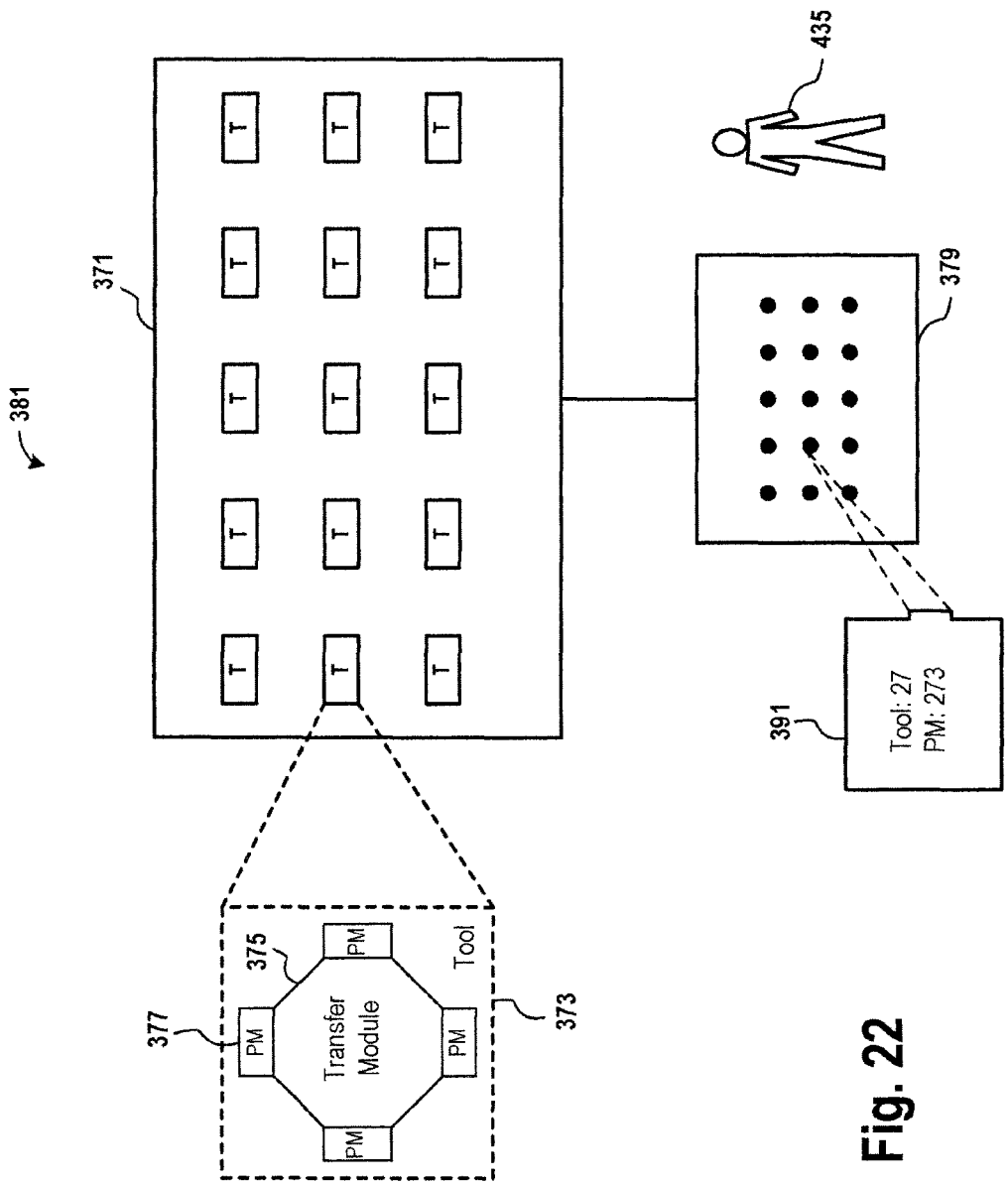
FIG. 22 is a block diagram of a system for determining a malfunctioning device within a plasma system, in accordance with an embodiment described in the present disclosure.

FIG. 22 is a block diagram of a system 381 for determining a malfunctioning device within a plasma system. A facility 371 of the system 381 includes a number of plasma processing tools (T). Examples of the facility 371 include a building, a structure, a room, etc. As an example, people can walk between the tools in the facility 371 to perform various functions, e.g., checking operation, cleaning, moving, relocating, discarding, installing, etc., on the tools. One of the plasma processing tools is illustrated as a tool 373.

The tool 373 includes a transfer module 375 and one or more plasma modules 377. The transfer module 375 includes a mechanism, e.g., a robotic arm, a support that is controlled via a vertical drive and a rotational drive, etc., for transferring one or more work pieces, e.g., the work piece 262 (FIG. 11), from one plasma module to another plasma module.

A plasma module is used to perform one or more processes on a work piece that is received from the transfer module 375. For example, a plasma module is used to clean a substrate, etch a portion of the substrate, deposit materials on the substrate, etc. In some embodiments, a plasma module is a plasma system except for a host system of the plasma system. For example, a plasma module is the plasma system 126 (FIG. 1) excluding the host system 130.

The tool 373 is connected to a computing device 379, e.g., a host system. For example, the tool 373 is connected to the computing device 379 via an analog-to-digital converter and a network cable. When the plasma module 377 lacks operation within the constraints, the computing device 379 indicates to a person 435 that the plasma module 377 is not operating properly. For example, the computing device 379 displays a message to the person 435 regarding the improper operation of the plasma module 377. As another example, the computing device 379 provides an audio sound to the person 435 in addition to indicating the lack of proper operation of the plasma module 377.

Upon receiving an indication that the plasma module 377 lacks operation within the constraints, the person 435 enters the facility 371 and decouples a power delivery portion of the plasma module 377 from a processing portion of the plasma module 377. The power delivery portion generates RF power, which is provided to the processing portion to generate plasma. The plasma is used to process a work piece. The power delivery and the processing portions are further described below. The person 435 then couples a known load to the power delivery portion to facilitate execution of a method for determining a location of a malfunctioning device within the plasma module 377.

Figure 23:
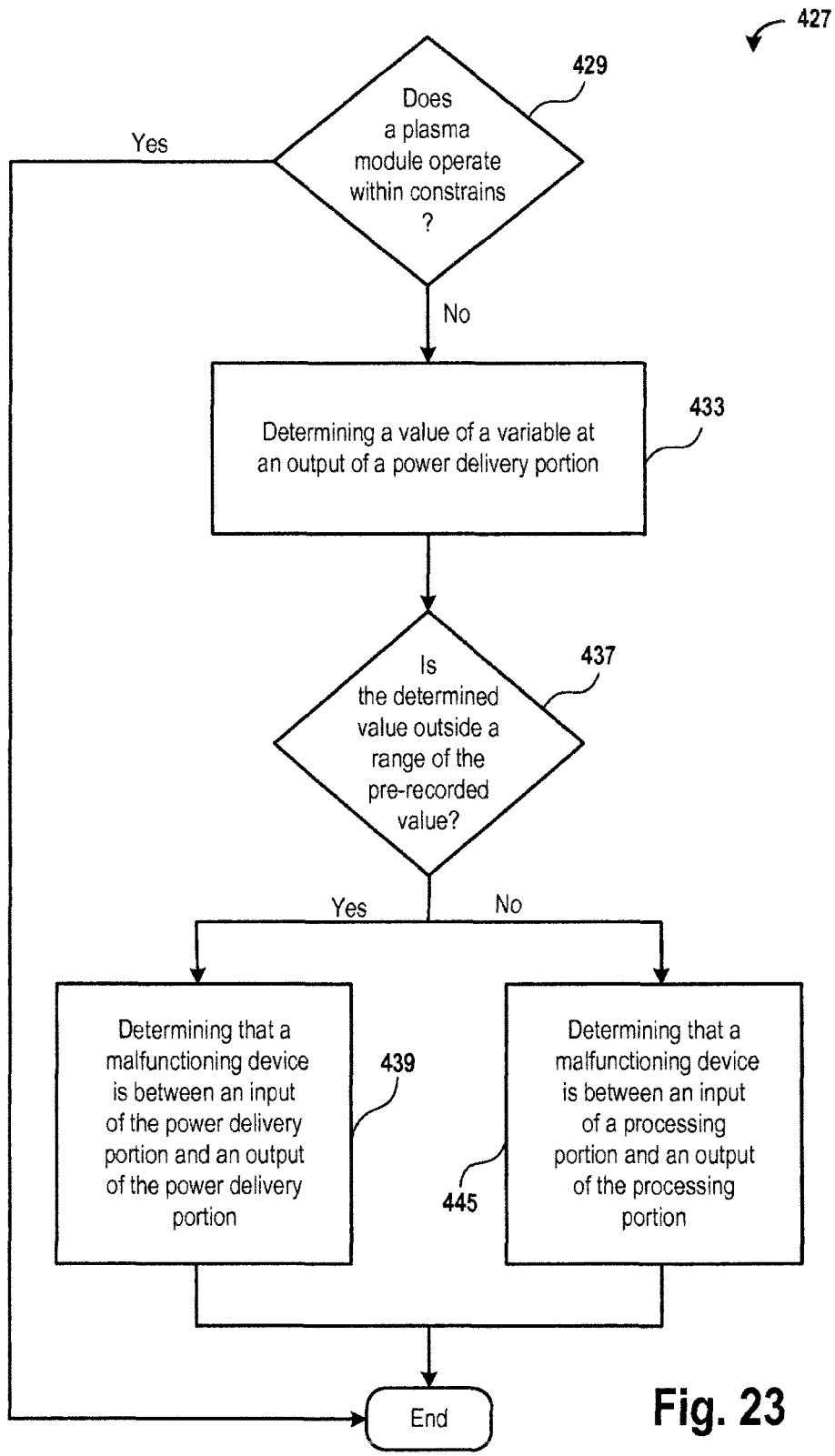
FIG. 23 is a flowchart of a method for determining a malfunctioning device within the system of FIG. 22, in accordance with an embodiment described in the present disclosure.

FIG. 23 is a flowchart of an embodiment of a method 427 for determining a malfunctioning device within the system 381. The method 427 is executed by one or more processors of the system 369 (FIG. 22), e.g., the processor of the computing device 379.

In an operation 429, it is determined whether the plasma module 377 (FIG. 22) operates within the constraints. Upon determining that the plasma module 377 operates within the constraints, the method 427 ends. On the other hand, in response to determining that the plasma module 377 lacks operation within the constraints, in an operation 433, a value of the variable at an output of the power delivery portion is determined. For example, an impedance value at the output of the power delivery portion is determined when the output is coupled with the known load. As another example, a bias voltage or an ion energy at the output of the power delivery portion is determined after coupling the output with the known load. As yet another example, a complex voltage and current is determined at the output when the output is coupled with the known load. A manner of determining the value at the output of the power delivery portion is described further below.

In an operation 437, it is determined whether the value determined during the operation 433 is outside a range of a pre-recorded value. An example of the pre-recorded value includes a value generated using a probe that complies with the pre-set formula. In some embodiments, the pre-recorded value is the second complex voltage and current determined in the operation 116 (FIG. 2), or the third complex voltage and current determined in the operation 119 (FIG. 2), or the wafer bias determined in the operation 342 (FIG. 13), or the ion energy determined as illustrated above.

Upon determining that the determined value is outside the range of the pre-recorded value, in an operation 439, it is determined that a malfunctioning device is between an input of the power delivery portion and an output of the power delivery portion. An input of a portion is described below. On the other hand, upon determining that the determined value is not outside the range of the pre-recorded value, in an operation 445, it is determined that a malfunctioning device is located between an input of the processing portion and an output of the processing portion. For example, upon determining that the determined value is within the range of the pre-recorded value, it is determined that a malfunctioning device is located between the input of the processing portion and the output of the processing portion. The method 427 ends after the operations 439 and 445.

Figure 24:
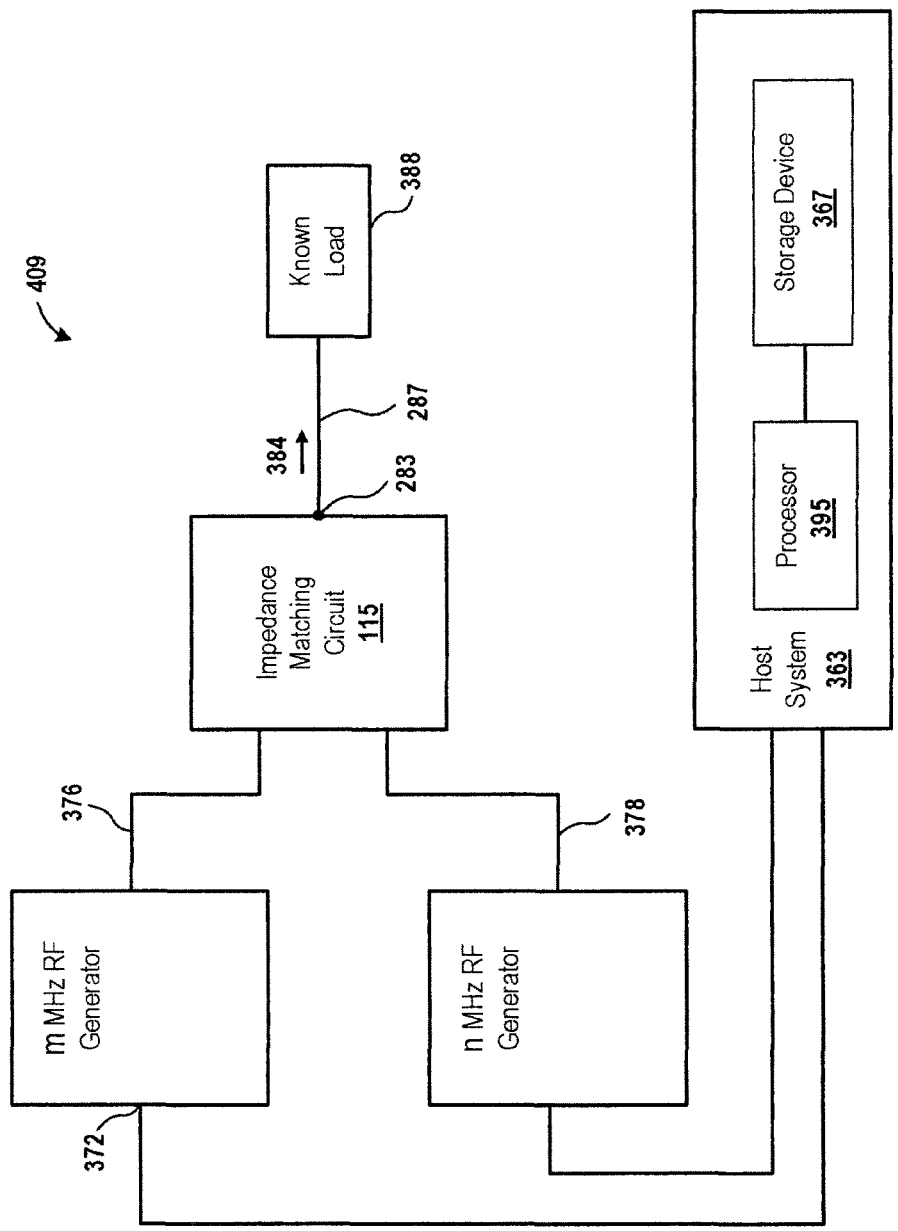
FIG. 24 is a diagram of a plasma system in which values of a variable are used to determine whether there is a malfunction within the plasma system, in accordance with an embodiment described in the present disclosure.

FIG. 24 is a diagram of an embodiment of a system 409 in which values of a variable are used to determine whether there is a malfunction within the system 409. The system 409 is similar to the system 128 of FIG. 11 except that the system 128 is coupled to a known load 388. Also, it should be noted that a host system 363 is not shown in the system 128 of FIG. 11. In the system 409, the m MHz RF generator is coupled to the impedance matching circuit 115 via an RF cable 376 and the n MHz RF generator is coupled to the impedance matching circuit 115 via an RF cable 378. Also, the host system 363 is coupled to an input 372 of the m MHz RF generator. The impedance matching circuit 115 is coupled to a known load 388 via the RF transmission line 287. The RF transmission line 287 is coupled to the output 283 of the impedance matching circuit 115 to allow an RF signal 384 to be sent to the known load 388. The RF signal 284 is generated from one or more RF signals generated by the m and n MHz RF generators that are on and by matching an impedance of a load coupled to the impedance matching circuit 115 with that of a source coupled to the impedance matching circuit 115.

The host system 363 includes a processor 395 and a storage HU 399.

In some embodiments, the known load 388 is coupled to the output 283 without being coupled to the RF transmission line 287. In various embodiments, the known load 388 is coupled to a portion of the RF transmission line 287. For example, the known load 388 is coupled to the RF rod 142 (FIG. 4). As another example, the known load 388 is coupled to the RF strap 144 (FIG. 4).

Figure 25:
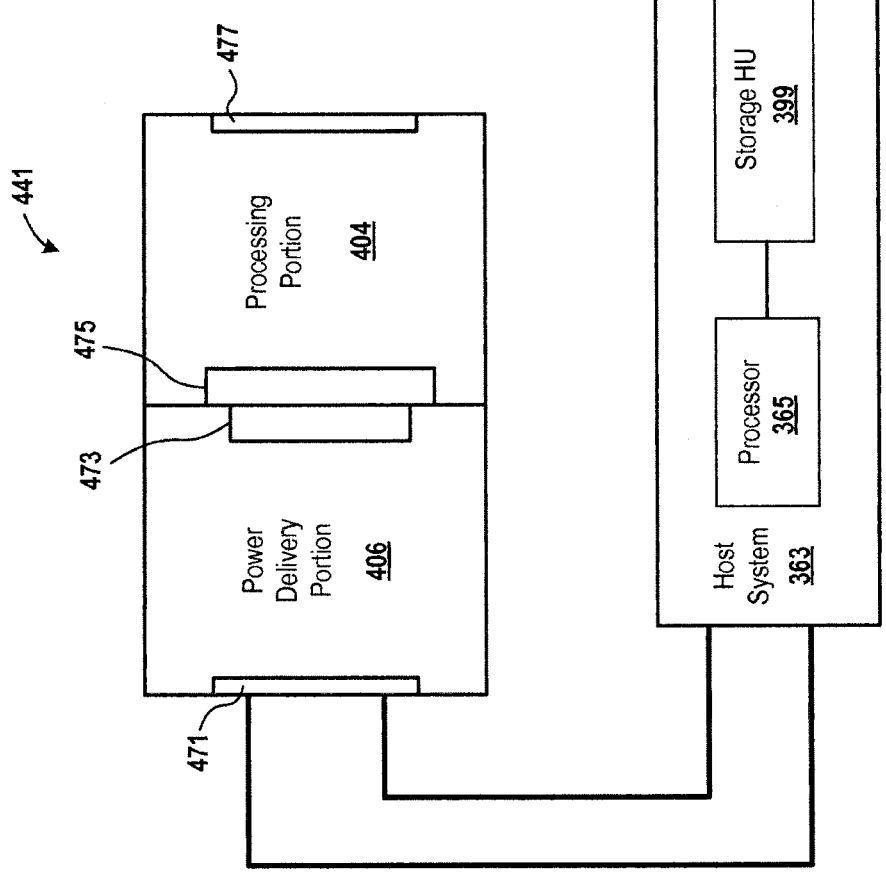
FIG. 25 is a block diagram of a plasma system for determining a malfunctioning device within the plasma system, in accordance with an embodiment described in the present disclosure.

FIG. 25 is a block diagram of an embodiment of a plasma system 441 for determining a malfunctioning device within the plasma system 441. The plasma system 441 includes a processing portion 404 and a power delivery portion 406. It should be noted that the processing portion 404 is a portion of the plasma system 441 except for the host system 363 and the power delivery portion 406 is any remaining portion of the plasma system 441 except for the host system 363. The power delivery portion 406 and the processing portion 404 are portions of a plasma module.

Examples of the power delivery portion 406 include the m MHz RF generator, the n MHz RF generator, the cable 376 (FIG. 24), the cable 378, the impedance matching circuit 115, the RF transmission line 287, the filter 202, and/or the filter 208 (FIG. 7). For example, the power delivery portion 406 includes a combination of the m MHz RF generator and the cable 376. As another example, the power delivery portion 406 includes a combination of the m MHz RF generator, the cable 376, and the impedance matching circuit 115 that is coupled to the cable 376. As yet another example, the power delivery portion 406 includes a combination of the m MHz RF generator, the cable 376 that is coupled to the m MHz RF generator, the impedance matching circuit 115, and the RF transmission line 287 that couples the impedance matching circuit 115 to the plasma chamber 134 (FIG. 11). As yet another example, the power delivery portion 406 includes a combination of the m MHz RF generator, the cable 376 that is coupled to the m MHz RF generator, the impedance matching circuit 115, and a portion of the RF transmission line 287 that couples the impedance matching circuit 115 to the plasma chamber 134 (FIG. 11).

As yet another example, the power delivery portion 406 includes a combination of the m MHz RF generator and the filter 202 and/or the filter 208 (FIG. 7). As another example, the power delivery portion 406 includes a combination of the m MHz RF generator, the filter 202 and/or the filter 208 (FIG. 7), and the cable 376. As another example, the power delivery portion 406 includes a combination of the m MHz RF generator, the filter 202 and/or the filter 208, the cable 376, and the impedance matching circuit 115. As another example, the power delivery portion 406 includes a combination of the m MHz RF generator, the filter 202 and/or the filter 208, the cable 376, the impedance matching circuit 115, and the RF transmission line 287. As another example, the power delivery portion 406 includes a combination of the m MHz RF generator, the filter 202 and/or the filter 208, the cable 376, the impedance matching circuit 115, and a portion of the RF transmission line 287.

Examples of the processing portion 404 include the plasma chamber 135 (FIG. 7), the filter 202, the filter 208, the RF transmission line 287, the impedance matching circuit 115, the cable 376, and/or the cable 378 (FIG. 24). For example, the processing portion 404 includes the plasma chamber 134 (FIG. 7). As another example, the processing portion 404 includes a combination of the plasma chamber 134 and the RF transmission line 287 that is coupled to the plasma chamber 134. As yet another example, the processing portion 404 includes a combination of the plasma chamber 134, the RF transmission line 287, and the impedance matching circuit 115 coupled to the RF transmission line 287. As another example, the processing portion 404 includes a combination of the plasma chamber 134, the RF transmission line 287, the impedance matching circuit 115, and the cable 376 that is coupled to the impedance matching circuit 115.

As yet another example, the processing portion 404 includes the plasma chamber 134 and the filter 202 and/or the filter 208 (FIG. 22). As another example, the processing portion 404 includes a combination of the plasma chamber 134, the filter 202 and/or the filter 208, and the radio frequency (RF) transmission line 287. As yet another example, the processing portion 404 includes a combination of the plasma chamber 134, the filter 202 and/or the filter 208, the RF transmission line 287, and the impedance matching circuit 115. As another example, the processing portion 404 includes a combination of the plasma chamber 134, the filter 202 and/or the filter 208, the RF transmission line 287, the impedance matching circuit 115, and the cable 376. As another example, the processing portion 404 includes a combination of the plasma chamber 134, the filter 202 and/or the filter 208, and a remaining portion of the RF transmission line 287 not within the plasma delivery portion 406. As yet another example, the processing portion 404 includes a combination of the plasma chamber 134 and a remaining portion of the RF transmission line 287 not within the plasma delivery portion 406.

The power delivery portion 406 includes an input 471 and an output 473. In some embodiments, the input 471 is coupled with the host system 363. For example, signals are communicated between the power delivery portion 406 and the host system 363 via the input 471. In some embodiments, the input 471 includes an analog-to-digital converter and a digital-to-analog converter to facilitate communication of the power delivery portion 406 with the host system 363.

The power delivery portion 406 includes an output 473, which is coupled to an input 475 of the processing portion 404. Examples of the output 473 of the power delivery portion 406 include the output 283 of the impedance matching circuit 115 (FIG. 11), the input 285 of the ESC 192 (FIG. 11), a point on the RF transmission line 287 (FIG. 24), etc. Examples of the input 475 of the processing portion 404 include the output 283 of the impedance matching circuit 115 (FIG. 11), the input 285 of the ESC 192 (FIG. 11), a point on the RF transmission line 287 (FIG. 24), etc. RF signals are transferred between the power delivery portion 406 and the processing portion 404 via the output 473 and the input 475. For example, the processing portion 404 receives RF signals from the power delivery portion 406 via the output 473 and the input 475.

The processing portion 404 includes an output 477. An example of the output 477 includes an output of the ESC 263 (FIG. 11). Another example of the output 477 is the input 285 of the ESC 192 (FIG. 11).

Figure 26A:
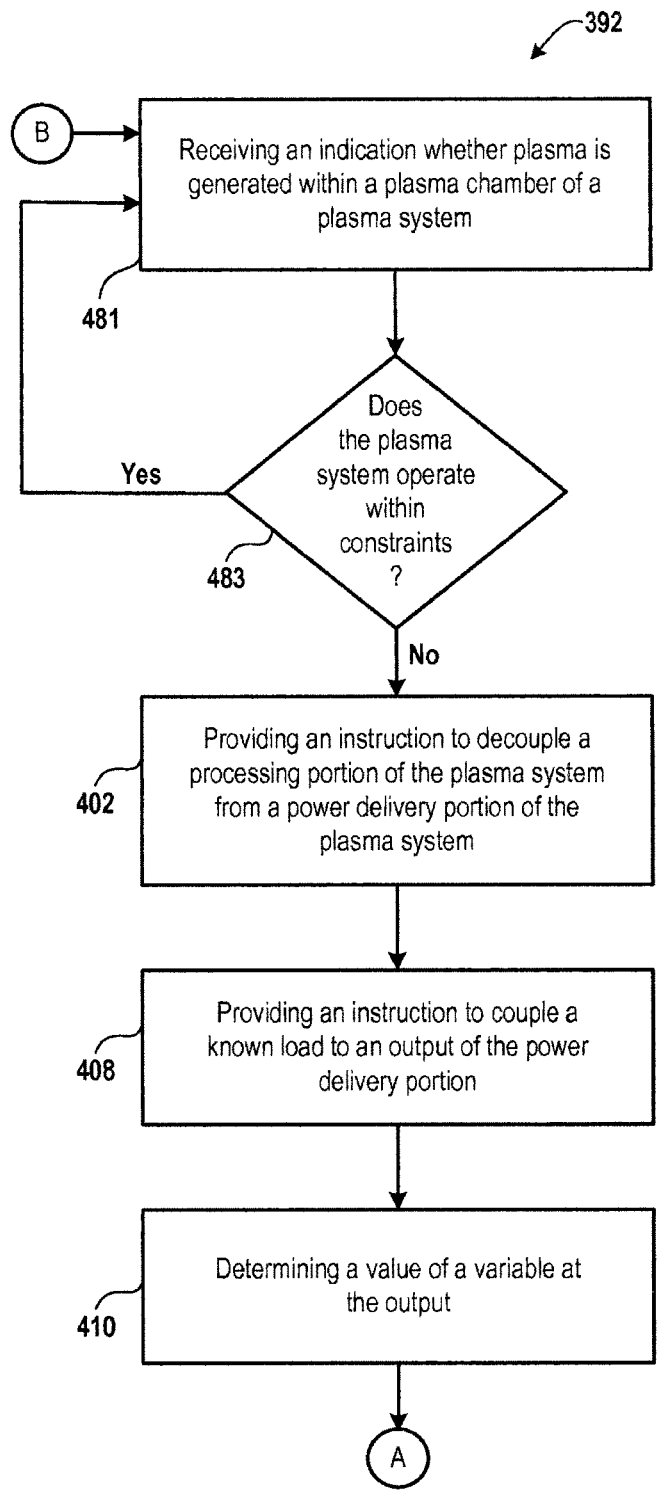
FIG. 26A is a flowchart of a method for determining the malfunctioning device in the plasma system of FIG. 25, in accordance with an embodiment described in the present disclosure.

FIG. 26A is a flowchart of an embodiment of a method 392 for determining a malfunctioning device in the plasma system 441 (FIG. 25). The method 392 is executed by one or more processors, e.g., the processor 365 (FIG. 25), a DSP (not shown) within the power delivery portion 406, etc., of the plasma system 441. Examples of a malfunctioning device include a device within the processing portion 404 and a device within the power delivery portion 406. In the plasma system 441, an RF transmission line, an RF cable, a portion of the RF transmission line, an impedance matching circuit, an RF generator, or a combination thereof, may malfunction.

In an operation 481, an indication of whether plasma is generated, e.g., struck, etc., within a plasma chamber of the plasma system 441 (FIG. 25) is received from a sensor of the plasma system 441. As an example, a sensor of the plasma system 441 senses and provides a value of the variable after the plasma is generated and a value of the variable before the plasma is generated.

In some embodiments, the sensor of the plasma system 441 is a voltage and current probe located within the m MHz RF generator and coupled to a DSP of the m MHz RF generator. In these embodiments, the sensor is coupled to an RF cable that couples an RF generator of the plasma system 441 to the impedance matching circuit of the plasma system 441.

The DSP of the plasma system 441 receives the values, sensed by a sensor, before and after the generation of the plasma and provides the values to the processor 365. The processor 365 determines whether the change exceeds a threshold to determine that the plasma is generated.

It should be noted that in an embodiment, the plasma is generated during processing of a substrate that is placed within the processing portion 404. For example, the plasma is generated to clean the substrate, etch the substrate or layers deposited thereon, deposit layers on the substrate, etc. In some embodiments, the plasma is generated within the plasma chamber of the system 441 when the substrate is absent from the plasma chamber of the processing portion 404.

In some embodiments, it is determined that the plasma is generated upon receiving an acknowledgment signal from a processor, e.g., a DSP, etc., of the plasma system 441 indicating that a power value and/or a frequency value are provided from the host system 362 to a DAS of the plasma system 441 to generate an RF signal.

In various embodiments, it is determined that the plasma is generated upon receiving a signal from the DSP of the plasma system 411 indicating that the plasma is generated.

In some embodiments, it is determined that the plasma is generated within the plasma chamber of the plasma system 411 when an indication is received from the DSP of an RF generator of the plasma system 411 that an RF signal is sent by the RF generator to the plasma chamber.

In an operation 483, it is determined whether the plasma system 441 operates within constraints. Examples of the constraints include a criterion associated with the plasma chamber of the plasma system 441, a criterion associated with an RF transmission line of the plasma system 441, a criterion associated with a portion of the RF transmission line of the plasma system 441, a criterion associated with an RF cable coupling an RF generator of the plasma system 441 to an impedance matching circuit of the plasma system 441, and/or a criterion associated with the RF generator. The criterion is associated with a device of the plasma system 441 when the criterion is compared to a measured value at an input of the device, a node within the device, or an output of the device.

For example, the processor 365 determines a value of the variable at an output of a device of the plasma system 441 from the voltage and/or current values received from the sensor of the plasma system 441 via the DSP of the plasma system 441, and determines whether the value is within a window, e.g., 0 to 20%, etc., of a pre-stored variable value for the output. It is determined based on the value of the variable sensed at the output and the pre-stored value whether the plasma system 441 operates within the constraints, e.g., within pre-set thresholds, etc.

Similarly, as another example, a sensor of the plasma system 441 measures a value of the variable at an input of a device of the plasma system 441, an output of the device, or a node within the device and provides the sensed value to the processor 365. The sensor is coupled to the processor 365. The processor 365 determines based on the value sensed at an input of the device, an output of the device, or a node within the device, whether the plasma system 441 operates within the constraints.

In some embodiments, the processor 365 receives sensed values of the variable from one or more sensors at one or more inputs of the devices of the plasma system 441, one or more outputs of the devices, and/or one or more nodes within the devices within the plasma system 441 and calculates a statistical value, e.g., mean, weighted mean, median, etc., from the sensed values. The one or more sensors are coupled to the processor 365. Based on the calculated statistical value and a pre-stored statistical value, the processor 365 determines whether the plasma system 441 operates within the constraints in a manner similar to that described above with reference to the operation 356 (FIG. 23A).

Upon determining that the plasma system 441 operates within the constraints, the operation 481 is repeated. For example, a processor of the plasma system 441 continues to receive the indication that plasma is generated within the plasma chamber of the plasma system 441.

In some embodiments, instead of repeating the operation 481, the operation 483 is repeated upon determining that the plasma system 441 operates within the constraints. For example, a processor of the plasma system 441 continues to check whether the plasma system 441 operates within the constraints.

On the other hand, upon determining that the plasma system 441 lacks operation within the constraints, in an operation 402, the processor 365 generates and provides an instruction to decouple the processing portion 404 from the power delivery portion 406. The instruction is displayed by a graphical processing unit (GPU) of the host system 363 in the form of a message to the person 435 (FIG. 22) to decouple the processing portion 404 from the output 473 (FIG. 25) of the power delivery portion 406. The GPU is coupled to the processor 365 via a bus. Upon viewing the message, the person 435 decouples the processing portion 404 from the power delivery portion 406. When the processing portion 404 is decoupled from the power delivery portion 406, there is a loss of transfer of an RF signal between the processing portion 404 and the power delivery portion 406.

In an operation 408, an instruction is provided to the GPU of the host system 363 to couple a known load 388 (FIG. 24) to the output 473 of the power delivery portion 406. The instruction is rendered to display a message to the user to indicate to the user to couple the known load 388 (FIG. 24) to the output 473 of the power delivery portion 406. Upon viewing the message, the user couples the known load 388 (FIG. 24) to the output 473 of the power delivery portion 406 via a communication medium, e.g., an RF cable, an RF strap, etc.

In an operation 410, a value of the variable at the output 473 of the power delivery portion 406 that is coupled to the known load 388 (FIG. 24) is determined. For example, a sensor (not shown), e.g., a voltage and current probe, a NIST probe, etc., is coupled to the output of the power delivery portion 406 to measure a value of the variable. The sensor is coupled to the processor 365 to provide sensed value to the processor 365. As another example, the processor 365 determines a value of the variable at the output of the power delivery portion 406 from a value of the variable sensed by a sensor within the RF generator of the plasma system 441 and an impedance of the impedance matching circuit of the plasma system 441. The impedance of the impedance matching circuit of the plasma system 441 is stored within the storage hardware unit 399. The processor 365 determines the value of the variable as a directed sum of value of impedance measured at the output of the RF generator and a value of the impedance of the impedance matching circuit of the plasma system 441. In an embodiment, the processor 365 determines a value of the variable at the output 473 of the power delivery portion 406 from a value of the variable sensed by the sensor within the RF generator of the plasma system 441, a value of impedance of an RF cable that couples the RF generator to the impedance matching circuit, and an impedance of the impedance matching circuit of the plasma system 441. In some embodiments, the processor 365 determines a value of the variable at the output 473 of the power delivery portion 406 from a value of the variable sensed by the sensor of the RF generator of the plasma system 441, a value of impedance of an RF cable that couples the RF generator to the impedance matching circuit of the plasma system 441, an impedance of the impedance matching circuit, and an impedance of at least a portion of the RF transmission line of the plasma system 441. In some embodiments, the processor 365 determines a value of the variable at the output 473 of the power delivery portion 406 from a value of the variable sensed by the sensor of the RF generator of the plasma system 441, a value of impedance of an RF cable that couples the RF generator to the impedance matching circuit of the plasma system 441, an impedance of the impedance matching circuit, and an impedance of the RF transmission line of the plasma system 441.

In some embodiments, the operations 402 and 408 are not performed. Rather, upon receiving an indication of the determination that the plasma system 441 does not operate within the constraints, the person 435 (FIG. 22) decouples the processing portion 404 from the power delivery portion 406 and couples the known load 388 to the output 473 of the power delivery portion 406. The operation 410 is performed after coupling the known load 388 to the output 473.

Figure 26B:
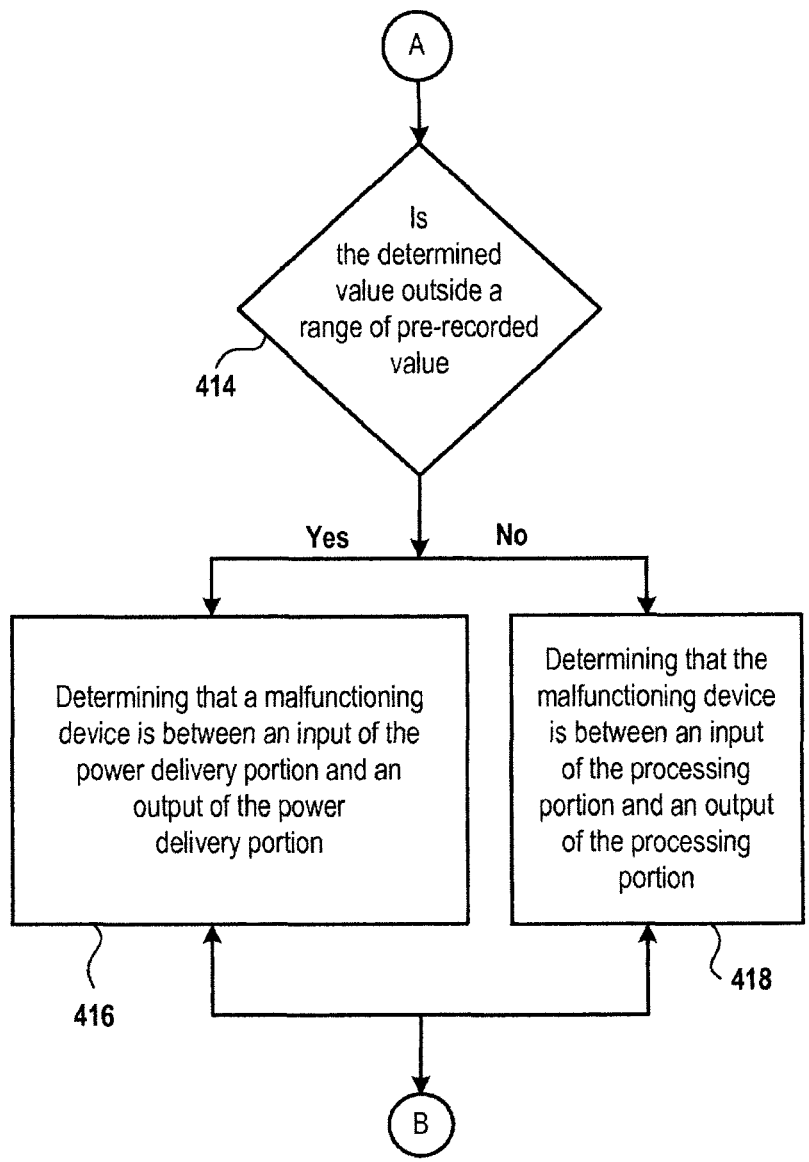
FIG. 26B is a continuation of the flowchart of the method of FIG. 26A, in accordance with an embodiment described in the present disclosure.

FIG. 26B is a continuation of the flowchart of FIG. 26A. In an operation 414, the determined value of the operation 410 is compared with a pre-recorded value, e.g., a value stored in the storage HU 399 (FIG. 25), a value generated using a probe that complies with the pre-set formula, the second complex voltage and current determined in the operation 116 (FIG. 2), or the third complex voltage and current determined in the operation 119 (FIG. 2), the wafer bias determined in the operation 342 (FIG. 13), the ion energy determined as illustrated above, etc., to determine whether the determined value is outside a range of the pre-recorded value. For example, it is determined whether the determined value is outside a range VN±EN. The range VN±EN extends from a difference between the value VN and the error EN to a sum of the value VN and the error EN. The pre-determined range VN±EN is stored in the storage HU 399 (FIG. 25). Examples of the value stored in the storage HU 399 include a value of a complex voltage and current, a value of a wafer bias, a value of an ion energy, or a combination thereof. Examples of the error EN include a standard deviation of the values VN, a variance of the values VN, etc.

Upon determining that the determined value of the operation 410 is outside the range of the pre-recorded value VN, in an operation 416, it is determined that the malfunctioning device is between an input of the power delivery portion 406 and an output of the power delivery portion 406. For example, it is determined that the malfunctioning device is the m MHz RF generator (FIG. 22), the n MHz RF generator, the cable 376, the cable 378, the impedance matching circuit 115, at least a portion of the RF transmission line 287, the filter 202, and/or the filter 208.

On the other hand, upon determining that the determined value of the operation 410 is within the range of the pre-recorded value VN, in an operation 418, it is determined that the malfunctioning device is between an input of the processing portion 404 and an output of the processing portion 404 (FIG. 25). As an example, it is determined that the malfunctioning device is the plasma chamber 134 (FIG. 11), at least a portion of the RF transmission line 287 (FIG. 24), the impedance matching circuit 115, the filter 202, the filter 208, the RF cable 376, and/or RF the cable 378. After the operations 416 and 418, the operation 481 (FIG. 26A) is repeated.

It should be noted that in an embodiment, an input of the power delivery portion 406 of the plasma system 441 (FIG. 25) is an input of one or more RF generators of the power delivery portion 406. For example, when the power delivery portion 406 includes the m MHz RF generator (FIG. 24), the cable 376 and the impedance matching circuit 115, an input of the power delivery portion 406 is an input of the m MHz RF generator. As another example, when the power delivery portion 406 includes the m MHz RF generator (FIG. 24), the cable 376, then MHz RF generator, the cable 378 and the impedance matching circuit 115, an input of the power delivery portion 406 is an input of the m MHz RF generator, and/or an input of the n MHz RF generator.

Moreover, in some embodiments, an output of the power delivery portion 406 is based on devices, within the power delivery portion 406, that are located along a path of an RF signal. An example of a path of an RF signal is from an RF generator via a cable, an impedance matching circuit, an RF transmission line, to a plasma chamber. In this example, the cable couples the RF generator to the impedance matching circuit and the RF transmission line couples the impedance matching circuit to the plasma chamber. For example, when the power delivery portion 406 includes the m MHz RF generator and the cable 376, an output of the power delivery portion 406 is an output of the cable 406. As another example, when the power delivery portion 406 includes the m MHz RF generator, the cable 376, the n MHz RF generator, and the cable 378, an output of the power delivery portion 406 is an output of the cable 376 and/or an output of the cable 378. As yet another example, when the power delivery portion 406 includes the m MHz RF generator and/or the n MHz RF generator, the cable 376 and/or the cable 378, the impedance matching circuit 115, and the RF transmission line 287 (FIG. 24), an output of the power delivery portion 406 is an output of the RF transmission line 287. As another example, when the power delivery portion 406 includes the m MHz RF generator and/or the n MHz RF generator, the cable 376 and/or the cable 378, the impedance matching circuit 115, the filter 202 and/or the filter 208, and the RF transmission line 287 (FIG. 24), an output of the power delivery portion 406 is an output of the RF transmission line 287.

Also, in various embodiments, an input of the processing portion 404 is based on devices, within the processing portion 404, that are located along a path of an RF signal.

For example, when the processing portion 404 includes the plasma chamber 134 (FIG. 11), an input of the processing portion 404 is the input 285 (FIG. 11). As another example, when the processing portion 404 includes the plasma chamber 134 and the RF transmission line 287, an input of the processing portion 404 is an input of the RF transmission line 287. As yet another example, when the processing portion 404 includes the plasma chamber 134, the RF transmission line 287, and the filter 202 and/or 208, an input of the processing portion 404 is an input of the RF transmission line 287. As another example, when the processing portion 404 includes the plasma chamber 134, the RF transmission line 287, and the impedance matching circuit 115 (FIG. 22), an input of the processing portion 404 includes an input of the impedance matching circuit 115. As yet another example, when the processing portion 404 includes the plasma chamber 134, the RF transmission line 287, the filter 202 and/or the filter 208 (FIG. 7), and the impedance matching circuit 115 (FIG. 24), an input of the processing portion 404 includes an input of the impedance matching circuit 115. As another example, when the processing portion 404 includes the plasma chamber 134, the RF transmission line 360, the impedance matching circuit 115, and the cable 376 (FIG. 24) and/or the cable 378, an input of the processing portion 404 includes an input of the cable 376 and/or an input of the cable 378. As yet another example, when the processing portion 404 includes the plasma chamber 134, the RF transmission line 287, the impedance matching circuit 115, the filter 202 and/or the filter 208, and the cable 376 (FIG. 24) and/or the cable 378, an input of the processing portion 404 includes an input of the cable 376 and/or an input of the cable 378.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron-cyclotron resonance (ECR) reactor, etc. For example, the x MHz RF generator and the y MHz RF generator are coupled to an inductor within the ICP plasma chamber.

It is also noted that although some of the operations above are described as being performed by the processor of a host system (FIG. 1, FIG. 24), in some embodiments, the operations may be performed by one or more processors of the host system or by multiple processors of multiple host systems or by a DSP of an RF generator or by multiple DSPs of multiple RF generators.

It should be noted that although the above-described embodiments relate to providing an RF signal to a lower electrode of an ESC, and grounding an upper electrode, in several embodiments, the RF signal is provided to the upper electrode while the lower electrode is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations in the flowchart of FIG. 2, FIG. 13, FIG. 15, FIG. 17, FIG. 23, FIG. 26A, and FIG. 26B above were described in a specific order, it should be understood that other housekeeping operations may be performed in between operations, or operations may be adjusted so that they occur at slightly different times, or may be distributed in a system which allows the occurrence of the processing operations at various intervals associated with the processing, or the operations may be performed in a different order than that shown in the Figures, as long as the processing of the overlay operations are performed in the desired way.

Although the above-described embodiments are described using an ESC, in some embodiments, instead of the ESC, another type of chuck, e.g., a magnetic chuck, etc., is used.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:
1. A method for determining a location of a malfunctioning device in a plasma module, comprising:
   determining whether the plasma module operates within a constraint, the plasma module having a power delivery portion and a plasma processing portion, wherein the power delivery portion includes a radio frequency (RF) generator and the plasma processing portion includes a plasma chamber;

determining a value of a variable at an output of the power delivery portion in response to determining that the plasma module does not operate within the constraint, wherein the value of the variable is determined when the power delivery portion is coupled with a known load and is based on a measured value of the variable, wherein when the power delivery portion is coupled with the known load, the power delivery portion is decoupled from the plasma chamber, wherein the measured value is measured by a sensor associated with the RF generator of the power delivery portion;

comparing the value of the variable at the output of the power delivery portion with a pre-recorded value of the variable, wherein the pre-recorded value is generated based on a detected value of the variable at an output of the RF generator; and determining whether the malfunctioning device is between an input of the power delivery portion and the output of the power delivery portion based on said comparing.

2. The method of claim 1, wherein the pre-recorded value of the variable is determined based on a computer-generated model of a portion of the power delivery portion, wherein the portion of the power delivery portion excludes the RF generator.

3. The method of claim 1, wherein the pre-recorded value of the variable is calculated by propagating the detected value through a computer-generated model of a portion of the power delivery portion, wherein the portion of the power delivery portion excludes the RF generator.

4. The method of claim 3, wherein the computer-generated model has the same resistance, or inductance, or capacitance, or a combination of two or more thereof as the portion of the power delivery portion.

5. The method of claim 1, wherein said determining that the malfunctioning device is between the input of the power delivery portion and the output of the power delivery portion occurs when the value of the variable at the output of the power delivery portion is not within a pre-determined range from the pre-recorded value of the variable, wherein the known load has a resistance of 50 ohms.

6. The method of claim 1, wherein the power delivery portion includes:
  a combination of the RF generator and one or more cables, the one or more cables for coupling to the RF generator; or
  a combination of the RF generator, the one or more cables, and an impedance matching circuit, the impedance matching circuit for coupling to the one or more cables; or
  a combination of the RF generator, the one or more cables, the impedance matching circuit, and a portion of an RF transmission line, the RF transmission line for coupling the impedance matching circuit to the plasma chamber.

7. The method of claim 1, wherein the plasma processing portion includes:
  a combination of the plasma chamber and at least a portion of an RF transmission line, the RF transmission line coupled to the plasma chamber; or
  a combination of the plasma chamber, at least a portion of the RF transmission line, and an impedance matching circuit coupled to the RF transmission line.

8. A system for determining a location of a malfunctioning device in a plasma module, comprising:
  the plasma module having a power delivery portion and a plasma processing portion, wherein the power delivery portion includes a radio frequency (RF) generator, wherein the plasma processing portion includes a plasma chamber, wherein the power delivery portion has an input and an output and the plasma processing portion has an input, wherein the output of the power delivery portion is coupled to the input of the plasma processing portion; and
  a host computer coupled to the RF generator, wherein the host computer includes a processor configured to:
    determine whether the plasma module operates within a constraint;
    determine a value of a variable at the output of the power delivery portion in response to determining that the plasma module does not operate within the constraint, wherein the value of the variable is determined when the power delivery portion is coupled with a known load and is based on a measured value of the variable, wherein when the power delivery portion is coupled with the known load, the power delivery portion is decoupled from the plasma chamber, wherein the measured value is measured by a sensor associated with the RF generator;
    compare the value of the variable at the output of the power delivery portion with a pre-recorded value of the variable, wherein the pre-recorded value is generated based on a detected value of the variable at an output of the RF generator; and
    determine whether the malfunctioning device is between the input of the power delivery portion and the output of the power delivery portion based the comparison.

9. The system of claim 8, wherein the pre-recorded value of the variable is determined based on a computer-generated model of a portion of the power delivery portion, wherein the portion of the power delivery portion excludes the RF generator.

10. The system of claim 8, wherein the pre-recorded value of the variable is calculated by propagating the detected value through a computer-generated model of a portion of the power delivery portion, wherein the portion of the power delivery portion excludes the RF generator.

11. The system of claim 10, wherein the computer-generated model has the same resistance, or inductance, or capacitance, or a combination of two or more thereof as the portion of the power delivery portion.

12. The system of claim 8, wherein the processor is configured to determine that the malfunctioning device is between the input of the power delivery portion and the output of the power delivery portion occurs when the value of the variable at the output of the power delivery portion is not within a pre-determined range from the pre-recorded value of the variable, wherein the known load has a resistance of 50 ohms.

13. The system of claim 8, wherein the power delivery portion includes:
  one or more cables, the one or more cables for coupling to the RF generator; or
  the one or more cables and an impedance matching circuit, the impedance matching circuit for coupling to the one or more cables; or
  the one or more cables, the impedance matching circuit, and a portion of an RF transmission line, the RF transmission line for coupling the impedance matching circuit to the plasma chamber.

14. The system of claim 8, wherein the plasma processing portion includes:
- at least a portion of an radio frequency (RF) transmission line, the RF transmission line coupled to the plasma chamber; or
- at least a portion of the RF transmission line and an impedance matching circuit coupled to the RF transmission line.

15. A non-transitory computer readable medium storing a program for determining a location of a malfunctioning device in a plasma module, wherein the program causes a computer to execute a method comprising:
- determining whether the plasma module operates within a constraint, the plasma module having a power delivery portion and a plasma processing portion, wherein the power delivery portion includes a radio frequency (RF) generator and the plasma processing portion includes a plasma chamber;
- determining a value of a variable at an output of the power delivery portion in response to determining that the plasma module does not operate within the constraint, wherein the value of the variable is determined when the power delivery portion is coupled with a known load and is based on a measured value of the variable, wherein when the power delivery portion is coupled with the known load, the power delivery portion is decoupled from the plasma chamber, wherein the measured value is measured by a sensor associated with the RF generator of the power delivery portion;
- comparing the value of the variable at the output of the power delivery portion with a pre-recorded value of the variable, wherein the pre-recorded value is generated based on a detected value of the variable at an output of the RF generator; and
- determining whether the malfunctioning device is between an input of the power delivery portion and the output of the power delivery portion based on said comparing.

16. The non-transitory computer readable medium of claim 15, wherein the pre-recorded value of the variable is determined based on a computer-generated model of a portion of the power delivery portion, wherein the portion of the power delivery portion excludes the RF generator.

17. The non-transitory computer readable medium of claim 15, wherein the pre-recorded value of the variable is calculated by propagating the detected value through a computer-generated model of a portion of the power delivery portion, wherein the portion of the power delivery portion excludes the RF generator.

18. The non-transitory computer readable medium of claim 17, wherein the computer-generated model has the same resistance, or inductance, or capacitance, or a combination of two or more thereof as the portion of the power delivery portion.

19. The non-transitory computer readable medium of claim 15, wherein said determining that the malfunctioning device is between the input of the power delivery portion and the output of the power delivery portion occurs when the value of the variable at the output of the power delivery portion is not within a pre-determined range from the pre-recorded value of the variable, wherein the known load has a resistance of 50 ohms.

20. The non-transitory computer readable medium of claim 15, wherein the power delivery portion includes:
- a combination of the RF generator and one or more cables, the one or more cables for coupling to the RF generator; or
- a combination of the RF generator, the one or more cables, and an impedance matching circuit, the impedance matching circuit for coupling to the one or more cables; or
- a combination of the RF generator, the one or more cables, the impedance matching circuit, and a portion of an RF transmission line, the RF transmission line for coupling the impedance matching circuit to the plasma chamber.

* * * * *